(12) United States Patent
Kim

(10) Patent No.: US 12,548,507 B2
(45) Date of Patent: Feb. 10, 2026

(54) DISPLAY DEVICE

(71) Applicant: Samsung Display Co., Ltd., Yongin-si (KR)

(72) Inventor: Kiwook Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 63 days.

(21) Appl. No.: 18/399,877

(22) Filed: Dec. 29, 2023

(65) Prior Publication Data

US 2024/0395202 A1 Nov. 28, 2024

(30) Foreign Application Priority Data

May 26, 2023 (KR) .......................... 10-2023-0068702

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0408* (2013.01); *G09G 2300/0819* (2013.01); *G09G 2300/0852* (2013.01); *G09G 2300/0861* (2013.01)

(58) Field of Classification Search
CPC ......... G09G 3/3233; G09G 2300/0852; G09G 2300/0408; G09G 2300/0819; G09G 2300/0861; H10K 59/131; H10K 59/121
See application file for complete search history.

(56) References Cited

U.S. PATENT DOCUMENTS

| 10,763,457 | B2* | 9/2020 | Lee ....................... H10K 50/86 |
| 11,011,724 | B2 | 5/2021 | Lim et al. |
| 11,610,534 | B2* | 3/2023 | Sun ....................... G09G 3/3233 |
| 11,626,055 | B2 | 4/2023 | Jeong et al. |
| 11,793,034 | B2* | 10/2023 | Wang ................... H10K 59/122 345/76 |
| 11,935,456 | B2* | 3/2024 | Kim ..................... G09G 3/2014 |
| 12,190,817 | B2* | 1/2025 | Sato ....................... H10H 20/80 |

(Continued)

FOREIGN PATENT DOCUMENTS

| CN | 114846393 A | 8/2022 |
| CN | 115512603 A | 12/2022 |

(Continued)

*Primary Examiner* — Olga V Merkoulova
(74) *Attorney, Agent, or Firm* — CANTOR COLBURN LLP

(57) ABSTRACT

A display device includes a substrate including a display area and a non-display area positioned around the display area, a first sub-pixel including a first pixel circuit, a first-first light emitting element electrically connected to the first pixel circuit and controlled by a first light emitting control signal, and a first-second light emitting element which emits light of a same color as the first-first light emitting element, a second sub-pixel including a second pixel circuit, a second-first light emitting element electrically connected to the second pixel circuit and controlled by the first light emitting control signal, and a second-second light emitting element which emits light of a same color as the second-first light emitting element, and a plurality of light control patterns disposed on the first and second sub-pixels and blocking a part of light emitted from the first and sub-pixels.

28 Claims, 34 Drawing Sheets

(56) References Cited

U.S. PATENT DOCUMENTS

| | | | |
|---|---|---|---|
| 2019/0066583 A1* | 2/2019 | Chang | G09G 3/3233 |
| 2020/0350517 A1* | 11/2020 | Bae | H10K 50/858 |
| 2021/0125561 A1* | 4/2021 | Choi | G09G 3/3233 |
| 2023/0040037 A1* | 2/2023 | Lee | H10K 59/131 |
| 2023/0043760 A1* | 2/2023 | Bae | H10K 50/856 |
| 2023/0142218 A1 | 5/2023 | Peng et al. | |
| 2023/0157052 A1* | 5/2023 | Kim | H10K 59/80522 |
| | | | 257/40 |
| 2023/0209960 A1* | 6/2023 | Kim | H10K 50/865 |
| | | | 257/40 |
| 2024/0221665 A1* | 7/2024 | Sato | G09G 3/20 |
| 2024/0260432 A1 | 8/2024 | Shin et al. | |
| 2024/0395203 A1* | 11/2024 | Sato | G09G 3/20 |

FOREIGN PATENT DOCUMENTS

| | | | | |
|---|---|---|---|---|
| KR | 1020200001694 A | 1/2020 | | |
| KR | 102445868 B1 | 9/2022 | | |
| KR | 1020220130290 A | 9/2022 | | |
| KR | 1020230052777 A | 4/2023 | | |
| KR | 20230142015 A | 10/2023 | | |
| WO | WO-2022249869 A1 * | 12/2022 | | G09G 3/32 |

* cited by examiner

DISPLAY DEVICE

This application claims priority to Korean Patent Application No. 10-2023-0068702, filed on May 26, 2023, and all the benefits accruing therefrom under 35 U.S.C. § 119, the content of which in its entirety is hereby incorporated by reference.

BACKGROUND

1. Technical Field

The invention relates generally to a display device, and more particularly, to a display device capable of controlling a viewing angle.

2. Description of the Related Art

As information technology develops, the importance of display devices, which are communication media between users and information, is being highlighted. Accordingly, the use of display devices such as a liquid crystal display device, an organic light emitting display device, a plasma display device, and the like is increasing.

Meanwhile, a display device may display an image with a wide viewing angle, or the viewing angle of the image displayed on the display device may be controlled for security reasons or to improve image reflection.

SUMMARY

Embodiments provide a display device with improved luminous efficiency.

A display device according to embodiments includes a substrate including a display area including a first display area and a second display area located adjacent to the first display area, and a non-display area positioned around the display area, a first sub-pixel disposed in the first display area on the substrate and including a first pixel circuit, a first-first light emitting element electrically connected to the first pixel circuit and controlled by a first light emitting control signal, and a first-second light emitting element electrically connected to the first pixel circuit, controlled by the first light emitting control signal, and which emits light of a same color as the first-first light emitting element, a second sub-pixel disposed in the second display area on the substrate and including a second pixel circuit, a second-first light emitting element electrically connected to the second pixel circuit and controlled by the first light emitting control signal, and a second-second light emitting element electrically connected to the second pixel circuit, controlled by a second light emitting control signal, and which emits light of a same color as the second-first light emitting element, and a plurality of light control patterns disposed on the first and second sub-pixels and blocking a part of light emitted from the first and second sub-pixels.

In an embodiment, the display device may further include a first light emitting control line disposed in the first and second display areas on the substate and to which the first light emitting control signal is applied and a second light emitting control line disposed on the substate and including a first portion overlapping the first display area and a second portion separated from the first portion, to which the second light emitting control signal is applied and overlapping the second display area.

In an embodiment, the first portion and the second portion of the second light emitting control line may be physically separated around a boundary line where the first display area and the second display area are in contact.

In an embodiment, the display device may further include a conductive layer disposed on the first and second light emitting control lines. The conductive layer may overlap a separation space defined by the first portion and the second portion of the second light emitting control line in a plan view.

In an embodiment, the conductive layer may include a driving voltage line to which a driving voltage is applied, wherein the driving voltage line may overlap the separation space in the plan view.

In an embodiment, one of pixel electrodes of the first-first and first-second light emitting elements may overlap the separation space in the plan view.

In an embodiment, the display device may further include a connection pattern disposed on the first light emitting control line and connecting the first light emitting control line and the first portion of the second light emitting control line through contact holes.

In an embodiment, the first light emitting control line may be disposed in a different layer from the second light emitting control line.

In an embodiment, the first light emitting control line may be disposed on the second light emitting control line.

In an embodiment, the second light emitting control line may be disposed on the first light emitting control line.

In an embodiment, a first-first pixel electrode of the first-first light emitting element may be separated from a first-second electrode of the first-second light emitting element, and a second-first pixel electrode of the second-first light emitting element may be separated from a second-second electrode of the second-second light emitting element.

In an embodiment, the second display area may include a first area and a second area, and the first area may be positioned in a first end of the display area and the second area is positioned in a second end of the display area facing the first end.

In an embodiment, the light control patterns may be not disposed in the first display area and are disposed only in the second display area.

In an embodiment, the light control patterns might not overlap a light emitting layer of the second-first emitting element in a plan view and may overlap a light emitting layer of the second-second light emitting element in the plan view.

In an embodiment, the light control patterns may overlap a light emitting layer of the second-first emitting element and a light emitting layer of the second-second light emitting element in a plan view.

In an embodiment, the light control patterns may be disposed in the first and second display areas.

A display device according to embodiments includes a substrate including a display area including a first display area and a second display area located adjacent to the first display area, and a non-display area positioned around the display area, a first light emitting control line disposed on the substrate and to which a first light emitting control signal is applied, a second light emitting control line disposed in a different layer from the first light emitting line, extends continuously in a first direction, and to which a second light emitting control signal is applied, a first sub-pixel disposed in the first display area on the substrate and including a first pixel circuit, a first-first light emitting element electrically connected to the first pixel circuit and controlled by a first light emitting control signal, and a first-second light emitting element electrically connected to the first pixel circuit, controlled by the first light emitting control signal, and which emits light of a same color as the first-first light emitting element, a second sub-pixel disposed in the second display area on the substrate and including a second pixel circuit, a second-first light emitting element electrically connected to the second pixel circuit and controlled by the first light emitting control signal, and a second-second light emitting element electrically connected to the second pixel circuit, controlled by a second light emitting control signal, and which emits light of a same color as the second-first light emitting element, and a plurality of light control patterns disposed on the first and second sub-pixels and blocking a part of light emitted from the first and second sub-pixels.

In an embodiment, the display device may further include a first active pattern disposed in the first and second display areas on the substrate, a second active pattern disposed in a same layer as the first active pattern, spaced apart from the first active pattern, and overlapping the first display area, a first-first gate pattern disposed in the first display area on the first and second active patterns, and a second-first gate pattern disposed in a same layer as the first-first gate pattern, having substantially a same pattern as the first-first gate pattern, and overlapping the second display area. The first-first gate pattern might not overlap the first and second active patterns in a plan view and the second-first gate pattern may overlap the first active pattern in the plan view.

In an embodiment, the second pixel circuit may include a transistor including a part of the first active pattern and a part of the second-first gate pattern overlapping the part of the first active pattern, and the second light emitting control signal may be applied to the first-first gate pattern and the second light emitting control signal may be applied to the second-first gate pattern of the transistor.

In an embodiment, the display device may further include an anode connection pattern disposed on the first-first and second-first gate patterns and connecting the first and second active patterns through contact holes. A first-first pixel electrode of the first-first light emitting element and a first-second pixel electrode of the first-second light emitting element may be connected through the anode connection pattern.

In an embodiment, the first light emitting control line and the second light emitting control line may be spaced apart from each other in a second direction crossing the first direction in a plan view.

In an embodiment, the first light emitting control line may be not connected to the second light emitting control line.

In an embodiment, the first light emitting control line may be disposed on the second light emitting control line.

In an embodiment, a first-first pixel electrode of the first-first light emitting element may be separated from a first-second electrode of the first-second light emitting element, and a second-first pixel electrode of the second-first light emitting element may be separated from a second-second electrode of the second-second light emitting element.

In an embodiment, the light control patterns may be not disposed in the first display area and may be disposed only in the second display area.

In an embodiment, the light control patterns might not overlap a light emitting layer of the second-first emitting element in a plan view and may overlap a light emitting layer of the second-second light emitting element in the plan view.

In an embodiment, the light control patterns may overlap a light emitting layer of the second-first emitting element and a light emitting layer of the second-second light emitting element in a plan view.

In an embodiment, the light control patterns may be disposed in the first and second display areas.

In a display device according to embodiments, the display device may include a first sub-pixel disposed in a first display area and including a first pixel circuit, a first-first light emitting element electrically connected to the first pixel circuit, and a first-second light emitting element electrically connected to the first pixel circuit and which emits light of the same color as the first-first light emitting element and a second sub-pixel disposed in a second display area and including a second pixel circuit, a second-first light emitting element electrically connected to the second pixel circuit, and a second-second light emitting element electrically connected to the second pixel circuit and which emits light of the same color as the second-first light emitting element. Here, the first-first light emitting element and the first-second light emitting element may be controlled by the same light emitting control signal, and the second-first light emitting element and the second-second light emitting element may be independently controlled by different light emitting control signals. Accordingly, even when an image is displayed at a narrow viewing angle in which the viewing angle in a specific direction is controlled, the luminous efficiency of the display device is not reduced.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
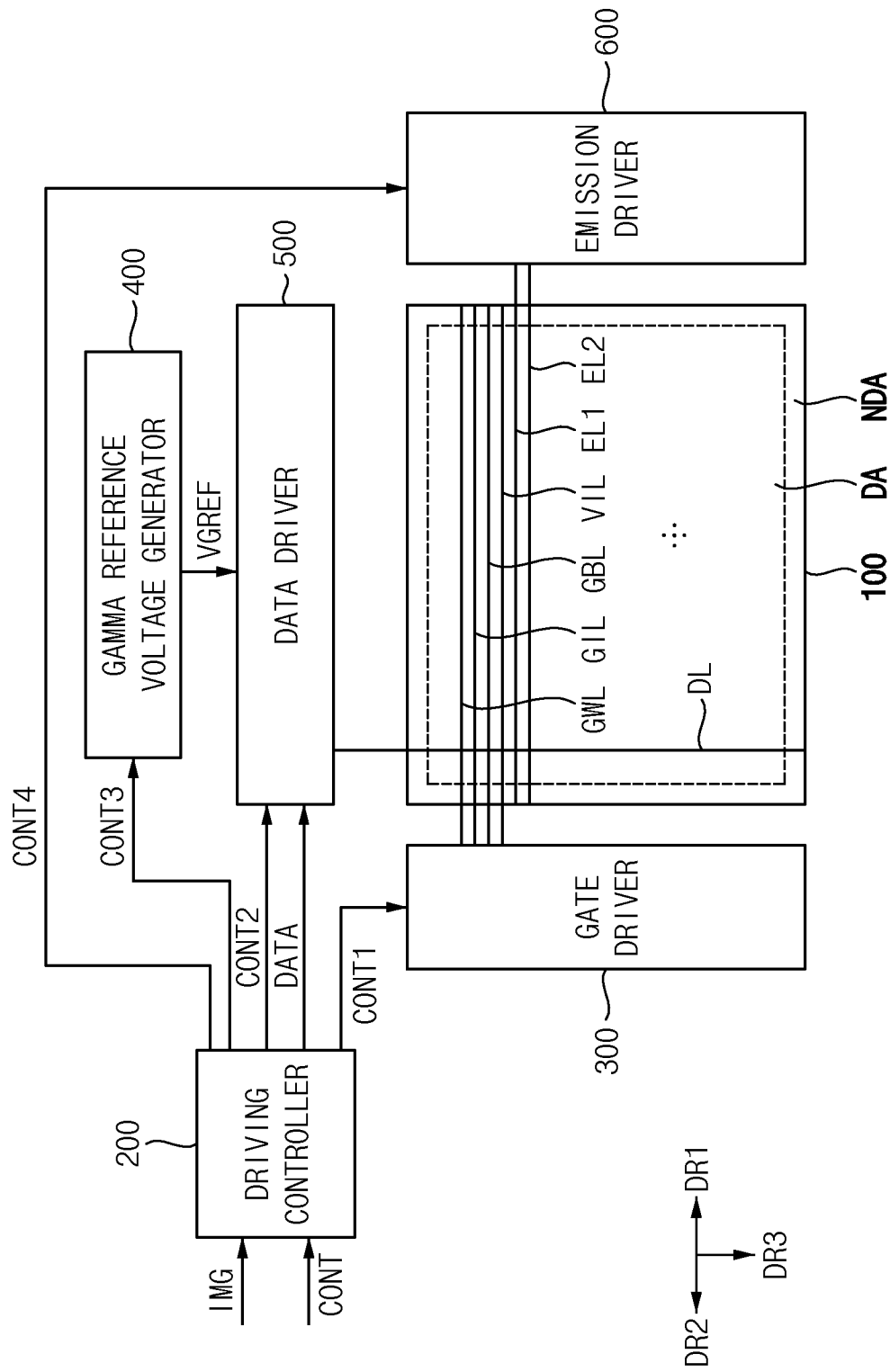
FIG. 1 is a block diagram schematically illustrating a display device, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

While describing each drawing, similar reference numerals are used for similar components. In the attached drawings, the dimensions of the structures are enlarged from the actual size for clarity of the present disclosure. Terms such as first, second, or the like may be used to describe various components, but the components should not be limited by the terms. The terms are used only for the purpose of distinguishing one component from another. For example, a first component may be referred to as a second component, and similarly, the second component may be referred to as the first component without departing from the scope of the present disclosure. Singular expressions include plural expressions unless the context clearly dictates otherwise.

In this application, terms such as "include (or comprise)" or "have" are intended to designate the presence of features, numbers, steps, operations, components, parts, or combinations thereof described in the specification, it should be understood that this does not exclude in advance the presence or addition of elements, numbers, steps, operations, components, parts, or combinations thereof.

In this application, when a part of a layer, membrane, area, region, plate, or the like is said to be "on (or above)" or "on the top" another part, this includes not only cases where it is "directly on" the other part, but also cases where there is another part in between. Conversely, when a part of a layer, membrane, area, region, plate, or the like is said to be "under (or below)" or "at the bottom" another part, this includes not only being "directly under" another part, but also cases where there is another part in between. In addition, in this application, being disposed "on" may include being disposed not only at the top but also at the bottom.

Meanwhile, in the present disclosure, "directly disposed" may mean that there is no additional layer, film, area, region, plate, or the like between a part of the layer, film, area, region, plate, or the like and another part. For example, "directly disposed" may mean disposed without using an additional member, such as an adhesive member, between two layers or two members.

Hereinafter, a display device according to embodiments will be explained in detail with reference to the accompanying drawings. The same reference numerals are used for the same components in the drawings, and redundant descriptions of the same components will be omitted. In the drawings, the thickness, the ratio, and the size of the element are exaggerated for effective description of the technical contents. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the inventive concept. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "comprise", "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof. As used herein, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram schematically illustrating a display device, according to an embodiment.

Referring to FIG. 1, a display device according to an embodiment may include a display panel 100 and a display panel driver. The display panel driver may include a driving controller 200, a gate driver 300, a gamma reference voltage generator 400, a data driver 500, and an emission driver 600.

In an embodiment, the display panel 100 may include a display area DA which displays an image and a non-display area NDA positioned around the display area DA.

In an embodiment, the display panel 100 may include a plurality of gate lines GWL, GIL, and GBL, a plurality of data lines DL, a plurality of first light emitting control lines EL1, and a plurality of second light emitting control lines EL2, and a plurality of sub-pixels. The sub-pixels may be electrically connected to each of the plurality of gate lines GWL, GIL, and GBL, the plurality of data lines DL, the plurality of first light emitting control lines EL1, and the plurality of second light emitting control lines EL2. For example, each of the plurality of gate lines GWL, GIL, and GBL, the plurality of first light emitting control lines EL1, and the plurality of second light emitting control lines EL2 may extend in a first direction DR1 or in a second direction DR2 opposite to the first direction DR1. Each of the plurality of data lines DL may extend in a third direction DR3 crossing each of the first direction DR1 and the second direction DR2.

In an embodiment, the display panel 100 may further include initialization lines VIL that transfer an initialization voltage to the sub-pixels. For example, each of the initialization lines VIL may extend in the first direction DR1 and/or the second direction DR2.

In an embodiment, the driving controller 200 may receive input image data IMG and input control signal CONT from an external device (not shown). For example, the input image data IMG may include red image data, green image data, and blue image data. The input image data IMG may include white image data. The input image data IMG may include magenta image data, yellow image data, and cyan image data. The input control signal CONT may include a master clock signal and a data enable signal. The input control signal CONT may further include a vertical synchronization signal and a horizontal synchronization signal.

In an embodiment, the driving controller 200 may generate a first control signal CONT1, a second control signal CONT2, a third control signal CONT3, a fourth control signal CONT4, and a data signal DATA based on the input image data IMG and the input control signal CONT.

In an embodiment, the driving controller 200 may generate the first control signal CONT1 for controlling the operation of the gate driver 300 based on the input control signal CONT. The driving controller 200 may output the first control signal CONT1 to the gate driver 300. The first control signal CONT1 may include a vertical start signal and a gate clock signal.

In an embodiment, the driving controller 200 may generate the second control signal CONT2 for controlling the operation of the data driver 500 based on the input control signal CONT. The driving controller 200 may output the second control signal CONT2 to the data driver 500. The second control signal CONT2 may include a horizontal start signal and a load signal.

In an embodiment, the driving controller 200 may generate the data signal DATA based on the input image data IMG. The driving controller 200 may output the data signal DATA to the data driver 500.

In an embodiment, the driving controller 200 may generate the third control signal CONT3 for controlling the operation of the gamma reference voltage generator 400 based on the input control signal CONT. The driving controller 200 may output the third control signal CONT3 to the gamma reference voltage generator 400.

In an embodiment, the driving controller 200 may generate the fourth control signal CONT4 for controlling the operation of the emission driver 600 based on the input control signal CONT. The driving controller 200 may output the fourth control signal CONT4 to the emission driver 600.

In an embodiment, the gate driver 300 may generate gate signals for driving the plurality of gate lines GWL, GIL, and GBL in response to the first control signal CONT1 received from the driving controller 200. The gate driver 300 may output the gate signals to the plurality of gate lines GWL, GIL, and GBL.

In an embodiment, the gamma reference voltage generator 400 may generate a gamma reference voltage VGREF in response to the third control signal CONT3 received from the driving controller 200. The gamma reference voltage generator 400 may provide the gamma reference voltage VGREF to the data driver 500. The gamma reference voltage VGREF may have a value corresponding to each data signal DATA.

For example, in an embodiment, the gamma reference voltage generator 400 may be disposed in driving controller 200 or in the data driver 500.

In an embodiment, the data driver 500 may receive the second control signal CONT2 and the data signal DATA from the drive controller 200 and the gamma reference voltage VGREF from the gamma reference voltage generator 400. The data driver 500 may convert the data signal DATA into an analog data voltage using the gamma reference voltage VGREF. The data driver 500 may output the data voltage to the plurality of data lines DL.

In an embodiment, the emission driver 600 may generate light emitting control signals for driving the first and second light emitting control lines EL1 and EL2, respectively, in response to the fourth control signal CONT4 received from the driving controller 200. The emission driver 600 may output the light emitting control signals to the first and second light emitting control lines EL1 and EL2, respectively.

Figure 2:
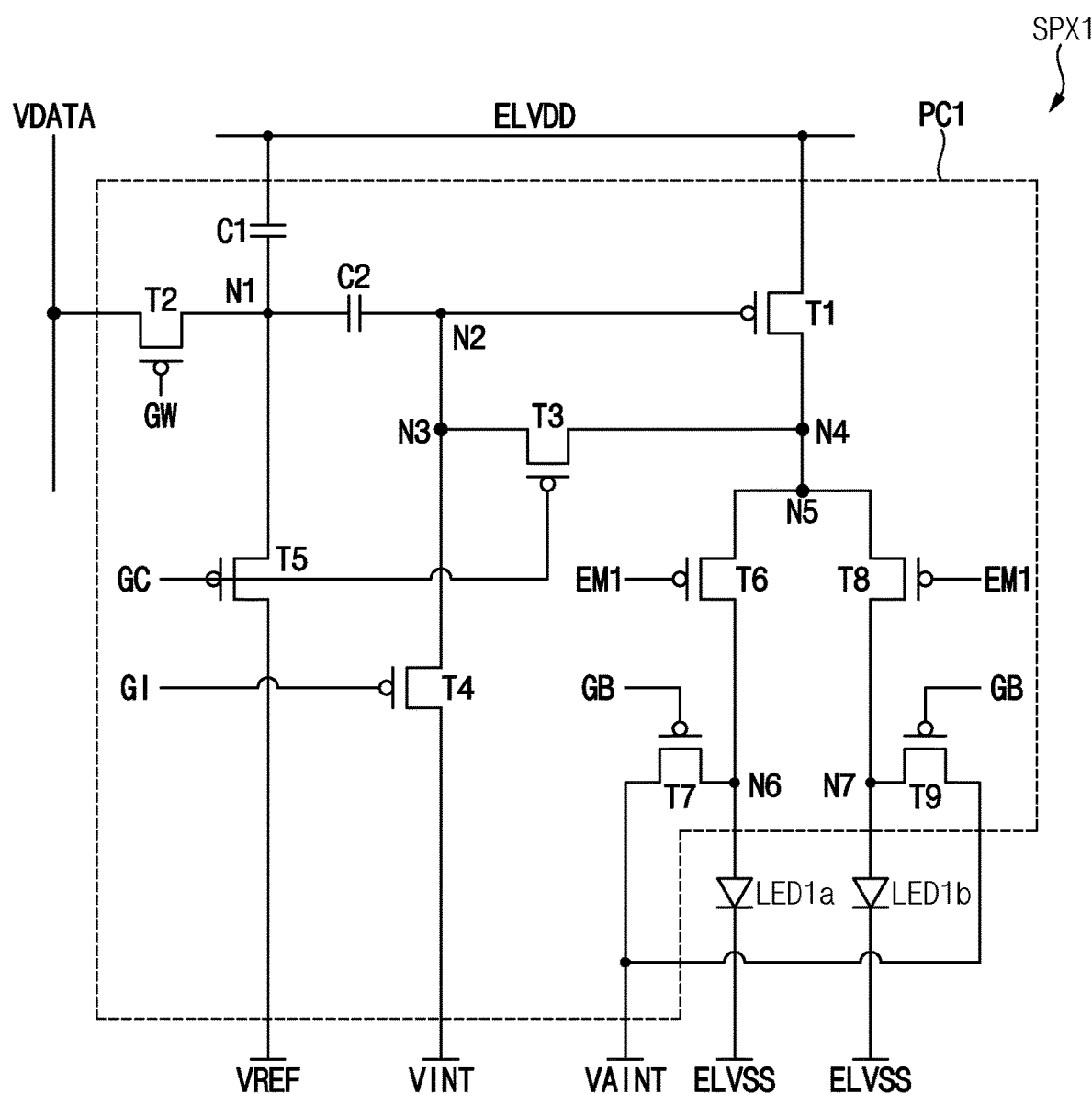
FIG. 2 is a circuit diagram illustrating an example of a first sub-pixel included in the display device of FIG. 1, according to an embodiment.
Figure 3:
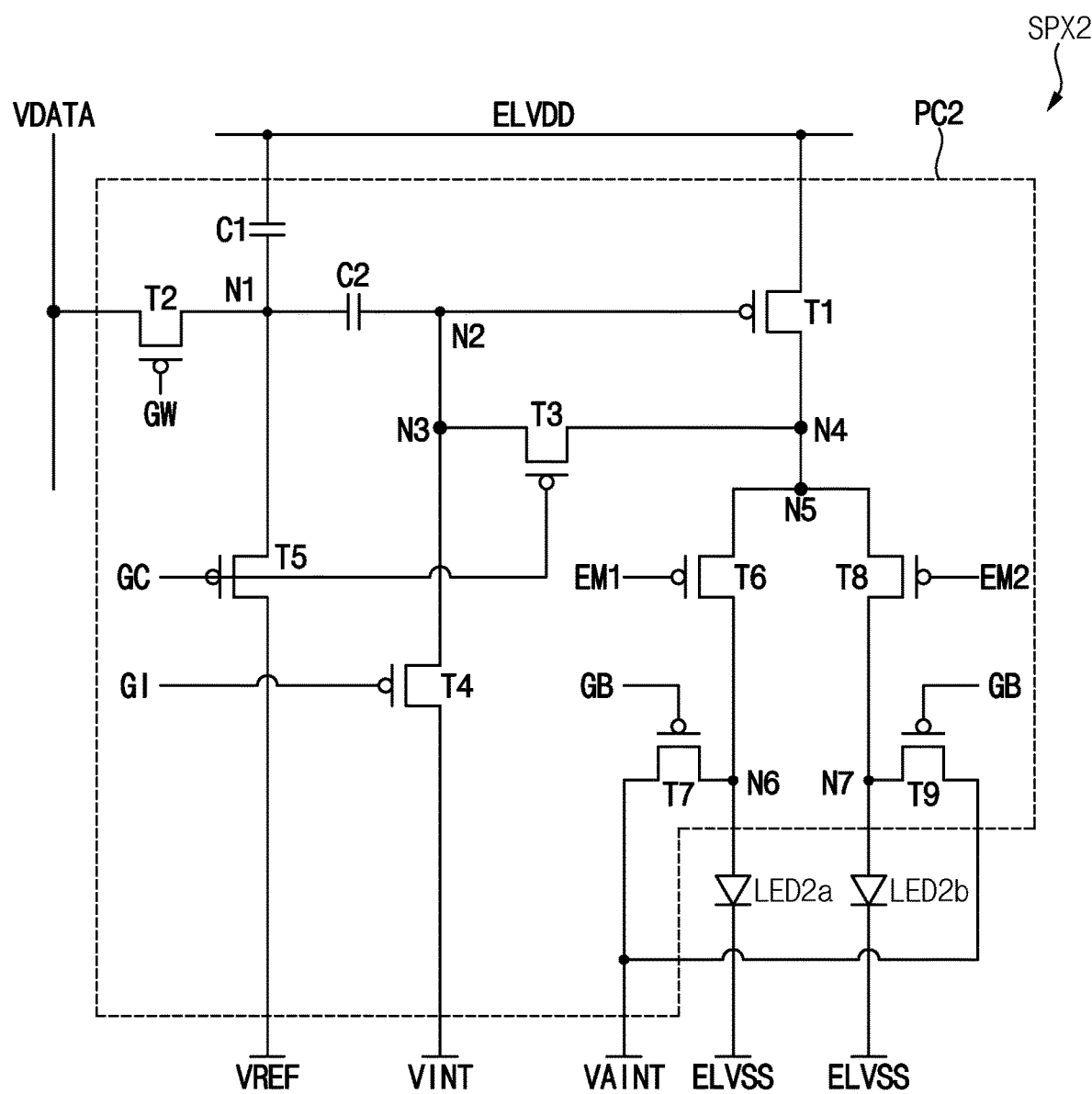
FIG. 3 is a circuit diagram illustrating an example of a second sub-pixel included in the display device of FIG. 1, according to an embodiment.

FIG. 2 is a circuit diagram illustrating an embodiment of a first sub-pixel included in the display device of FIG. 1. FIG. 3 is a circuit diagram illustrating an embodiment of a second sub-pixel included in the display device of FIG. 1.

In an embodiment and referring to FIGS. 1, 2, and 3, a first sub-pixel SPX1 included in the display panel 100 may include a first pixel circuit PC1, a first-first light emitting element LED1a, and a first-second light emitting element LED1b, and a second sub-pixel SPX2 included in the display panel 100 may include a second pixel circuit PC2, a second-first light emitting element LED2a, and a second-second light emitting element LED2b.

In an embodiment, the first pixel circuit PC1 may provide a first driving current to the first-first light emitting element LED1a and the first-second light emitting element LED1b, and the second pixel circuit PC2 may provide a second driving current to the second-first light emitting element LED2a and the second-second light emitting element LED2b. The first-first light emitting element LED1a and the first-second light emitting element LED1b may emit light of the same color based on the first driving current. In addition, the second-first light emitting element LED2a and the second-second light emitting element LED2b may emit light of the same color based on the second driving current.

In an embodiment, each of the first and second pixel circuits PC1 and PC2, respectively, may include first, second, third, fourth, fifth, sixth, seventh, eighth, and ninth transistors T1, T2, T3, T4, T5, T6, T7, T8, and T9, respectively, a first capacitor C1, and a second capacitor C2.

In an embodiment, the first transistor T1 may include a gate electrode, a first electrode, and a second electrode. The gate electrode of the first transistor T1 may be connected to a second node N2. A driving voltage ELVDD may be applied to the first electrode of the first transistor T1. The second electrode of the first transistor T1 may be connected to a fourth node N4.

In an embodiment, the second transistor T2 may include a gate electrode, a first electrode, and a second electrode. A first gate signal GW may be applied to the gate electrode of the second transistor T2. A data voltage VDATA may be applied to the first electrode of the second transistor T2. The second electrode of the second transistor T2 may be connected to a first node N1.

In an embodiment, the third transistor T3 may include a gate electrode, a first electrode, and a second electrode. A second gate signal GC may be applied to the gate electrode of the third transistor T3. The first electrode of the third transistor T3 may be connected to a third node N3. The second electrode of the third transistor T3 may be connected to the fourth node N4.

In an embodiment, the fourth transistor T4 may include a gate electrode, a first electrode, and a second electrode. A third gate signal GI may be applied to the gate electrode of the fourth transistor T4. A first initialization voltage VINT may be applied to the first electrode of the fourth transistor T4. The second electrode of the fourth transistor T4 may be connected to the third node N3.

In an embodiment, the fifth transistor T5 may include a gate electrode, a first electrode, and a second electrode. The second gate signal GC may be applied to the gate electrode of the fifth transistor T5. A reference voltage VREF may be applied to the first electrode of the fifth transistor T5. The second electrode of the fifth transistor T5 may be connected to the first node N1.

In an embodiment, the sixth transistor T6 may include a gate electrode, a first electrode, and a second electrode. The first electrode of the sixth transistor T6 may be connected to a fifth node N5. The second electrode of the sixth transistor T6 may be connected to a sixth node N6. In an embodiment, a first light emitting control signal EM1 may be applied to the gate electrode of the sixth transistor T6 in the first and second pixel circuits PC1 and PC2. That is, the same light emitting control signal may be applied to the gate electrode of the sixth transistor T6 in the first and second pixel circuits PC1 and PC2.

In an embodiment, the seventh transistor T7 may include a gate electrode, a first electrode, and a second electrode. A fourth gate signal GB may be applied to the gate electrode of the seventh transistor T7. The second initialization voltage VAINT may be applied to the first electrode of the seventh transistor T7. The second electrode of the seventh transistor T7 may be connected to the sixth node N6.

In an embodiment, the eighth transistor T8 may include a gate electrode, a first electrode, and a second electrode. The first electrode of the eighth transistor T8 may be connected to the fifth node N5. The second electrode of the eighth transistor T8 may be connected to the seventh node N7. In an embodiment, in the first pixel circuit PC1, the first light emitting control signal EM1 may be applied to the gate electrode of the eighth transistor T8, and in the second pixel circuit PC2, a second light emitting control signal EM2 may be applied to the gate electrode of the eighth transistor T8. That is, the light emitting control signal applied to the gate electrode of the eighth transistor T8 included in the first pixel circuit PC1 and the light emitting control signal applied to the gate electrode of the eighth transistor T8 included in the second pixel circuit PC2 may be different.

In an embodiment, the ninth transistor T9 may include a gate electrode, a first electrode, and a second electrode. The fourth gate signal GB may be applied to the gate electrode of the ninth transistor T9. The second initialization voltage VAINT may be applied to the first electrode of the ninth transistor T9. The second electrode of the ninth transistor T9 may be connected to the seventh node N7.

In an embodiment, the first capacitor C1 may include a first electrode and a second electrode. The driving voltage ELVDD may be applied to the first electrode of the first capacitor C1. The second electrode of the first capacitor C1 may be connected to the first node N1. In an embodiment, the first capacitor C1 may be a storage capacitor.

In an embodiment, the second capacitor C2 may include a first electrode and a second electrode. The first electrode of the second capacitor C2 may be connected to the first node N1. The second electrode of the second capacitor C2 may be connected to the second node N2. In an embodiment, the second capacitor C2 may be a hold capacitor.

In an embodiment, each of the first-first light emitting element LED1a and the second-first light emitting element LED2a may include a first electrode (e.g., an anode electrode) and a second electrode (e.g., a cathode electrode). The first electrode of each of the first-first light emitting element LED1a and the second-first light emitting element LED2a may be connected to the sixth node N6. A common voltage ELVSS may be applied to the second electrode of each of the first-first light emitting element LED1a and the second-first light emitting element LED2a. In an embodiment, the first-first light emitting element LED1a and the second-first light emitting element LED2a may be controlled by the first light emitting control signal EM1.

In an embodiment, each of the first-second light emitting element LED1b and the second-second light emitting element LED2b may include a first electrode (e.g., an anode electrode) and a second electrode (e.g., a cathode electrode). The first electrode of each of the first-second light emitting element LED1b and the second-second light emitting element LED2b may be connected to the seventh node N7. The common voltage ELVSS may be applied to the second electrode of each of the first-second light emitting element LED1b and the second-second light emitting element LED2b. In an embodiment, the first-second light emitting element LED1b may be controlled by the first light emitting control signal EM1, and the second-second light emitting element LED2b may be controlled by the second light emitting control signal EM2.

For example, in an embodiment, when the first emitting control signal EM1 has an activation level, the eighth transistor T8 of the first pixel circuit PC1, the sixth transistor T6 of the first pixel circuit PC1, and the sixth transistor T6 of the two-pixel circuit PC2 may be turned on. In addition, the first transistor T1 may also be turned on by the data voltage VDATA. In this case, in the first pixel circuit PC1, the first driving current may pass through the first transistor T1 and drive the first-first light emitting element LED1a and the first-second light emitting element LED1b. In addition, in the second pixel circuit PC2, the second driving current may pass through the first transistor T1 and drive the second-first light emitting element LED2a.

For example, in an embodiment, when the second light emitting control signal EM2 has an activation level, the eighth transistor T8 of the second pixel circuit PC2 may be turned on. In addition, the first transistor T1 may also be turned on by the data voltage VDATA. In this case, in the second pixel circuit PC2, the second driving current may pass through the first transistor T1 and drive the second-second light emitting element LED2b.

For example, in an embodiment, each of the first, second, third, fourth, fifth, sixth, seventh, eighth, and ninth transistors T1, T2, T3, T4, T5, T6, T7, T8, and T9, respectively, may be a P-type thin film transistor. Embodiments of the invention are not limited thereto.

However, although in FIGS. 2 and 3, each of the first and second sub-pixels SPX1 and SPX2 is shown as including nine transistors, two capacitors, and two light emitting elements, embodiments of the invention are not limited thereto.

Figure 4:
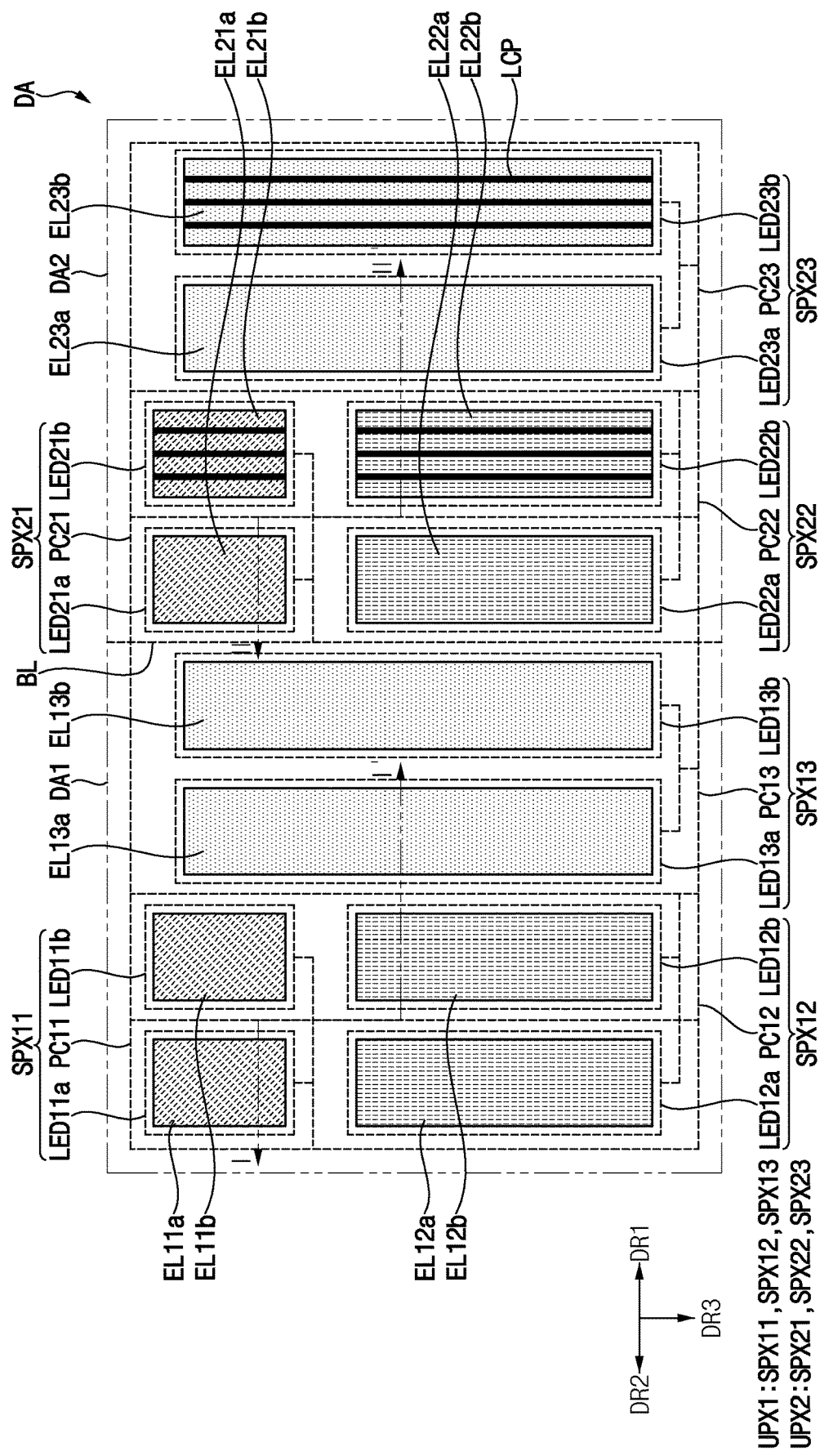
FIG. 4 is a plan view illustrating an embodiment of a first unit pixel, a second unit pixel, and a plurality of light control patterns included in the display device of FIG. 1.
Figure 5:
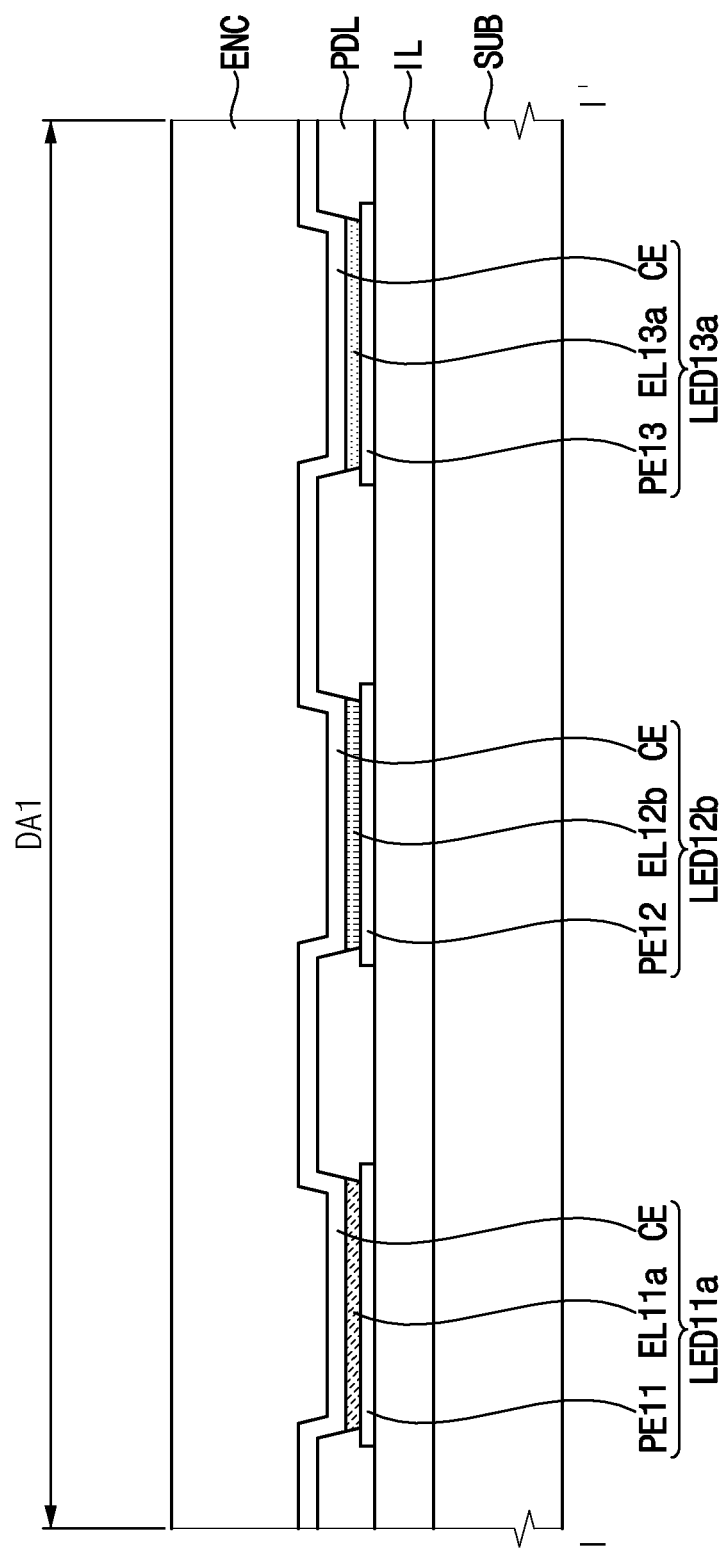
FIG. 5 is a cross-sectional view taken along line I-I' of FIG. 4, according to an embodiment.
Figure 6:
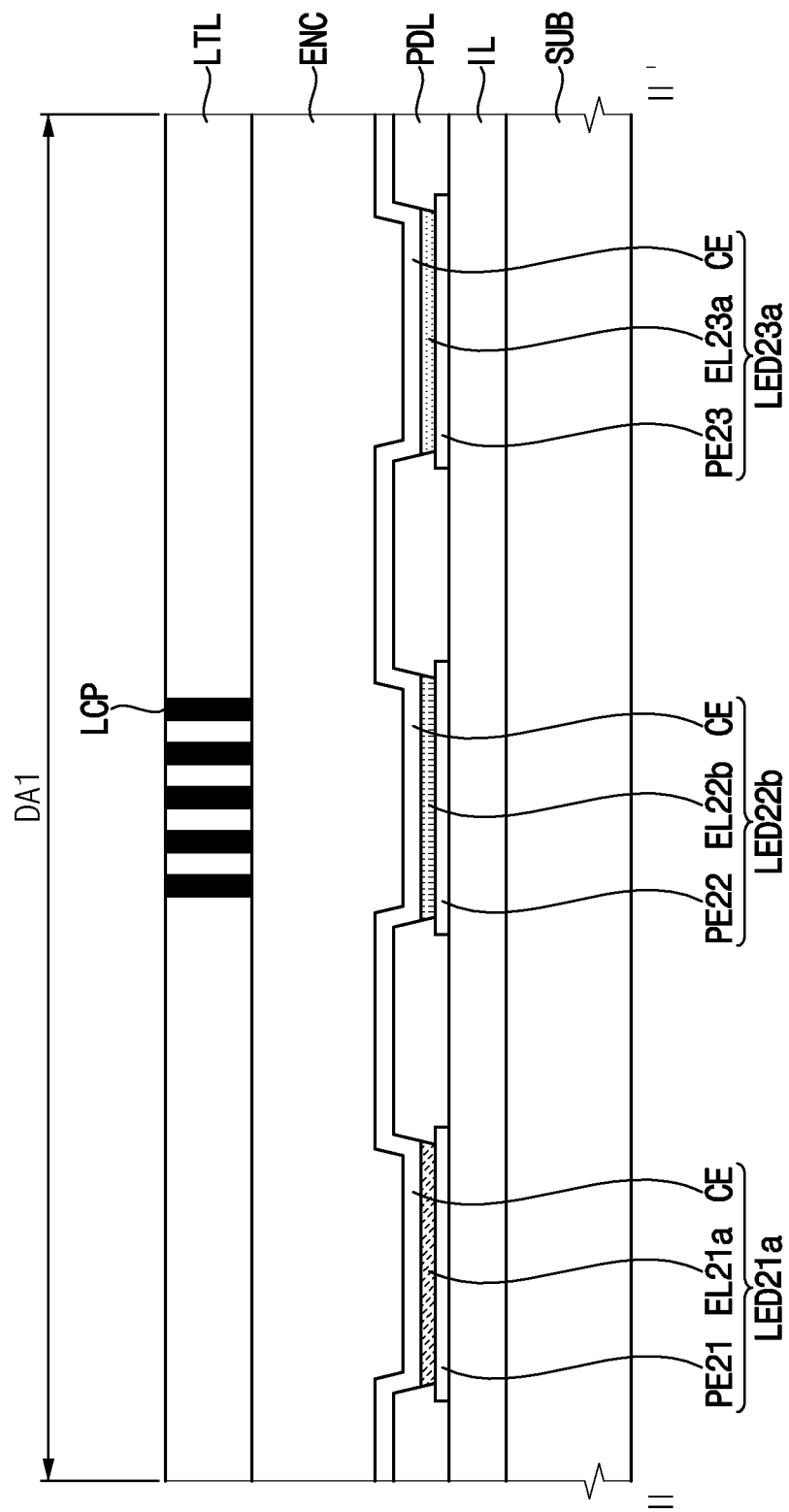
FIG. 6 is a cross-sectional view taken along line II-II' of FIG. 4, according to an embodiment.

FIG. 4 is a plan view illustrating an embodiment of a first unit pixel, a second unit pixel, and a plurality of light control patterns included in the display device of FIG. 1. FIG. 5 is a cross-sectional view taken along line I-I' of FIG. 4, according to an embodiment. FIG. 6 is a cross-sectional view taken along line II-II' of FIG. 4, according to an embodiment.

Referring to FIGS. 1, 4, 5, and 6, the display panel 100 of the display device according to an embodiment may include a substrate SUB, the plurality of sub-pixels, an insulating structure IL, a pixel defining layer PDL, an encapsulation layer ENC, a plurality of light control patterns LCP, and a light transmission layer LTL.

As described above, in an embodiment, the display panel 100 may include the display area DA and the non-display area NDA. As the display panel 100 includes the display area DA and the non-display area NDA, the substrate SUB may also include the display area DA and the non-display area NDA.

In an embodiment, the display area DA may include a first display area DA1 and a second display area DA2 positioned around the first display area DA1. Specifically, the second display area DA2 may refer to the remaining area of the display area DA excluding the first display area DA1. For example, the first display area DA1 may be positioned to the left of the center of the display area DA, and the second display area DA2 may be positioned to the right of the center of the display area DA. However, embodiments of the present disclosure are not limited thereto.

In an embodiment, the substrate SUB may be an insulating substrate including a transparent material or an opaque material. For example, the substrate SUB may include glass. In this case, the display panel 100 may be a rigid display panel. Alternatively, the substrate SUB may include plastic. In this case, the display panel 100 may be a flexible display panel.

In an embodiment, the plurality of sub-pixels may be disposed on the substrate SUB. For example, the sub-pixels may include a first-first sub-pixel SPX11, a first-second sub-pixel SPX12, and a first-third sub-pixel SPX13 disposed in the first display area DA1. In addition, the sub-pixels may further include a second-first sub-pixel SPX21, a second-second sub-pixel SPX22, and a second-third sub-pixel SPX23 disposed in the second display area DA2.

In an embodiment, each of the first-first sub-pixel SPX11 and the second-first sub-pixel SPX21 may emit light of a first color, each of the first-second sub-pixel SPX12 and the second-second sub-pixel SPX22 may emit light of a second color, and each of the first-third sub-pixels SPX13 and the second-third sub-pixel SPX23 may emit light of a third color. For example, the first color may be red, the second color may be green, and the third color may be blue, but embodiments are not limited thereto.

In an embodiment, each of the first-first, first-second, and first-third sub-pixels SPX11, SPX12, and SPX13, respectively, may correspond to the first sub-pixel SPX1 of FIG. 2, and each of the second-first, second-second, and second-third sub-pixels SPX21, SPX22 and SPX23 may correspond to the second sub-pixel SPX2 of FIG. 3.

For example, in an embodiment, in the first display area DA1, the first-first, first-second, and first-third sub-pixels SPX11, SPX12, and SPX13, respectively, located adjacent to each other may form one first unit pixel UPX1. In addition, in the second display area DA2, the second-first, second-second, and second-third sub-pixels SPX21, SPX22, and SPX23, respectively, located adjacent to each other may form one second unit pixel UPX2. In the first display area DA1, a plurality of first unit pixels UPX1 may be arranged in a matrix form along the first direction DR1 and the third direction DR3. In addition, in the second display area DA2, a plurality of second unit pixels UPX2 may be arranged in a matrix form along the first direction DR1 and the third direction DR3.

In an embodiment, the first-first sub-pixel SPX11 may include a first-first pixel circuit PC11, a first-first light emitting element LED11a, and a first-second light emitting element LED11b. Likewise, the second-first sub-pixel SPX21 may include a second-first pixel circuit PC21, a first-first light emitting element LED21a, and a first-second light emitting element LED21b. The first-first pixel circuit PC11 may provide a driving current to the first-first light emitting element LED11a and the first-second light emitting element LED11b, and the second-first pixel circuit PC21 may provide a driving current to the first-first light emitting element LED21a and the first-second light emitting element LED21b.

In an embodiment, the first-first light emitting elements LED11a and LED21a may include pixel electrodes PE11 and PE21, respectively, light emitting layers EL11a and EL21a, respectively, and a common electrode CE. The first-first light emitting element LED11a of the first-first sub-pixel SPX11 may be electrically connected to the first-first pixel circuit PC11 and emit light of the first color (e.g., red light). The first-first light emitting element LED21a of the second-first sub-pixel SPX21 may be electrically connected to the second-first pixel circuit PC21 and emit light of the first color (e.g., red light).

In addition, in an embodiment, the first-second light emitting elements LED11b and LED21b may include pixel electrodes (not shown), light emitting layers EL11b and EL21b, respectively, and the common electrode CE. The first-second light emitting element LED11b of the first-first sub-pixel SPX11 may be electrically connected to the first-first pixel circuit PC11 and emit light of the first color (e.g., red light). The first-second light emitting element LED21b of the second-first sub-pixel SPX21 may be electrically connected to the second-first pixel circuit PC21 and emit light of the first color (e.g., red light).

In an embodiment, the first-second sub-pixel SPX12 may include a first-second pixel circuit PC12, a second-first light emitting element LED12a, and a second-second light emitting element LED12b. Likewise, the second-second sub-pixel SPX22 may include a second-second pixel circuit PC22, a second-first light emitting element LED22a, and a second-second light emitting element LED22b. The first-second pixel circuit PC12 may provide a driving current to the second-first light emitting element LED12a and the second-second light emitting element LED12b, and the second-second pixel circuit PC22 may provide a driving current to the second-first light emitting element LED22a and the second-second light emitting element LED22b.

In an embodiment, the second-first light emitting elements LED12a and LED22a may include pixel electrodes (not shown), light emitting layers EL12a and EL22a, respectively, and the common electrode CE. The second-first light emitting element LED12a of the first-second sub-pixel SPX12 may be electrically connected to the first-second pixel circuit PC12 and emit light of the second color (e.g., green light). The second-first light emitting element LED22a of the second-second sub-pixel SPX22 may be electrically connected to the second-second pixel circuit PC22 and emit light of the second color (e.g., green light).

In addition, in an embodiment, the second-second light emitting elements LED12b and LED22b may include pixel electrodes PE12 and PE22, respectively, light emitting layers EL12b and EL22b, respectively, and the common electrode CE. The second-second light emitting element LED12b of the first-second sub-pixel SPX12 may be electrically connected to the first-second pixel circuit PC12 and emit light of the second color (e.g., green light). The second-second light emitting element LED22b of the second-second sub-pixel SPX22 may be electrically connected to the second-second pixel circuit PC22 and emit light of the second color (e.g., green light).

In an embodiment, the first-third sub-pixel SPX13 may include a first-third pixel circuit PC13, a third-first light emitting element LED13a, and a third-second light emitting element LED13b. Likewise, the second-third sub-pixel SPX23 may include a second-third pixel circuit PC23, a third-first light emitting element LED23a, and a third-second light emitting element LED23b. The first-third pixel circuit PC13 may provide a driving current to the third-first light emitting element LED13a and the third-second light emitting element LED13b, and the second-third pixel circuit PC23 may provide a driving current to the third-first light emitting element LED23a and the third-second light emitting element LED23b.

In an embodiment, the third-first light emitting elements LED13a and LED23a may include pixel electrodes PE13 and PE23, respectively, light emitting layers EL13a and EL23a, respectively, and the common electrode CE. The third-first light emitting element LED13a of the third-first sub-pixel SPX13 may be electrically connected to the first-third pixel circuit PC13 and emit light of the third color (e.g., blue light). The third-first light emitting element LED23a of the second-third sub-pixel SPX23 may be electrically connected to the second-third pixel circuit PC23 and emit light of the third color (e.g., blue light).

In addition, in an embodiment, the third-second light emitting elements LED13b and LED23b may include pixel electrodes (not shown), light emitting layers EL13b and EL23b, respectively, and the common electrode CE. The third-second light emitting element LED13b of the first-third sub-pixel SPX13 may be electrically connected to the first-third pixel circuit PC13 and emit light of the third color (e.g., blue light). The third-second light emitting element LED23b of the second-third sub-pixel SPX23 may be electrically connected to the second-third pixel circuit PC23 and emit light of the third color (e.g., blue light).

In an embodiment, in the first display area DA1, the first-second light emitting element LED11b may be disposed in the first direction DR1 of the first-first light emitting element LED11a, the second-second light emitting element LED12b may be disposed in the first direction DR1 of the second-first light emitting element LED12a, and the third-second light emitting element LED13b may be disposed in the first direction DR1 of the third-first light emitting element LED13a.

In addition, in an embodiment, the second-first light emitting element LED12a may be disposed in the third direction DR3 of the first-first light emitting element LED11a, the second-second light emitting element LED12b may be disposed in the third direction DR3 of the first-second light emitting element LED11b, and the third-first light emitting element LED13a may be disposed in the first direction DR1 of the first-second light emitting element LED11b and the second-second light emitting element LED12b.

That is, in an embodiment, the first-first, first-second, and first-third light emitting elements LED11a, LED12a, and LED13a, respectively, may be disposed at the vertices of the virtual triangle. In addition, the first-second, second-second, and third-second light emitting elements LED11b, LED12b, and LED13b, respectively, may be disposed at the vertices of a different virtual triangle. However, embodiments are not limited to this, and the arrangement of the light emitting elements LED11a, LED11b, LED12a, LED12b, LED13a, and LED13b may be changed in various ways. Likewise, the arrangement of the light emitting elements LED21a, LED21b, LED22a, LED22b, LED23a, and LED23b in the second display area DA2 may be substantially the same as the arrangement of the light emitting elements LED11a, LED11b, LED12a, LED12b, LED13a, and LED13b in the first display area DA1.

As described above, in an embodiment, in the first display area DA1, the operation of the light emitting elements LED11a, LED11b, LED12a, LED12b, LED13a, and LED13b may be controlled by a first light emitting control signal (e.g., the first light emitting control signal EM1 in FIG. 2). In addition, in the second display area DA2, the operation of the first-first, second-first, and third-first light emitting elements LED21a, LED22a, and LED23a, respectively, may be controlled by a first light emitting control signal (e.g., the first light emitting control signal EM1 in FIG. 3) and the operation of the first-second, second-second, and third-second light emitting elements LED21b, LED22b, and LED 23b, respectively, may be controlled by a second light emission control signal (e.g., the second light emitting control signal EM2 in FIG. 3).

For example, in an embodiment, when the first light emitting control signal has an activation level and the second light emitting control signal has an inactivation level, the light emitting elements LED11a, LED11b, LED12a, LED12b, LED13a, and LED13b disposed in the first display area DA1 may be turned on, the first-first, second-first, and third-first light emitting elements LED21a, LED22a, and LED23a, respectively, disposed in the second display area DA2 may be turned on, and the first-second, second-second, and third-second light emitting elements LED21b, LED22b, and LED23b, respectively, disposed in the second display area DA2 may be turned off.

For example, in an embodiment, when the first light emitting control signal has an inactivation level and the second light emitting control signal has an activation level, the light emitting elements LED11a, LED11b, LED12a, LED12b, LED13a, and LED13b disposed in the first display area DA1 may be turned off, the first-first, second-first, and third-first light emitting elements LED21a, LED22a, and LED23a, respectively, disposed in the second display area DA2 may be turned off, and the first-second, second-second, and third-second light emitting elements LED21b, LED22b, and LED23b, respectively, disposed in the second display area DA2 may be turned on.

For example, in an embodiment, when both the first and second light emitting control signals have activation levels, all of the light emitting elements LED11a, LED11b, LED12a, LED12b, LED13a, and LED13b disposed in the first display area DA1 and light emitting elements LED21a, LED21b, LED22a, LED22b, LED23a, and LED23b disposed in the second display area DA2 may be turned on.

For example, in an embodiment, when both the first and second light emitting control signals have inactivation levels, all of the light emitting elements LED11a, LED11b, LED12a, LED12b, LED13a, and LED13b disposed in the first display area DA1 and light emitting elements LED21a, LED21b, LED22a, LED22b, LED23a, and LED23b disposed in the second display area DA2 may be turned off.

In an embodiment, the insulating structure IL may cover the pixel circuits PC11, PC12, PC13, PC21, PC22, and PC23. The insulating structure IL may include a combination of at least one inorganic insulating layer and at least one organic insulating layer.

In an embodiment, pixel electrodes may be disposed on the insulating structure IL. The pixel electrodes may be physically separated from each other. For example, the pixel electrodes PE11 and PE21 may be electrically connected to the first-first pixel circuit PC11 and the second-first pixel circuit PC21 through a contact hole penetrating the insulating structure IL, respectively. The pixel electrodes PE12 and PE22 may be electrically connected to the first-second pixel circuit PC12 and the second-second pixel circuit PC22 through a contact hole penetrating the insulating structure IL, respectively. In addition, the pixel electrodes PE13 and PE23 may be electrically connected to the first-third pixel circuit PC13 and the second-third pixel circuit PC23 through a contact hole penetrating the insulating structure IL, respectively. Each of the pixel electrodes may be referred to as an anode electrode.

For example, in an embodiment, each of the pixel electrodes may include metal, alloy, metal nitride, conductive metal oxide, transparent conductive material, and the like. These can be used alone or in combination with each other. The pixel electrodes may be formed through the same process and may include the same material.

In an embodiment, the pixel defining layer PDL may be disposed on the pixel electrodes. The pixel defining layer PDL may include an inorganic insulating material or an organic insulating material. In an embodiment, the pixel defining layer PDL may include an organic insulating material. The pixel defining layer PDL may define a pixel opening which exposes at least a part of each of the pixel electrodes.

In an embodiment, in the first display area DA1, the light emitting layer EL11a which generates light of the first color (e.g., red light) may be disposed on the pixel electrode PE11, the light emitting layer EL12b which generates light of the second color (e.g., green light) may be disposed on the pixel electrode PE12, and the light emitting layer EL13a which generates light of the third color (e.g., blue light) may be disposed on the pixel electrode PE13. Likewise, the light emitting layer EL11b which generates light of the first color may be disposed on the pixel electrode of the first-second light emitting element LED11b, the light emitting layer EL12a which generates light of the second color may be disposed on the pixel electrode of the second-first light emitting element LED12a, and the light emitting layer EL13b which generates light of the third color may be disposed on the pixel electrode of the third-second light emitting element LED13b.

In an embodiment, in the second display area DA2, the light emitting layer EL21a which generates light of the first color (e.g., red light) may be disposed on the pixel electrode PE21, the light emitting layer EL22b which generates light of the second color (e.g., green light) may be disposed on the pixel electrode PE22, and the light emitting layer EL23a which generates light of the third color (e.g., blue light) may be disposed on the pixel electrode PE23. Likewise, the light emitting layer EL21b which generates light of the first color may be disposed on the pixel electrode of the first-second light emitting element LED21b, the light emitting layer EL22a which generates light of the second color may be disposed on the pixel electrode of the second-first light emitting element LED22a, and the light emitting layer EL23b which generates light of the third color may be disposed on the pixel electrode of the third-second light emitting element LED23b.

For example, in an embodiment, each of the light emitting layers EL11a, EL11b, EL12a, EL12b, EL13a, EL13b, EL21a, EL21b, EL22a, EL22b, EL23a, and EL23b may include an organic light-emitting material. Alternatively, each of the light emitting layers EL11a, EL11b, EL12a, EL12b, EL13a, EL13b, EL21a, EL21b, EL22a, EL22b, EL23a, and EL23b may include an organic light emitting material and quantum dot.

In an embodiment, the common electrode CE may be disposed on the light emitting layers EL11a, EL11b, EL12a, EL12b, EL13a, EL13b, EL21a, EL21b, EL22a, EL22b, EL23a, and EL23b. The common electrode CE may be disposed on the entire surface of the display area DA. For example, the common electrode CE may include metal, alloy, metal nitride, conductive metal oxide, transparent conductive material, and the like. These can be used alone or in combination with each other. The common electrode CE may be referred to as a cathode electrode.

In an embodiment, the encapsulation layer ENC may be disposed on the common electrode CE. The encapsulation layer ENC may include at least one inorganic encapsulation layer and at least one organic encapsulation layer.

In an embodiment, the plurality of light control patterns LCP may be disposed in the second display area DA2 on the second unit pixel UPX2. The light control patterns LCP may control the viewing angle by blocking part of the light emitted from each of the second-first, second-second, and second-third sub-pixels SPX21, SPX22, and SPX23, respectively. For example, the light control patterns LCP may be disposed on the encapsulation layer ENC.

In an embodiment, the light control patterns LCP may overlap the light emitting layers EL21b, EL22b, and EL23b of the first-second, second-second, and third-second light emitting elements LED21b, LED22b, and LED23b, respectively, in a plan view, and might not overlap the light emitting layers EL21a, EL22a, and EL23a of the first-first, second-first, and third-first light emitting elements LED21a, LED22a, and LED23a, respectively, in the plan view. Each of the light control patterns LCP may block part of the light emitted from the first-second, second-second, and third-second light emitting elements LED21b, LED22b, and LED23b, respectively.

For example, in an embodiment, each of the light control patterns LCP may extend in the third direction DR3, and the light control patterns LCP may be disposed to be spaced apart from each other along the first direction DR1.

In an embodiment, each of the light control patterns LCP may include an inorganic material. In an embodiment, each of the light control patterns LCP may include molybdenum-tantalum oxide. For example, each of the light control patterns LCP may include MTO, MTO/Mo, MTO/Cu, MTO/Al, MTO/Mo/MTO, MTO/Cu/MTO, MTO, Al/MTO, and the like. These can be used alone or in combination with each other. However, each of the light control patterns LCP is not limited to including MTO, and may include various materials with relatively low transmittance and reflectance, and relatively high absorption.

In another embodiment, each of the light control patterns LCP may include an organic material containing a light blocking material such as black pigment, black dye, and the like.

In an embodiment, the light transmission layer LTL may be disposed in the second display area DA2 on the encapsulation layer ENC. The light transmission layer LTL may fill the space between the light control patterns LCP. For example, the light transmission layer LTL may include a transparent organic insulating material. The light transmission layer LTL may have a substantially flat upper surface.

For example, in an embodiment, when an image is to be displayed in a mode which controls the viewing angle in the second direction DR2 (or the first direction DR1), the first light emitting control signal may have an inactivation level, and the second light emitting control signal may have an inactivation level. In this case, the light emitting elements LED11a, LED11b, LED12a, LED12b, LED13a, and LED13b disposed in the first display area DA1 may be turned off, the first-first, second-first, and third-first light emitting elements LED21a, LED22a, and LED23a, respectively, disposed in the second display area DA2 may be turned off, and the first-second, second-second, and third-second light emitting elements LED21b, LED22b, and LED23b, respectively, disposed in the second display area DA2 may be turned on. Accordingly, the light control patterns LCP may block a part of the light emitted from the first-second, second-second, and third-second light emitting elements LED21b, LED22b, and LED23b, respectively, traveling in the second direction DR2. Accordingly, the image might not be visible in the second direction DR2 of the display panel 100.

For example, in an embodiment, when an image is to be displayed in a mode which does not control the viewing angle, each of the first and second light emitting control signals may have an activation level. In this case, all of the light emitting elements LED11a, LED11b, LED12a, LED12b, LED13a, and LED13b disposed in the first display area DA1 and the light emitting elements LED21a, LED21b, LED22a, LED22b, LED23a, and LED23b may be turned on. Accordingly, the image can be viewed in both the first direction DR1 and the second direction DR2 of the display panel 100.

In an embodiment, the display device may be applied to a vehicle display. The display device may display an image at a narrow viewing angle or at a wide viewing angle. Accordingly, the driver's (or passenger's) viewing angle may be controlled as needed.

Figure 7:
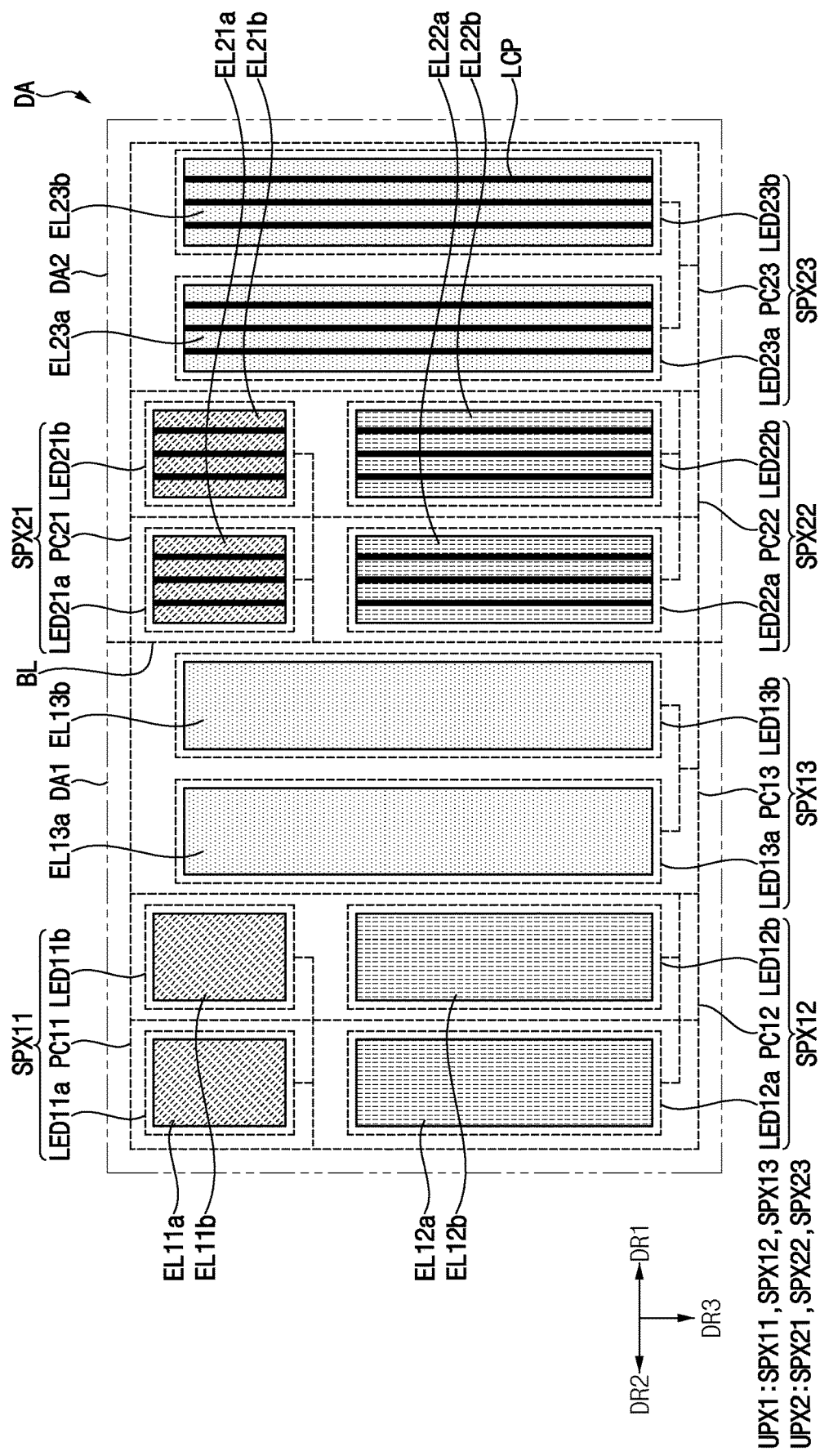
FIG. 7 is a plan view illustrating another embodiment of a first unit pixel, a second unit pixel, and a plurality of light control patterns included in the display device of FIG. 1.
Figure 8:
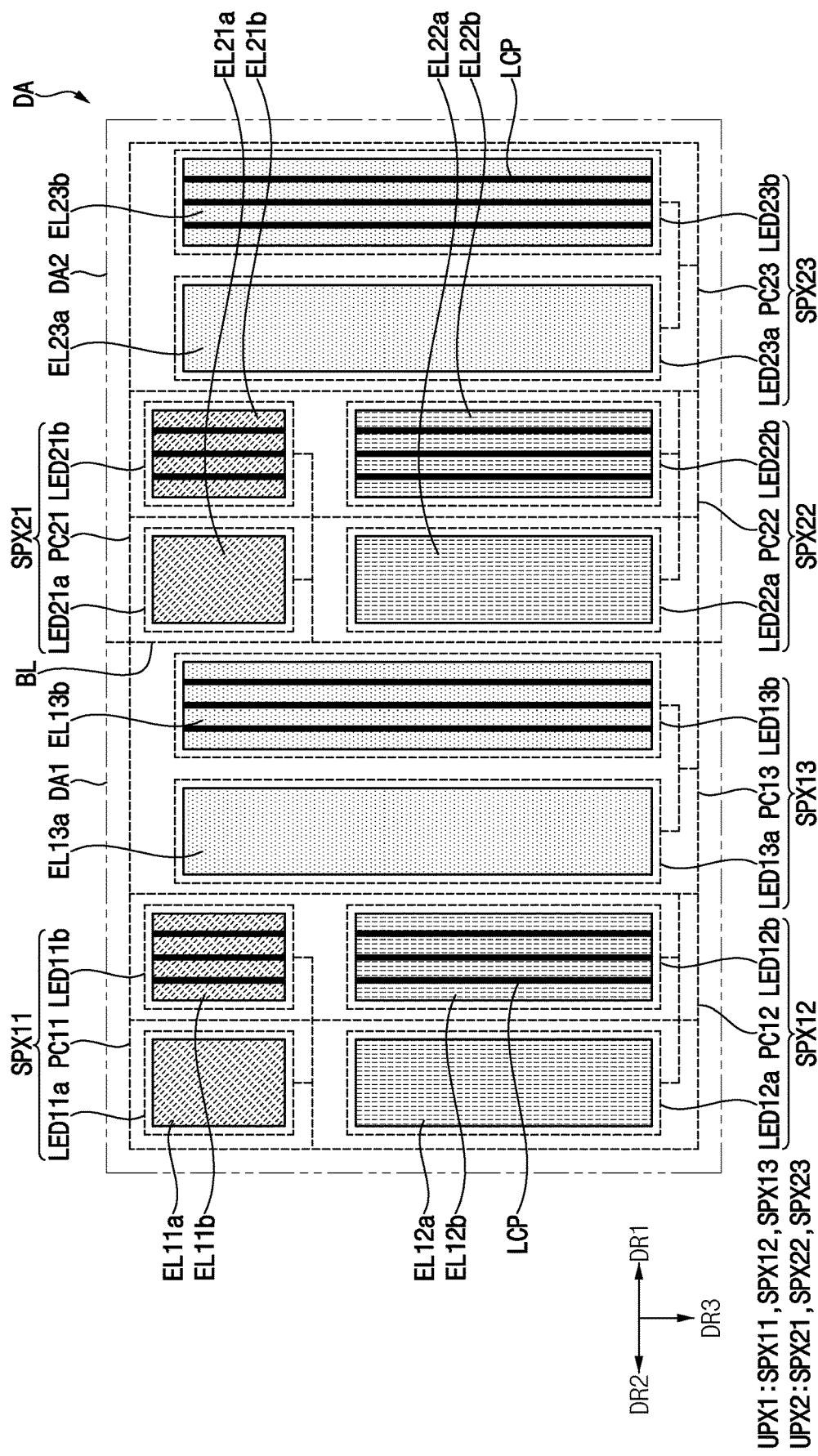
FIG. 8 is a plan view illustrating still another embodiment of a first unit pixel, a second unit pixel, and a plurality of light control patterns included in the display device of FIG. 1.
Figure 9:
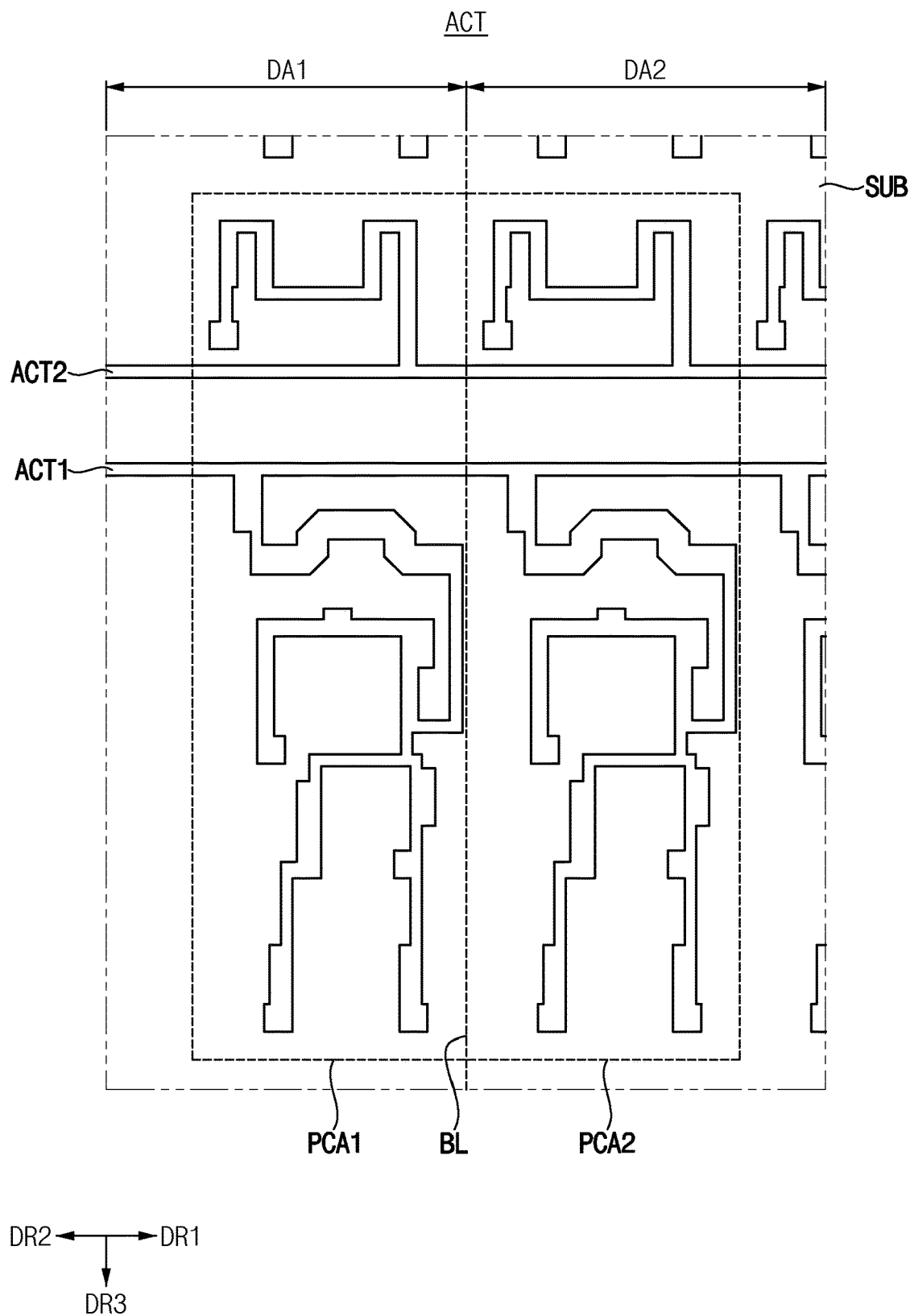
FIG. 9 is a layout view illustrating an embodiment of a sub-pixel disposed in a first display area and a sub-pixel disposed in a second display area of FIG. 4.

FIG. 7 is a plan view illustrating another embodiment of a first unit pixel, a second unit pixel, and a plurality of light control patterns included in the display device of FIG. 1. FIG. 8 is a plan view illustrating still another embodiment of a first unit pixel, a second unit pixel, and a plurality of light control patterns included in the display device of FIG. 1.

Hereinafter, descriptions that overlap with the display device described with reference to FIG. 6 will be omitted or simplified.

According to embodiments and referring to FIGS. 7 and 8, the arrangement of the light control patterns LCP may be changed in various ways.

In an embodiment, as shown in FIG. 7, in the second display area DA2, the light control patterns LCP may overlap the light emitting layers EL21a, EL22a, and EL23a of the first-first, second-first, and third-first light emitting elements LED21a, LED22a, and LED23a, respectively, in the plan view and might not overlap the light emitting layers EL21b, EL22b, and EL23b of the first-second, second-second, and third-second light emitting elements LED21b, LED22b, and LED23b, respectively, in the plan view.

In an embodiment, as shown in FIG. 8, the light control patterns LCP may be disposed in both the first display area DA1 and the second display area DA2. In this case, in the first and second display areas DA1 and DA2, respectively, the light control patterns LCP may overlap the light emitting layers EL21a, EL22a, and EL23a of the first-first, second-first, and third-first light emitting elements LED21a, LED22a, and LED23a, respectively, in the plan view and might not overlap the light emitting layers EL21b, EL22b, and EL23b of the first-second, second-second, and third-second light emitting elements LED21b, LED22b, and LED23b, respectively, in the plan view.

However, embodiments are not limited to this, and the arrangement of the light control patterns LCP may be different from the arrangement of FIGS. 4, 7, and 8.

Figure 22:
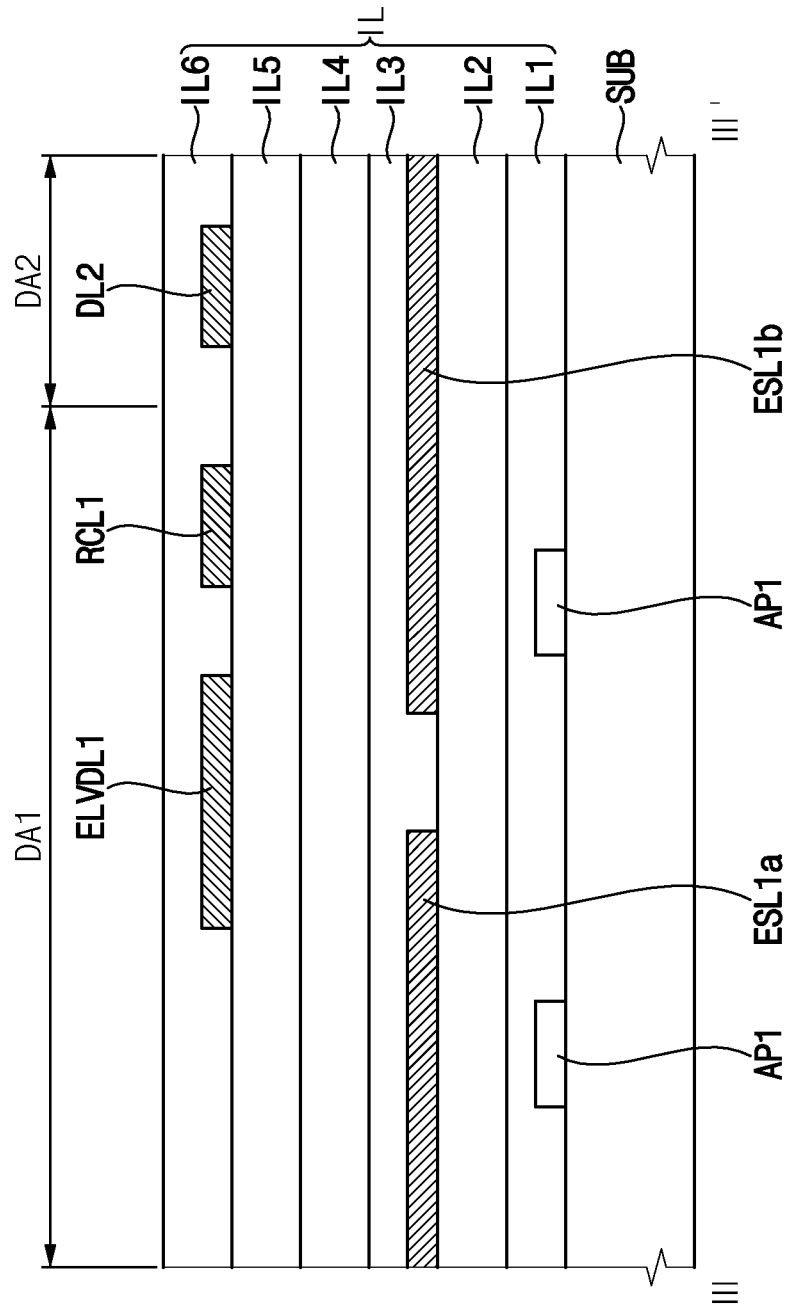
FIG. 22 is a cross-sectional view taken along line III-III' of FIG. 19, according to an embodiment.
Figure 23:
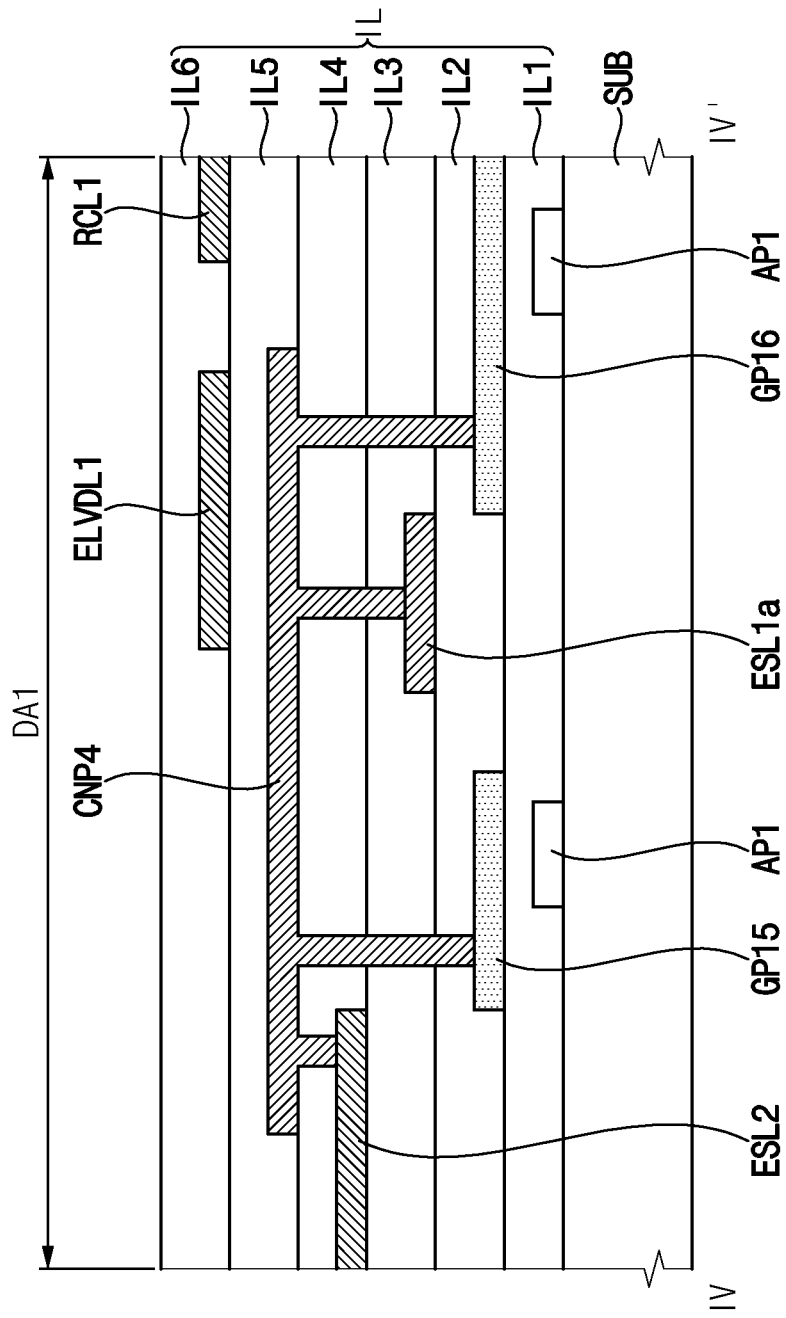
FIG. 23 is a cross-sectional view taken along line IV-IV' of FIG. 19, according to an embodiment.

FIGS. 9, 10, 11, 12, 13, 14, 15, 16, 17, 18, 19, 20, and 21 are layout views illustrating an embodiment of a sub-pixel disposed in a first display area and a sub-pixel disposed in a second display area of FIG. 4. FIG. 22 is a cross-sectional view taken along line III-III' of FIG. 19, according to an embodiment. FIG. 23 is a cross-sectional view taken along line IV-IV' of FIG. 19, according to an embodiment.

Hereinafter, with reference to FIGS. 9, 10, 11, 12, 13, 14, 15, 16, 17, 18, 19, 20, 21, 22, and 23, the layer-by-layer structure of each of the first and second sub-pixels included in the display panel 100 (e.g., the first and second sub-pixels SPX1 and SPX2 of FIGS. 2 and 3) will be described in detail with reference to FIGS. 9, 10, 11, 12, 13, 14, 15, 16, 17, 18, 19, 20, 21, 22, and 23.

Referring to FIGS. 1, 2, 3, 9, 22, and 23, the display panel 100 of the display device according to embodiments may include an active layer ACT disposed on the substrate SUB.

In an embodiment, the substrate SUB may include a first pixel circuit area PCA1 positioned in the first display area DA1 and a second pixel circuit area PCA2 positioned in the second display area DA2. The first pixel circuit PC1 of the first sub-pixel SPX1 may be disposed in the first pixel circuit area PCA1, and the second pixel circuit PC2 of the second sub-pixel SPX2 may be disposed in the second pixel circuit area PCA2. For example, the first-third pixel circuit PC13 of FIG. 4 may be disposed in the first pixel circuit area PCA1, and the second-first pixel circuit PC21 of FIG. 4 may be disposed in the second pixel circuit area PCA2.

In an embodiment, the active layer ACT may include a first active pattern ACT1 and a second active pattern ACT2. The first active pattern ACT1 and the second active pattern ACT2 may be spaced apart from each other. In addition, the first active pattern ACT1 and the second active pattern ACT2 may be disposed in the same layer and include the same material.

A part of the first active pattern ACT1 may be disposed in the first pixel circuit area PCA1, and another part of the first active pattern ACT1 may be disposed in the second pixel circuit area PCA2. Likewise, a part of the second active pattern ACT2 may be disposed in the first pixel circuit area PCA1, and another part of the second active pattern ACT2 may be disposed in the second pixel circuit area PCA2.

For example, in an embodiment, the active layer ACT may include a metal oxide semiconductor (e.g., indium gallium zinc oxide (IGZO), and the like), an inorganic semiconductor (e.g., amorphous silicon, poly silicon), or an organic semiconductor.

Figure 10:
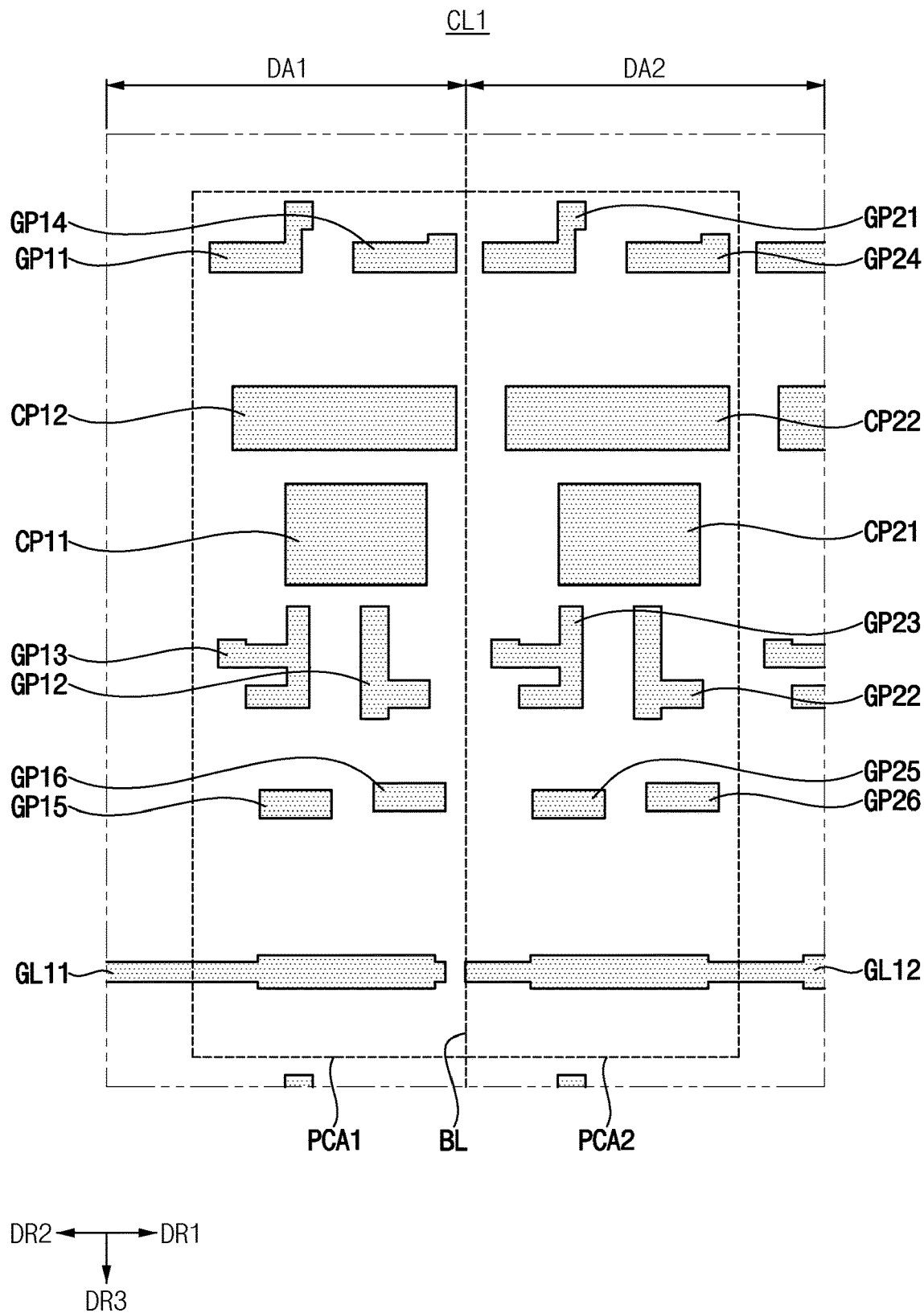
FIG. 10 is a layout view illustrating an embodiment of a sub-pixel disposed in a first display area and a sub-pixel disposed in a second display area of FIG. 4.
Figure 11:
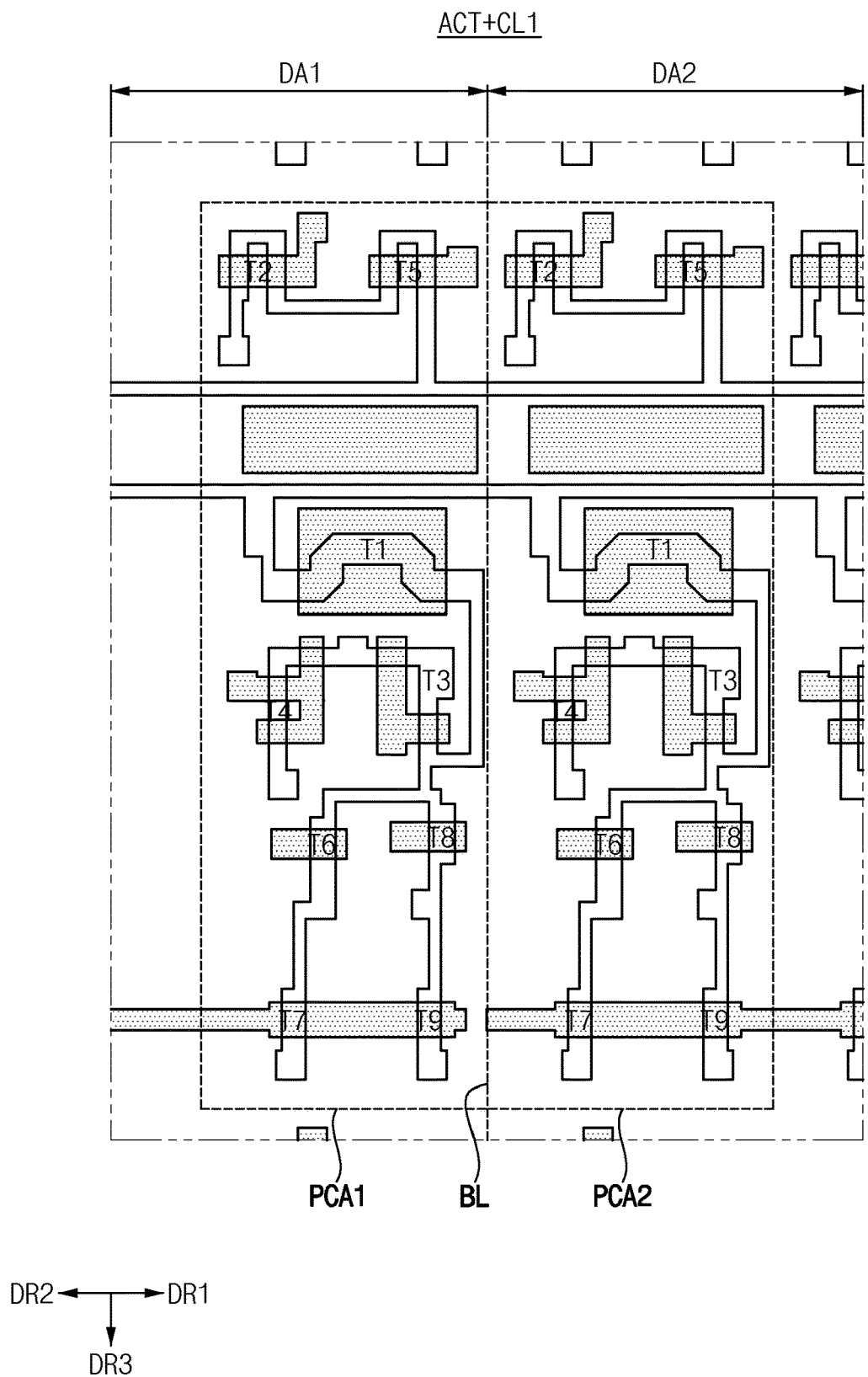
FIG. 11 is a layout view illustrating an embodiment of a sub-pixel disposed in a first display area and a sub-pixel disposed in a second display area of FIG. 4.

Referring further to FIGS. 10 and 11, the display panel 100 of the display device according to embodiments may further include a first conductive layer CL1 disposed on the active layer ACT. Specifically, a first insulating layer IL1 covering the active layer ACT may be disposed, and the first conductive layer CL1 may be disposed on the first insulating layer IL1. For example, the first insulating layer IL1 may include an inorganic insulating material such as silicon oxide ($SiO_x$), silicon nitride ($SiN_x$), silicon oxynitride ($SiO_xN_y$), and the like. These can be used alone or in combination with each other.

In an embodiment, the first conductive layer CL1 may include first-first, first-second, first-third, first-fourth, fifth-first, and sixth-first gate patterns GP11, GP12, GP13, GP14, GP15, and GP16, respectively, second-first, second-second, second-third, second-fourth, second-fifth, and second-sixth gate patterns GP21, GP22, GP23, GP24, GP25, and GP26, respectively, first-first and first-second capacitor electrodes CP11 and CP12, respectively, second-first and second-second capacitor electrodes CP21 and CP22, respectively, a first-first a gate line GL11, and a first-second gate line GL12.

The first-first, first-second, first-third, first-fourth, fifth-first, and sixth-first gate patterns GP11, GP12, GP13, GP14, GP15, and GP16, respectively, the second-first, second-second, second-third, second-fourth, second-fifth, and second-sixth gate patterns GP21, GP22, GP23, GP24, GP25, and GP26, respectively, the first-first and first-second capacitor electrodes CP11 and CP12, respectively, the second-first and second-second capacitor electrodes CP21 and CP22, respectively, the first-first a gate line GL11, and the first-second gate line GL12 may be spaced apart from each other. In addition, the first-first, first-second, first-third, first-fourth, fifth-first, and sixth-first gate patterns GP11, GP12, GP13, GP14, GP15, and GP16, respectively, the second-first, second-second, second-third, second-fourth, second-fifth, and second-sixth gate patterns GP21, GP22, GP23, GP24, GP25, and GP26, respectively, the first-first and first-second capacitor electrodes CP11 and CP12, respectively, the second-first and second-second capacitor electrodes CP21 and CP22, respectively, the first-first a gate line GL11, and the first-second gate line GL12 may be disposed in the same layer and may include the same material.

In an embodiment, the first-first capacitor electrode CP11 may be disposed in the first pixel circuit area PCA1 and may partially overlap the first active pattern ACT1 in a plan view. In addition, the second-first capacitor electrode CP21 may be disposed in the second pixel circuit area PCA2 and may partially overlap the first active pattern ACT1. The first-first capacitor electrode CP11 may be substantially the same as or similar to the second-first capacitor electrode CP21.

Accordingly, in an embodiment, a part of the first active pattern ACT1 and a part of the first-first capacitor electrode CP11 (or the second-first capacitor electrode CP21) overlapping the part of the first active pattern ACT1 (i.e., gate electrode) may constitute the first transistor T1.

In an embodiment, the first-first gate pattern GP11 may be disposed in the first pixel circuit area PCA1 and may partially overlap the second active pattern ACT2 in the plan view. In addition, the second-first gate pattern GP21 may be disposed in the second pixel circuit area PCA2 and may partially overlap the second active pattern ACT2. The first gate signal GW may be applied to the first-first gate pattern GP11 and the second-first gate pattern GP21.

In an embodiment, the first-first gate pattern GP11 may be substantially the same as or similar to the second-first gate pattern GP21.

Accordingly, in an embodiment, a part of the second active pattern ACT2 and a part of the first-first gate pattern GP11 (or the second-first gate pattern GP21) overlapping the part of the second active pattern ACT2 (i.e., gate electrode) may constitute the second transistor T2.

In an embodiment, the first-second gate pattern GP12 may be disposed in the first pixel circuit area PCA1 and may partially overlap the first active pattern ACT1 in the plan view. In addition, the second-second gate pattern GP22 may be disposed in the second pixel circuit area PCA2 and may partially overlap the first active pattern ACT1 in the plan view. The second gate signal GC may be applied to the first-second gate pattern GP12 and the second-second gate pattern GP22.

In an embodiment, the first-second gate pattern GP12 may be substantially the same as or similar to the second-second gate pattern GP22.

Accordingly, in an embodiment, a part of the first active pattern ACT1 and a part of the first-second gate pattern GP12 (or, the second-second gate pattern GP22) overlapping the part of the first active pattern ACT1 (i.e., gate electrode) may constitute the third transistor T3.

In an embodiment, the first-third gate pattern GP13 may be disposed in the first pixel circuit area PCA1 and may partially overlap the first active pattern ACT1 in the plan view. In addition, the second-third gate pattern GP23 may be disposed in the second pixel circuit area PCA2 and may partially overlap the first active pattern ACT1 in the plan view. The third gate signal GI may be applied to the first-third gate pattern GP13 and the second-third gate pattern GP23.

In an embodiment, the first-third gate pattern GP13 may be substantially the same as or similar to the second-third gate pattern GP23.

Accordingly, in an embodiment, a part of the first active pattern ACT1 and a part of the first-third gate pattern GP13 (or the second-third gate pattern GP23) overlapping the part of the first active pattern ACT1 (i.e., gate electrode) may constitute the fourth transistor T4.

In an embodiment, the first-fourth gate pattern GP14 may be disposed in the first pixel circuit area PCA1 and may partially overlap the second active pattern ACT2 in the plan view. In addition, the second-fourth gate pattern GP24 may be disposed in the second pixel circuit area PCA2 and may partially overlap the second active pattern ACT2 in the plan view. The second gate signal GC may be applied to the first-fourth gate pattern GP14 and the second-fourth gate pattern GP24.

In an embodiment, the first-fourth gate pattern GP14 may be substantially the same as or similar to the second-fourth gate pattern GP24.

Accordingly, in an embodiment, a part of the second active pattern ACT2 and a part of the first-fourth gate pattern GP14 (or the second-fourth gate pattern GP24) overlapping the part of the second active pattern ACT2 (i.e., gate electrode) may constitute the fifth transistor T5.

In an embodiment, the first-fifth gate pattern GP15 may be disposed in the first pixel circuit area PCA1 and may partially overlap the first active pattern ACT1 in the plan view. In addition, the second-fifth gate pattern GP25 may be disposed in the second pixel circuit area PCA2 and may partially overlap the first active pattern ACT1 in the plan view. In an embodiment, the first light emitting control signal EM1 may be applied to the first-fifth gate pattern GP15 and the second-fifth gate pattern GP25.

In an embodiment, the first-fifth gate pattern GP15 may be substantially the same as or similar to the second-fifth gate pattern GP25.

Accordingly, in an embodiment, a part of the first active pattern ACT1 and a part of the first-fifth gate pattern GP15 (or the second-fifth gate pattern GP25) overlapping the part of the first active pattern ACT1 (i.e., gate electrode) may constitute the sixth transistor T6.

In an embodiment, the first-sixth gate pattern GP16 may be disposed in the first pixel circuit area PCA1 and may partially overlap the first active pattern ACT1 in the plan view. In addition, the second-sixth gate pattern GP26 may be disposed in the second pixel circuit area PCA2 and may partially overlap the first active pattern ACT1 in the plan view. In an embodiment, the first light emitting control signal EM1 may be applied to the first-sixth gate pattern GP16 and the second light emitting control signal EM2 may be applied to the second-sixth gate pattern GP26.

In an embodiment, the first-sixth gate pattern GP16 may be substantially the same as or similar to the second-sixth gate pattern GP26.

Accordingly, in an embodiment, a part of the first active pattern ACT1 and a part of the first-sixth gate pattern GP16 (or the second-sixth gate pattern GP26) overlapping the part of the first active pattern ACT1 (i.e., gate electrode) may constitute the eighth transistor T8.

In an embodiment, the first-first gate line GL11 may be disposed in the first pixel circuit area PCA1, may partially overlap the first active pattern ACT1 in the plan view, and may extend in the first direction DR1. In addition, the first-second gate line GL12 may be disposed in the second pixel circuit area PCA2, may partially overlap the first active pattern ACT1 in the plan view, and may extend in the first direction DR1. The fourth gate signal GB may be applied to the first-first gate line GL11 and the first-second gate line GL12.

In an embodiment, the first-first gate line GL11 may be physically separated from the first-second gate line GL12 based on a boundary line BL where the first display area DA1 and the second display area DA2 are in contact.

Accordingly, in an embodiment, a part of the first active pattern ACT1 and a part of the first-first gate line GL11 (or the second-first gate line GL21) overlapping the part of the first active pattern ACT1 (i.e., gate electrode) may constitute the seventh transistor T7. In addition, another part of the first active pattern ACT1 and a part of the first-first gate line GL11 (or the second-first gate line GL21) overlapping another part of the first active pattern ACT1 (i.e., gate electrode) may constitute the ninth transistor T9.

In an embodiment, the first-second capacitor electrode CP12 may be disposed in the first pixel circuit area PCA1 and positioned between the first active pattern ACT1 and the second active pattern ACT2 in the plan view. The second-second capacitor electrode CP22 may be disposed in the second pixel circuit area PCA2 and positioned between the first active pattern ACT1 and the second active pattern ACT2 in the plan view.

For example, in an embodiment, the first conductive layer CL1 may include metal, alloy, metal nitride, conductive metal oxide, transparent conductive material, and the like. These can be used alone or in combination with each other.

Figure 12:
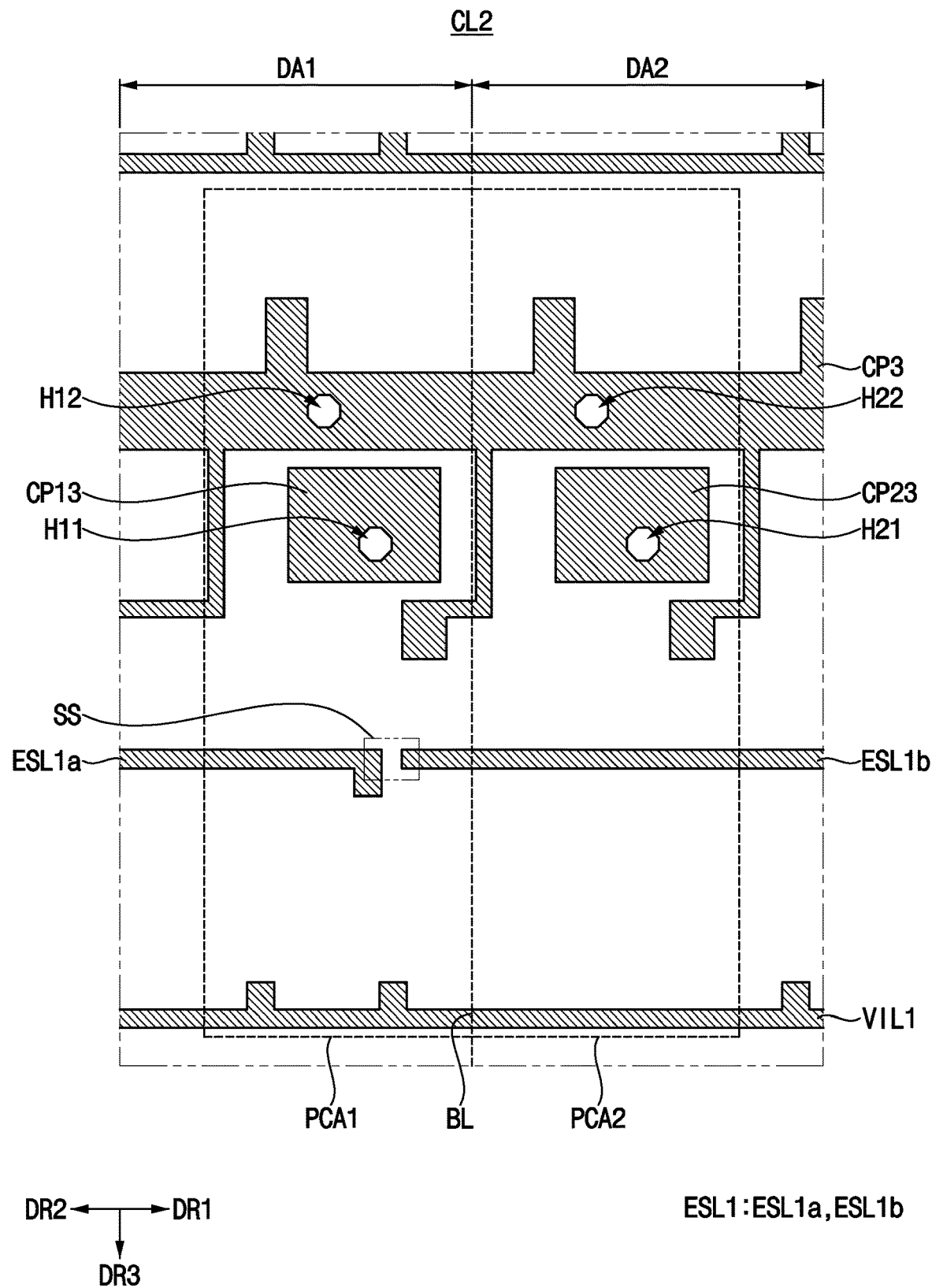
FIG. 12 is a layout view illustrating an embodiment of a sub-pixel disposed in a first display area and a sub-pixel disposed in a second display area of FIG. 4.
Figure 13:
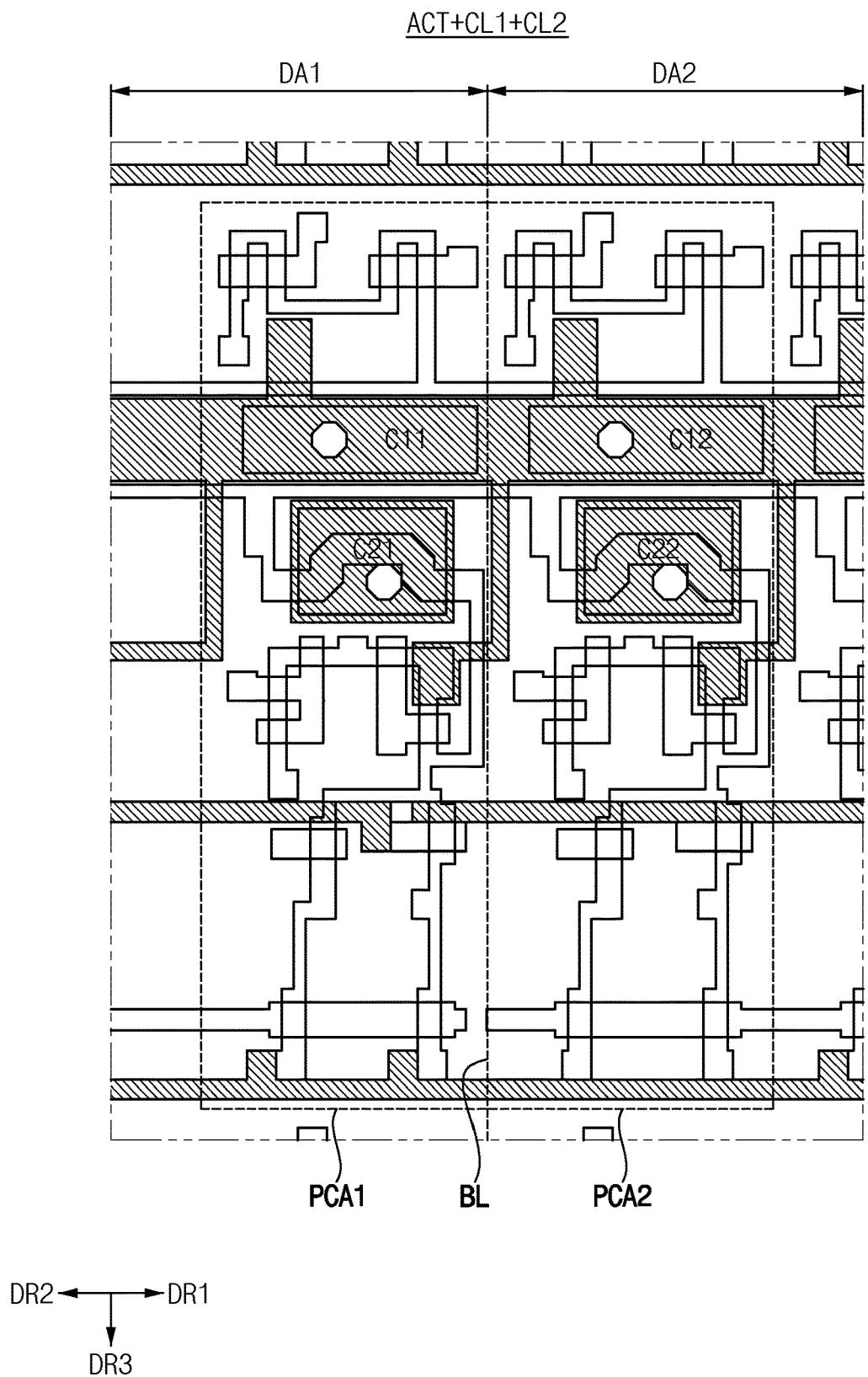
FIG. 13 is a layout view illustrating an embodiment of a sub-pixel disposed in a first display area and a sub-pixel disposed in a second display area of FIG. 4.

Referring further to FIGS. 12 and 13, the display panel 100 of the display device according to embodiments may further include a second conductive layer CL2 disposed on the first conductive layer CL1. Specifically, a second insulating layer IL2 may be disposed to cover the first conductive layer CL1, and the second conductive layer CL2 may be disposed on the second insulating layer IL2. For example, the second insulating layer IL2 may include an inorganic insulating material such as silicon oxide, silicon nitride, silicon oxynitride, and the like. These can be used alone or in combination with each other.

In an embodiment, the second conductive layer CL2 may include a first-third capacitor electrode CP13, a second-third capacitor electrode CP23, a third capacitor electrode CP3, a first light emitting control line ESL1, and a first initialization line VIL1.

In an embodiment, the first-third capacitor electrode CP13, the second-third capacitor electrode CP23, the third capacitor electrode CP3, the first light emitting control line ESL1, and the first initialization line VIL1 may be spaced apart from each other. In addition, the first-third capacitor electrode CP13, the second-third capacitor electrode CP23, the third capacitor electrode CP3, the first light emitting control line ESL1, and the first initialization line VIL1 may be disposed in the same layer and may include the same material.

In an embodiment, the first-third capacitor electrode CP13 may at least partially overlap the first-first capacitor electrode CP11 in the plan view. A first-first hole H11 exposing at least a part of the first-first capacitor electrode CP11 may be defined in the first-third capacitor electrode CP13. Accordingly, the first-third capacitor electrode CP13 may constitute the second-first capacitor C21 together with the first-first capacitor electrode CP11.

In an embodiment, the second-third capacitor electrode CP23 may at least partially overlap the second-first capacitor electrode CP21 in the plan view. A second-first hole H21 exposing at least a part of the second-first capacitor electrode CP21 may be defined in the second-third capacitor electrode CP23. Accordingly, the second-third capacitor electrode CP23 may constitute the second-second capacitor C22 together with the second-first capacitor electrode CP21.

In an embodiment, the third capacitor electrode CP3 may extend in the first direction DR1. The third capacitor electrode CP3 may at least partially overlap each of the first-second capacitor electrode CP12 and the second-second capacitor electrode CP22 in the plan view. A first-second hole H12 exposing at least a part of the first-second capacitor electrode CP12 and a second-second hole H12 exposing at least a part of the second-second capacitor electrode CP22 may be defined in the third capacitor electrode CP3.

Accordingly, in an embodiment, the third capacitor electrode CP3 may constitute the first-first capacitor C11 together with the first-second capacitor electrode CP12, and the third capacitor electrode CP3 may constitute the first-second capacitor electrode CP12 together with the second-second capacitor electrode CP12. Here, each of the first-first capacitor C11 and the first-second capacitor C12 may correspond to the first capacitor C1 of FIGS. 2 and 3.

In an embodiment, the first light emitting control line ESL1 may partially overlap the first active pattern ACT1 in the plan view. In an embodiment, the first light emitting control line ESL1 may include a first portion ESL1$a$ and a second portion ESL1$b$ which are spaced apart from each other. Specifically, the first portion ESL1$a$ and the second portion ESL1$b$ of the first light emitting control line ESL1 may be physically separated around the boundary line BL. Each of the first portion ESL1$a$ and the second portion ESL1$b$ of the first light emitting control line ESL1 may extend in the first direction DR1.

In an embodiment, as the first portion ESL1$a$ and the second portion ESL1$b$ of the first light emitting control line ESL1 are physically separated from each other, a separation space SS may be defined between the first portion ESL1$a$ and the second portion ESL1$b$. For example, the separation space SS may be positioned in the first pixel circuit area PCA1. However, embodiments are not limited thereto.

In an embodiment, the first portion ESL1$a$ of the first light emitting control line ESL1 may at least partially overlap the first display area DA1, and the second portion ESL1$b$ of the first light emitting control line ESL1 may at least partially overlap the second display area DA2.

In an embodiment, the first light emitting control signal EM1 may be applied to the first portion ESL1$a$ of the first light emitting control line ESL1, and the second light emitting control signal EM2 may be applied to the second portion ESL1$b$ of the first light emitting control line ESL1.

In an embodiment, the first initialization line VIL1 may extend in the first direction DR1. The first initialization line VIL1 may be spaced apart from the first light emitting control line ESL1 in the third direction DR3. The second initialization voltage VAINT, which is transferred to sub-pixels which emit green light and blue light, may be applied to the first initialization line VIL1.

For example, in an embodiment, the second conductive layer CL2 may include metal, alloy, metal nitride, conductive metal oxide, transparent conductive material, and the like. These can be used alone or in combination with each other.

Figure 14:
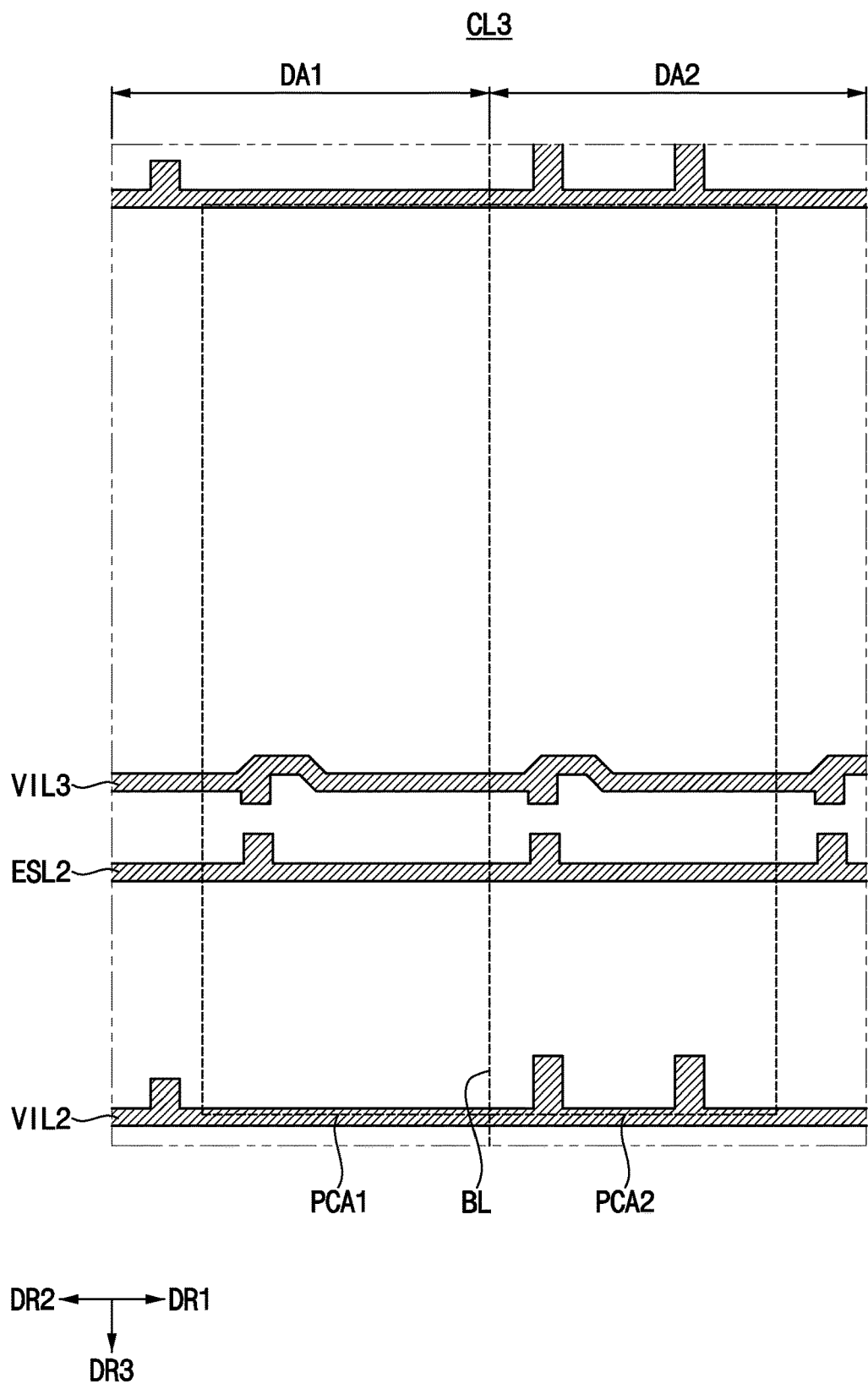
FIG. 14 is a layout view illustrating an embodiment of a sub-pixel disposed in a first display area and a sub-pixel disposed in a second display area of FIG. 4.
Figure 15:
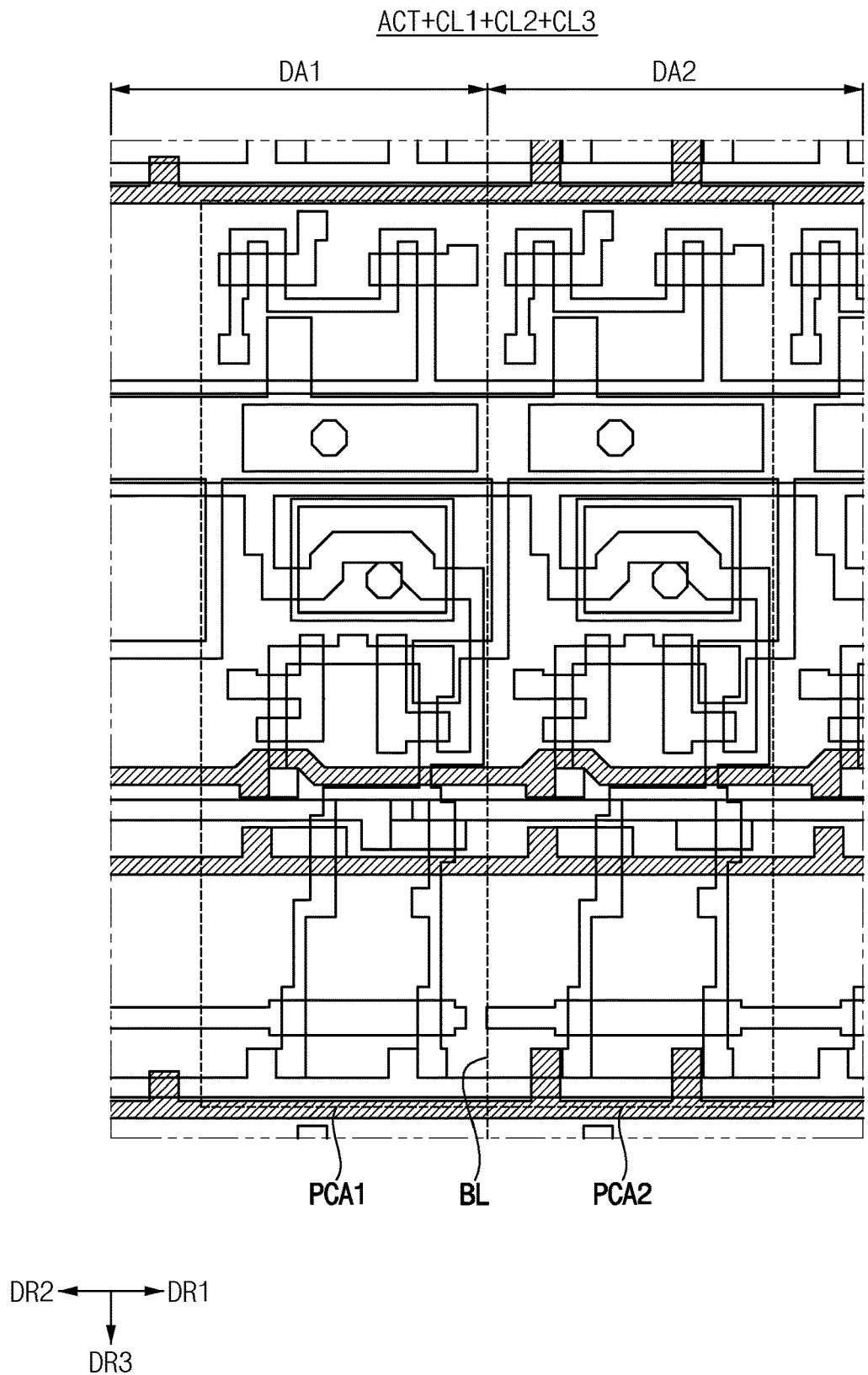
FIG. 15 is a layout view illustrating an embodiment of a sub-pixel disposed in a first display area and a sub-pixel disposed in a second display area of FIG. 4.

Referring further to FIGS. 14 and 15, the display panel 100 of the display device according to embodiments may further include a third conductive layer CL3 disposed on the second conductive layer CL2. Specifically, a third insulating layer IL3 may be disposed covering the second conductive layer CL2, and the third conductive layer CL3 may be disposed on the third insulating layer IL3.

In an embodiment, the third conductive layer CL3 may include a second light emitting control line ESL2, a second initialization line VIL2, and a third initialization line VIL3. The second light emitting control line ESL2, the second initialization line VIL2, and the third initialization line VIL3 may be spaced apart from each other. The second light emitting control line ESL2, the second initialization line VIL2, and the third initialization line VIL3 may be disposed in the same layer and may include the same material.

In an embodiment, the second light emitting control line ESL2 might not overlap the first light emitting control line ESL1 in the plan view. The second light emitting control line ESL2 may extend in the first direction DR1. In an embodiment, the first light emitting control signal EM1 may be applied to the second light emitting control line ESL2.

In an embodiment, the second initialization line VIL2 may extend in the first direction DR1. The second initialization line VIL2 may be spaced apart from the second light emitting control line ELS2 in the third direction DR3. The second initialization voltage VAINT, which is transferred to the sub-pixels which emit red light, may be applied to the second initialization line VIL2.

In an embodiment, the third initialization line VIL3 may extend in the first direction DR1. The third initialization line VIL3 may be spaced apart from the second light emitting control line ESL2 in a direction opposite to the third direction DR3. The first initialization voltage VINT may be applied to the third initialization line VIL3.

For example, in an embodiment, the third conductive layer CL3 may include metal, alloy, metal nitride, conductive metal oxide, transparent conductive material, and the like. These can be used alone or in combination with each other.

Figure 16:
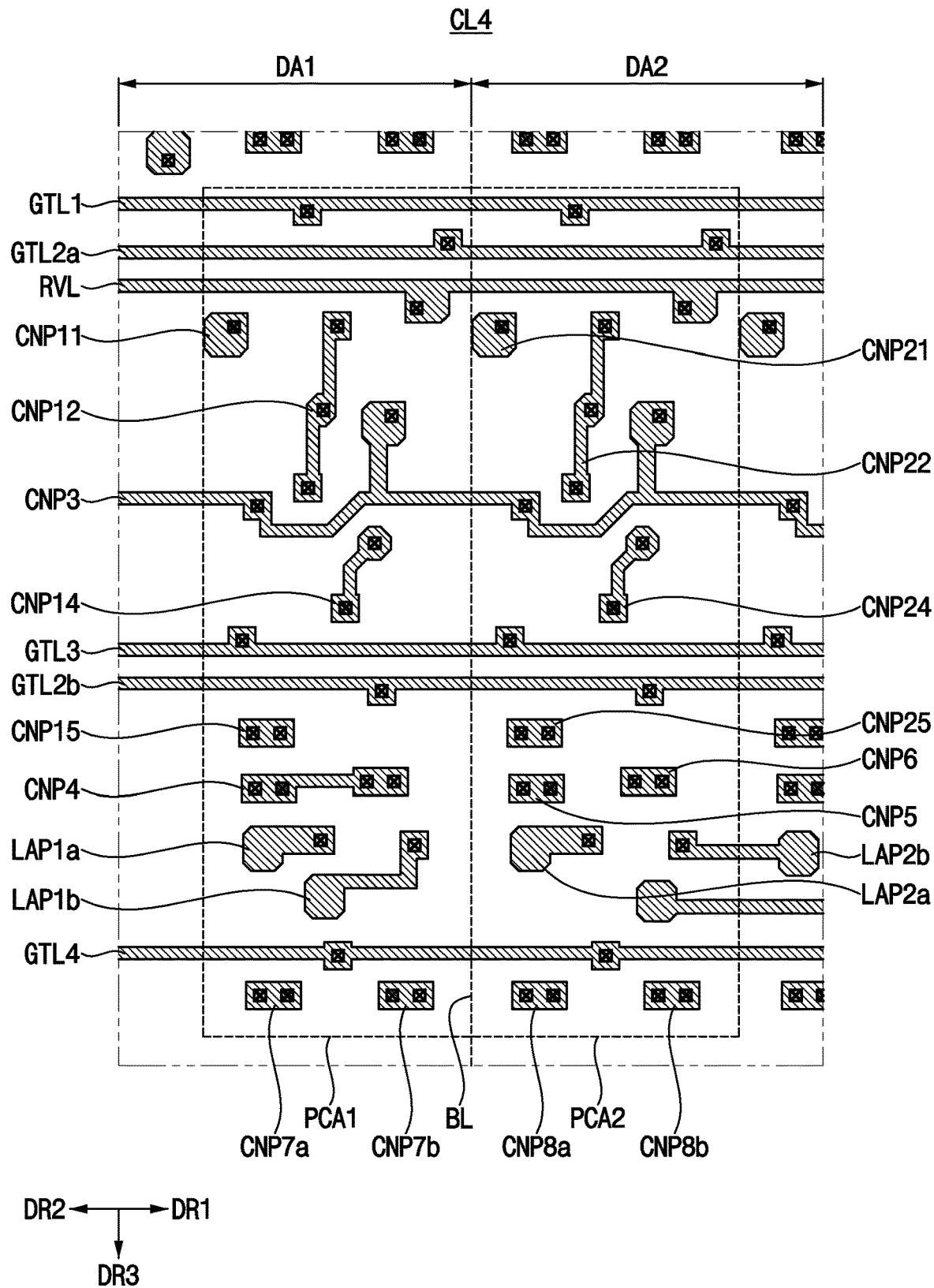
FIG. 16 is a layout view illustrating an embodiment of a sub-pixel disposed in a first display area and a sub-pixel disposed in a second display area of FIG. 4.
Figure 17:
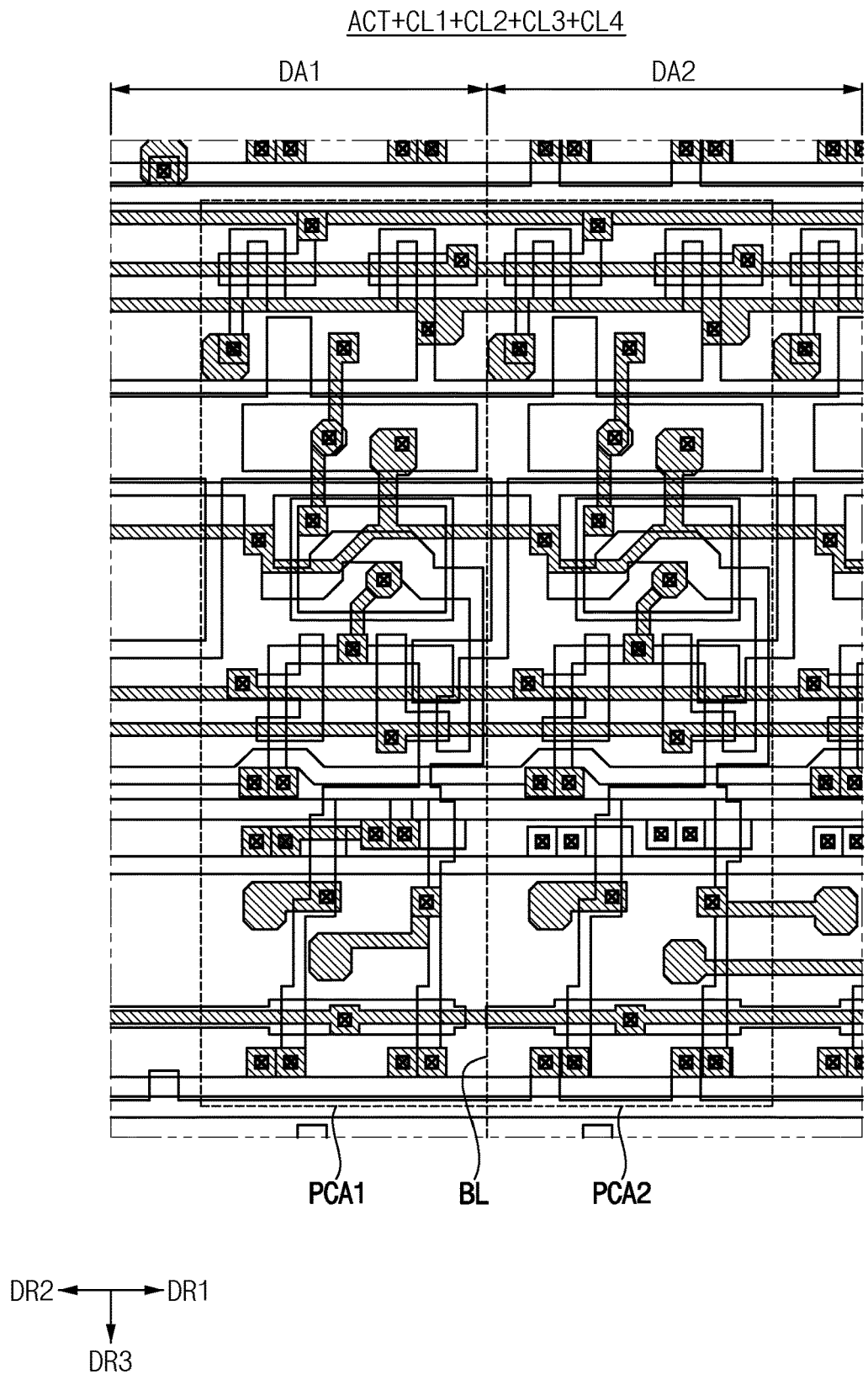
FIG. 17 is a layout view illustrating an embodiment of a sub-pixel disposed in a first display area and a sub-pixel disposed in a second display area of FIG. 4.

Referring further to FIGS. 16 and 17, the display panel 100 of the display device according to embodiments may further include a fourth conductive layer CL4 disposed on the third conductive layer CL3. Specifically, the fourth insulating layer IL4 may be disposed to cover the third conductive layer CL3, and the fourth conductive layer CL4 may be disposed on the fourth insulating layer IL4. For example, the fourth insulating layer IL4 may include an inorganic insulating material such as silicon oxide, silicon nitride, silicon oxynitride, and the like. These can be used alone or in combination with each other.

In an embodiment, the fourth conductive layer CL4 may include first-first, first-second, first-fourth, and first-fifth connection patterns CNP11, CNP12, CNP14, and CNP15, respectively, second-first, second-second, second-fourth, and second-fifth connection patterns CNP21, CNP22, CNP24, and CNP25, respectively, third, fourth, fifth, and sixth connection patterns CNP3, CNP4, CNP5, and CNP6, respectively, seventh-first and seventh-second connection patterns CNP7a and CNP7b, respectively, eighth-first and eighth-second connection patterns CNP8a and CNP8b, respectively, first-first and first-second lower anode connection patterns LAP1a and LAP1b, respectively, second-first and second-second lower anode connection patterns LAP2a and LAP2b, respectively, a reference voltage line RVL, a first gate transfer line GTL1, second-first and second-second gate transfer lines GTL2a and GTL2b, respectively, a third gate transfer line GTL3, and a fourth gate transfer line GTL4.

In an embodiment, the first-first, first-second, first-fourth, and first-fifth connection patterns CNP11, CNP12, CNP14, and CNP15, respectively, the second-first, second-second, second-fourth, and second-fifth connection patterns CNP21, CNP22, CNP24, and CNP25, respectively, the third, fourth, fifth, and sixth connection patterns CNP3, CNP4, CNP5, and CNP6, respectively, the seventh-first and seventh-second connection patterns CNP7a and CNP7b, respectively, the eighth-first and eighth-second connection patterns CNP8a and CNP8b, respectively, the first-first and first-second lower anode connection patterns LAP1a and LAP1b, respectively, the second-first and second-second lower anode connection patterns LAP2a and LAP2b, respectively, the reference voltage line RVL, the first gate transfer line GTL1, the second-first and second-second gate transfer lines GTL2a and GTL2b, respectively, the third gate transfer line GTL3, and the fourth gate transfer line GTL4 may be space apart from each other, disposed in the same layer, and include the same material.

In an embodiment, the first gate transfer line GTL1 may extend in the first direction DR1. The first gate signal GW may be applied to the first gate transfer line GTL1. In addition, the first gate transfer line GTL1 may contact the first-first gate pattern GP11 and the second-first gate pattern GP21 through contact holes. Accordingly, the first gate transfer line GTL1 may transfer the first gate signal GW to the first-first gate pattern GP11 and the second-second gate pattern GP21.

In an embodiment, the second-first gate transfer line GTL2a may extend in the first direction DR1. The second gate signal GC may be applied to the second-first gate transfer line GTL2a. In addition, the second-first gate transfer line GTL2a may contact the first-fourth gate pattern GP14 and the second-fourth gate pattern GP24 through contact holes. Accordingly, the second-first gate transfer line GTL2a may transfer the second gate signal GC to the first-fourth gate pattern GP14 and the second-fourth gate pattern GP24.

In an embodiment, the second-second gate transfer line GTL2b may extend in the first direction DR1. The second gate signal GC may be applied to the second-second gate transfer line GTL2b. In addition, the second-second gate transfer line GTL2b may contact the first-second gate pattern GP12 and the second-second gate pattern GP22 through contact holes. Accordingly, the second-first gate transfer line GTL2a may transfer the second gate signal GC to the first-second gate pattern GP12 and the second-second gate pattern GP22.

In an embodiment, the third gate transfer line GTL3 may extend in the first direction DR1. The third gate signal GI may be applied to the third gate transfer line GTL3. In addition, the third gate transfer line GTL3 may contact the first-third gate pattern GP13 and the second-third gate pattern GP23 through contact holes. Accordingly, the third gate transfer line GTL3 may transfer the third gate signal GI to the first-third gate pattern GP13 and the second-third gate pattern GP23.

In an embodiment, the fourth gate transfer line GTL4 may extend in the first direction DR1. The fourth gate signal GB may be applied to the fourth gate transfer line GTL4. In addition, the fourth gate transfer line GTL4 may contact the first-first gate line GL12 and the first-second gate line GL12 through contact holes. Accordingly, the fourth gate transfer line GTL4 may transfer the fourth gate signal GB to the first-first gate line GL11 and the first-second gate line GL12.

In an embodiment, the reference voltage line RVL may extend in the first direction DR1. The reference voltage VREF may be applied to the reference voltage line RVL. In addition, the reference voltage line RVL may contact the second active pattern ACT2 through contact holes. Accordingly, the reference voltage line RVL may transfer the reference voltage VREF to the second active pattern ACT2.

In an embodiment, the first-first connection pattern CNP11 may be disposed in the first pixel circuit area PCA1, and the second-first connection pattern CNP21 may be disposed in the second pixel circuit area PCA2. The first-first connection pattern CNP11 may contact a part of the second active pattern ACT2 through a contact hole, and the second-first connection pattern CNP21 may contact another part of the second active pattern ACT2 through a contact hole. The second-first connection pattern CNP21 may be substantially the same as or similar to the first-first connection pattern CNP11.

In an embodiment, the first-second connection pattern CNP12 may be disposed in the first pixel circuit area PCA1, and the second-second connection pattern CNP22 may be disposed in the second pixel circuit area PCA2. The first-second connection pattern CNP12 may connect the second active pattern ACT2, the first-second capacitor electrode CP12, and the first-third capacitor electrode CP13 through contact holes. The second-second connection pattern CNP22 may connect the second active pattern ACT2, the second-first capacitor electrode CP21, and the second-third capacitor electrode CP23 through contact holes. The second-second connection pattern CNP22 may be substantially the same as or similar to the first-second connection pattern CNP12.

In an embodiment, the third connection pattern CNP3 may extend in the first direction DR1. The third connection pattern CNP3 may connect the first active pattern ACT1 and the third capacitor electrode CP3 through contact holes.

In an embodiment, the first-fourth connection pattern CNP14 may be disposed in the first pixel circuit area PCA1, and the second-fourth connection pattern CNP24 may be disposed in the second pixel circuit area PCA2. The first-fourth connection pattern CNP14 may connect the first active pattern ACT1 and the first-first capacitor electrode CP11 through contact holes. The second-fourth connection pattern CNP24 may connect the first active pattern ACT1 and the second-first capacitor electrode CP21 through contact holes. The first-fourth connection pattern CNP14 may be substantially the same as or similar to the second-fourth connection pattern CNP24.

In an embodiment, the first-fifth connection pattern CNP15 may be disposed in the first pixel circuit area PCA1, and the second-fifth connection pattern CNP25 may be disposed in the second pixel circuit area PCA2. The first-fifth connection pattern CNP15 may connect the first active pattern ACT1 and the third initialization line VIL3. The second-fifth connection pattern CNP25 may connect the first active pattern ACT1 and the third initialization line VIL3. Accordingly, the first initialization voltage VINT applied to the third initialization line VIL3 may be transferred the first active pattern ACT1 through the first-fifth connection pattern CNP15 and the second-fifth connection pattern CNP25. The second-fifth connection pattern CNP25 may be substantially the same as or similar to the first-fifth connection pattern CNP15.

In an embodiment, the fourth connection pattern CNP4 may be disposed in the first pixel circuit area PCA1. The fourth connection pattern CNP4 may contact the first-fifth gate pattern GP15 and the first-sixth gate pattern GP16 through contact holes. In addition, in an embodiment, the fourth connection pattern CNP4 may connect the first portion ESL1a of the first light emitting control line ESL1 and the second light emitting control line ESL2 through contact holes. Accordingly, the first light emitting control signal EM1 applied to the second emission control line ESL2 may be transferred to the first part ELS1a of the first light emitting control line ESL1 through the fourth connection pattern CNP4. In addition, the first light emitting control signal EM1 applied to the second light emitting control line ESL2 may be transferred to the first-fifth gate pattern GP15 and the first-sixth gate pattern GP16 through the fourth connection pattern CNP4. When the first light emitting control signal EM1 has an activation level, the sixth transistor T6 and the eighth transistor T8 disposed in the first pixel circuit area PCA1 may be turned on.

In an embodiment, the fifth connection pattern CNP5 may be disposed in the second pixel circuit area PCA2. The fifth connection pattern CNP5 may connect the second-fifth gate pattern GP25 and the second light emitting control line ESL2 through contact holes. Accordingly, the first light emitting control signal EM1 applied to the second light emitting control line ESL2 may be transferred to the second-fifth gate pattern GP25 through the fifth connection pattern CNP5. When the first light emitting control signal EM1 has an activation level, the sixth transistor T6 disposed in the second pixel circuit area PCA2 may be turned on.

In an embodiment, the sixth connection pattern CNP6 may be disposed in the second pixel circuit area PCA2. The sixth connection pattern CNP6 may connect the second-sixth gate pattern GP26 and the second portion ESL1b of the first light emitting control line ESL1 through contact holes. Accordingly, the second light emitting control signal EM2 applied to the second portion ESL1b of the first light emitting control line ESL1 may be transferred to the second-sixth gate pattern GP26 through the sixth connection pattern CNP6. When the second light emitting control signal EM2 has an activation level, the eighth transistor T8 disposed in the second pixel circuit area PCA2 may be turned on.

In an embodiment, the seventh-first connection pattern CNP7a and the seventh-second connection pattern CNP7b may be disposed in the first pixel circuit area PCA1. The seventh-first connection pattern CNP7a may connect the first active pattern ACT1 and the first initialization line VIL1 through contact holes. The seventh-second connection pattern CNP7a may connect the first active pattern ACT1 and the first initialization line VIL1 through contact holes. Accordingly, the second initialization voltage VAINT applied to the first initialization line VIL1 may be transferred to the first active pattern ACT1 through the seventh-first connection pattern CNP7a and the seventh-second connection pattern CNP7b.

In an embodiment, the eighth-first connection pattern CNP8a and the eighth-second connection pattern CNP8b may be disposed in the second pixel circuit area PCA2. The eighth-first connection pattern CNP8a may connect the first active pattern ACT1 and the second initialization line VIL2 through contact holes. The eighth-second connection pattern CNP8b may connect the first active pattern ACT1 and the second initialization line VIL2 through contact holes. Accordingly, the second initialization voltage VAINT applied to the second initialization line VIL2 may be transferred to the first active pattern ACT1 through eighth-first connection pattern CNP8a and the eighth-second connection pattern CNP8b.

In an embodiment, the first-first lower anode connection pattern LAP1A and the first-second lower anode connection pattern LAP1B may be disposed in the first pixel circuit area PCA1. Each of the first-first lower anode connection pattern LAP1A and the first-second lower anode connection pattern LAP1B may contact the first active pattern ACT1 through a contact hole. Accordingly, the first-first lower anode connection pattern LAP1A may connect the first active pattern ACT1 and a first-first pixel electrode (e.g., the first-first pixel electrode AE1a in FIG. 20), and the first-second lower anode connection pattern LAP1B may connect the first active pattern ACT1 and the first-second pixel electrode (e.g., the first-second pixel electrode AE1b of FIG. 20).

In an embodiment, the second-first lower anode connection pattern LAP2A and the second-second lower anode connection pattern LAP2B may be disposed in the second pixel circuit area PCA2. Each of the second-first lower anode connection pattern LAP2A and the second-second lower anode connection pattern LAP2B may contact the first active pattern ACT1 through a contact hole. Accordingly, the second-first lower anode connection pattern LAP2A may connect the first active pattern ACT1 and a second-first pixel electrode (e.g., the second-first pixel electrode AE2a in FIG. 20), and the second-second lower anode connection pattern LAP2B may connect the first active pattern ACT1 and a second-second pixel electrode (e.g., the second-second pixel electrode AE2b in FIG. 20).

In an embodiment, each of the first-first lower anode connection pattern LAP1A, the first-second lower anode connection pattern LAP1B, the second-first lower anode connection pattern LAP2A, and the second-second lower anode connection pattern LAP2B may be referred to as an anode connection pattern.

For example, in an embodiment, the fourth conductive layer CL4 may include metal, alloy, metal nitride, conductive metal oxide, transparent conductive material, and the like. These can be used alone or in combination with each other.

Figure 18:
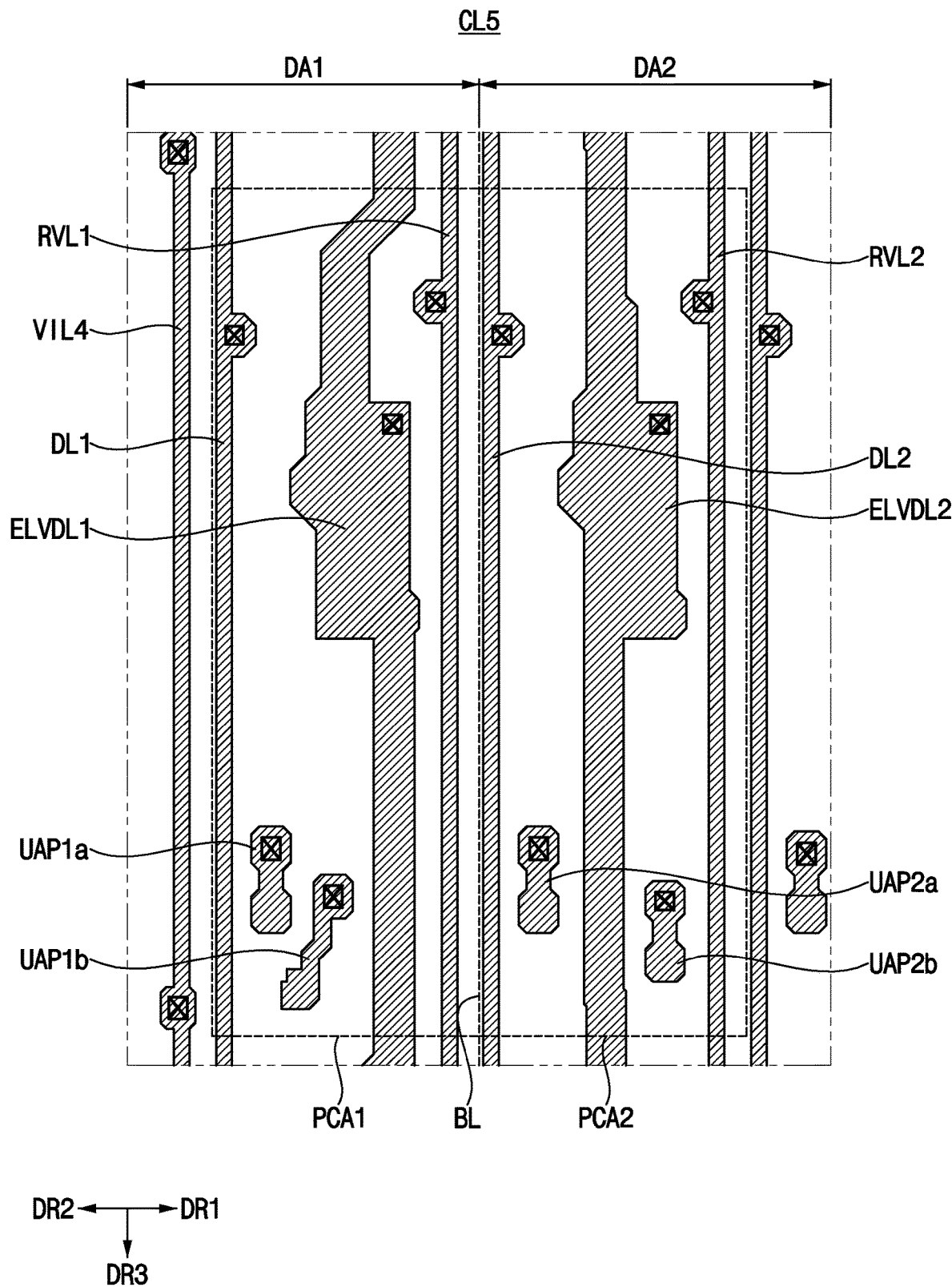
FIG. 18 is a layout view illustrating an embodiment of a sub-pixel disposed in a first display area and a sub-pixel disposed in a second display area of FIG. 4.
Figure 19:
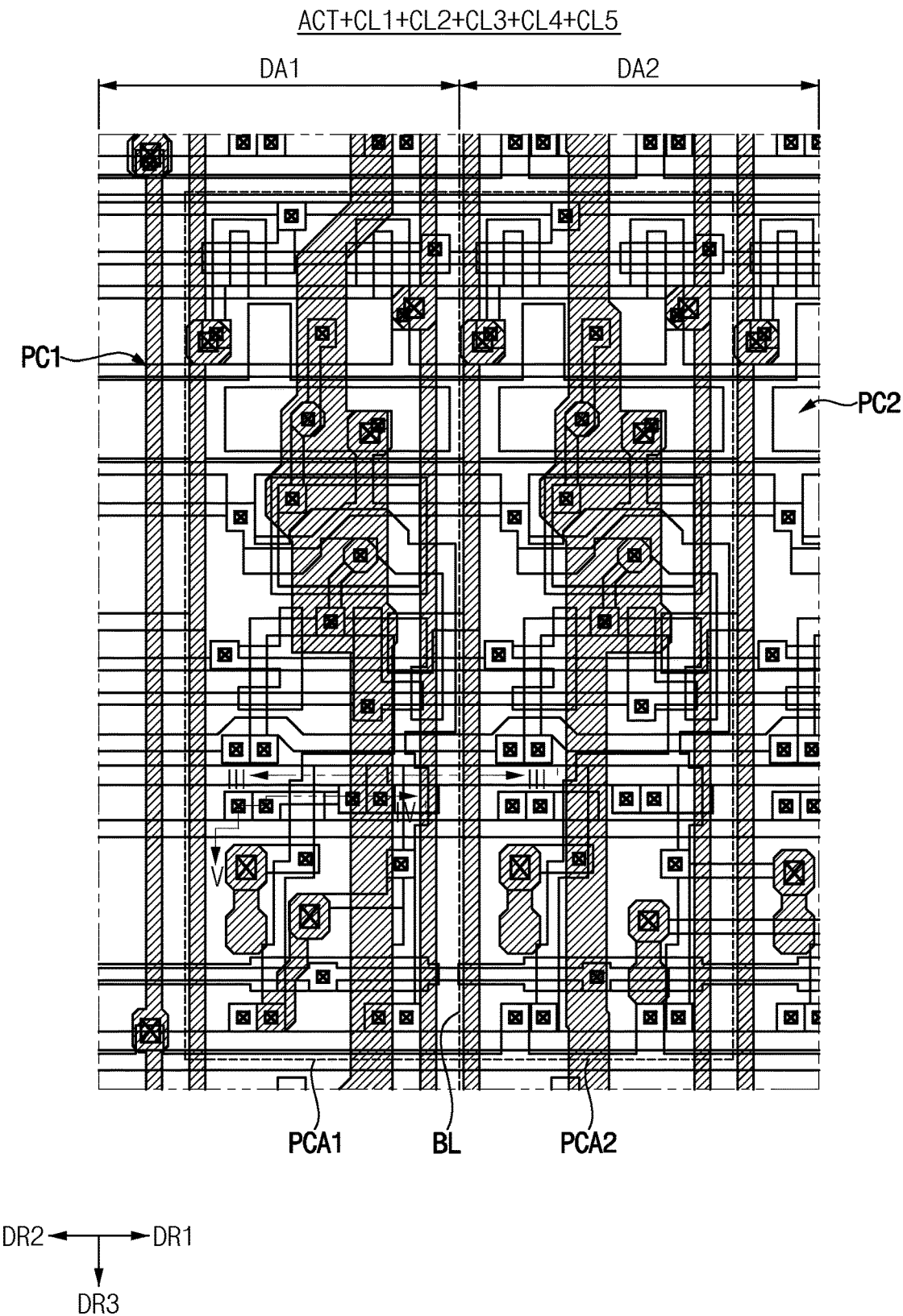
FIG. 19 is a layout view illustrating an embodiment of a sub-pixel disposed in a first display area and a sub-pixel disposed in a second display area of FIG. 4.

Referring further to FIGS. 18 and 19, the display panel 100 of the display device according to embodiments may further include a fifth conductive layer CL5 disposed on the fourth conductive layer CL4. Specifically, the fifth insulating layer IL5 may be disposed to cover the fourth conductive layer CL4, and the fifth conductive layer CL5 may be disposed on the fifth insulating layer IL5. For example, the fifth insulating layer IL5 may include an organic insulating material such as photoresist, polyacrylic resin, polyimide resin, polyamide resin, siloxane resin, acrylic resin, epoxy resin, and the like. These can be used alone or in combination with each other.

In an embodiment, the fifth conductive layer CL5 may include first and second data lines DL1 and DL2, respectively, first and second reference voltage lines RVL1 and RVL2, respectively, first and second driving voltage lines ELVDL1 and ELVDL2, respectively, a fourth initialization voltage line VIL4, first-first and first-second upper anode connection patterns UAP1a and UAP1b, respectively, and second-first and second-second upper anode connection patterns UAP2a and UAP2b, respectively.

In an embodiment, the first and second data lines DL1 and DL2, respectively, the first and second reference voltage lines RVL1 and RVL2, respectively, the first and second driving voltage lines ELVDL1 and ELVDL2, respectively, the fourth initialization voltage line VIL4, the first-first and first-second upper anode connection patterns UAP1a and UAP1b, respectively, and the second-first and second-second upper anode connection patterns UAP2a and UAP2b, respectively, may be space apart from each other. In addition, the first and second data lines DL1 and DL2, respectively, the first and second reference voltage lines RVL1 and RVL2, respectively, the first and second driving voltage lines ELVDL1 and ELVDL2, respectively, the fourth initialization voltage line VIL4, the first-first and first-second upper anode connection patterns UAP1a and UAP1b, respectively, and the second-first and second-second upper anode connection patterns UAP2a and UAP2b, respectively, may be disposed in the same layer and include the same material.

In an embodiment, the first driving voltage line ELVDL1 may be disposed in the first pixel circuit area PCA1, and the second driving voltage line ELVDL2 may be disposed in the second pixel circuit area PCA2. Each of the first and second driving voltage lines ELVDL1 and ELVDL2, respectively, may extend in the third direction DR3. Each of the first and second driving voltage lines ELVDL1 and ELVDL2, respectively, may contact the third connection pattern CNP3 through a contact hole. The driving voltage ELVDD may be applied to each of the first and second driving voltage lines ELVDL1 and ELVDL2, respectively. Accordingly, each of the first and second driving voltage lines ELVDL1 and ELVDL2, respectively, may transfer the driving voltage ELVDD to the first active pattern ACT1 through the third connection pattern CNP3.

In an embodiment, the first data line DL1 may be disposed in the first pixel circuit area PCA1, and the second data line DL2 may be disposed in the second pixel circuit area PCA2. Each of the first and second data lines DL1 and DL2, respectively, may extend in the third direction DR3. The first data line DL1 may contact the first-first connection pattern CNP11 through a contact hole, and the second data line DL2 may contact the first-second connection pattern CNP12 through a contact hole. The data voltage VDATA may be applied to the first and second data lines DL1 and DL2, respectively. Accordingly, each of the first and second data lines DL1 and DL2, respectively, may transfer the data voltage VDATA to the second active pattern ACT2 through the first-first and first-second connection patterns CNP11 and CNP12, respectively.

In an embodiment, the first reference voltage line RVL1 may be disposed in the first pixel circuit area PCA1, and the second reference voltage line RVL2 may be disposed in the second pixel circuit area PCA2. Each of the first and second reference voltage lines RVL1 and RVL2, respectively, may extend in the third direction DR3. Each of the first and second reference voltage lines RVL1 and RVL2, respectively, may contact the reference voltage line RVL through a contact hole. The reference voltage VREF may be applied to the first and second reference voltage lines RVL1 and RVL2, respectively. Accordingly, the first and second reference voltage lines RVL1 and RVL2, respectively, may transfer the reference voltage VREF to the second active pattern ACT2 through the reference voltage line RVL.

In an embodiment, the fourth initialization voltage line VIL4 may extend in the third direction DR3. The fourth initialization voltage line VIL4 may be connected to the second initialization voltage line VIL2 through a connection pattern included in the fourth conductive layer CL4. The second initialization voltage VAINT may be applied to the fourth initialization voltage line VIL4. Accordingly, the fourth initialization voltage line VIL4 may transfer the second initialization voltage VAINT to the first active pattern ACT1 through the second initialization voltage line VIL2.

In an embodiment, the first-first upper anode connection pattern UAP1a and the first-second upper anode connection pattern UAP1b may be disposed in the first pixel circuit area PCA1, first-first upper anode connection pattern UAP1a may contact the first-first lower anode connection pattern LAP1a through a contact hole, and the first-second upper anode connection pattern UAP1b may contact the first-second lower anode connection pattern LAP1b through a contact hole. Accordingly, the first-first upper anode connection pattern UAP1a may connect the first active pattern ACT1 and the first-first pixel electrode, and the first-second upper anode connection pattern UAP1b may connect the first active pattern ACT1 and the first-second pixel electrode.

In an embodiment, the second-first upper anode connection pattern UAP2a and the second-second upper anode connection pattern UAP2b may be disposed in the first pixel circuit area PCA1. The second-first upper anode connection pattern UAP2a may contact the second-first lower anode connection pattern LAP2a through the contact hole, and the second-second upper anode connection pattern UAP2b may contact the second-second lower anode connection pattern LAP2b through a contact hole. Accordingly, the second-first upper anode connection pattern UAP2a may connect the first active pattern ACT1 and the second-first pixel electrode, and the second-second upper anode connection pattern UAP2b may connect the first active pattern ACT1 and the second-second pixel electrode.

As described above, in an embodiment, the first pixel circuit PC1 may be disposed in the first pixel circuit area PCA1 and the second pixel circuit PC2 may be disposed in the second pixel circuit area PCA2. The first pixel circuit PC1 may include the first, second, third, fourth, fifth, sixth, seventh, eighth, and ninth transistors T1, T2, T3, T4, T5, T6, T7, T8, and T9, respectively, the first-first capacitor C11, and the second-first capacitor C21, and the second pixel circuit PC2 may include the first, second, third, fourth, fifth, sixth, seventh, eighth, and ninth transistors T1, T2, T3, T4, T5, T6, T7, T8, and T9, respectively, the first-second capacitor C12, and the second-second capacitor C212.

For example, in an embodiment, the fifth conductive layer CL5 may include metal, alloy, metal nitride, conductive metal oxide, transparent conductive material, and the like. These can be used alone or in combination with each other.

Figure 20:
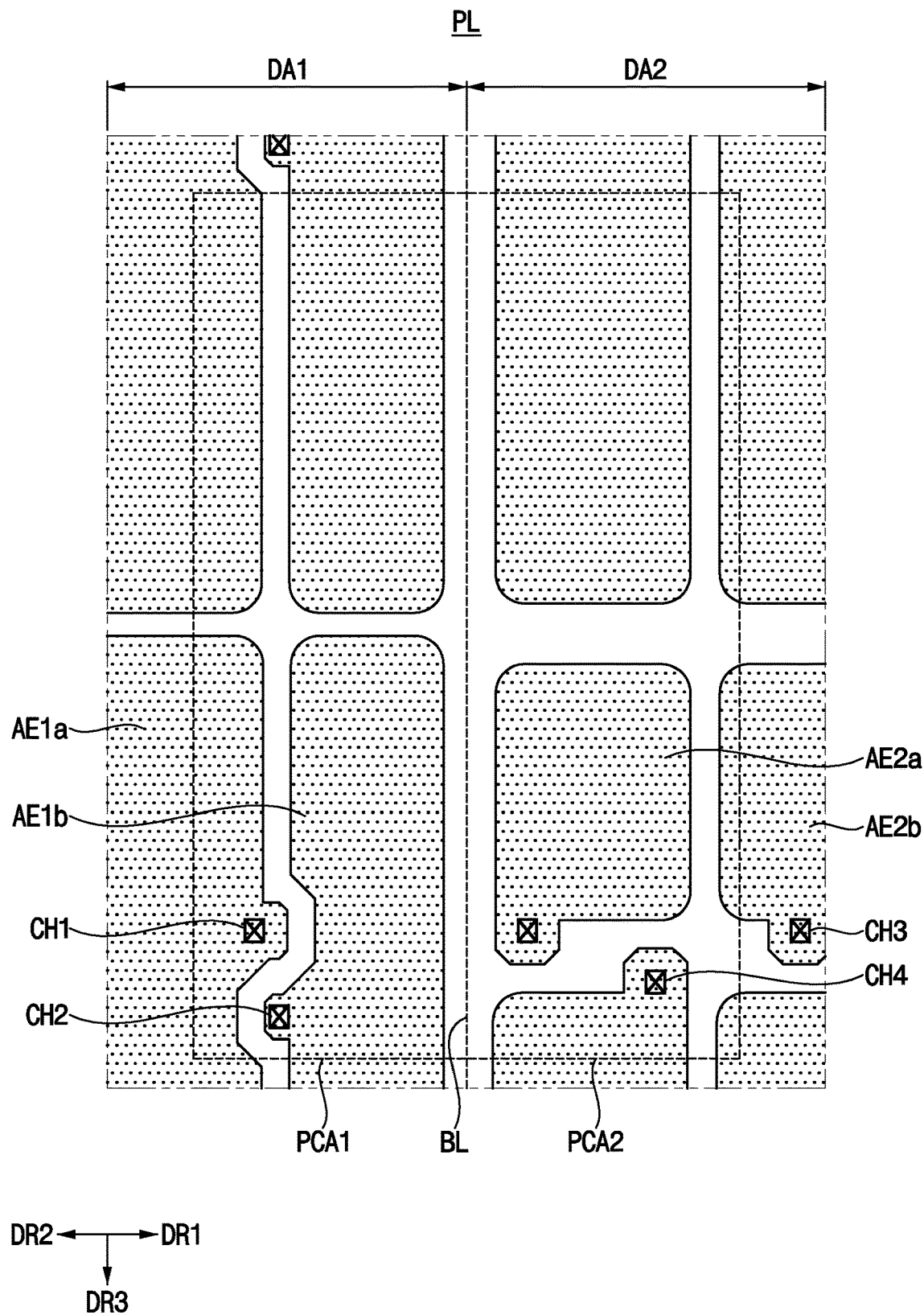
FIG. 20 is a layout view illustrating an embodiment of a sub-pixel disposed in a first display area and a sub-pixel disposed in a second display area of FIG. 4.
Figure 21:
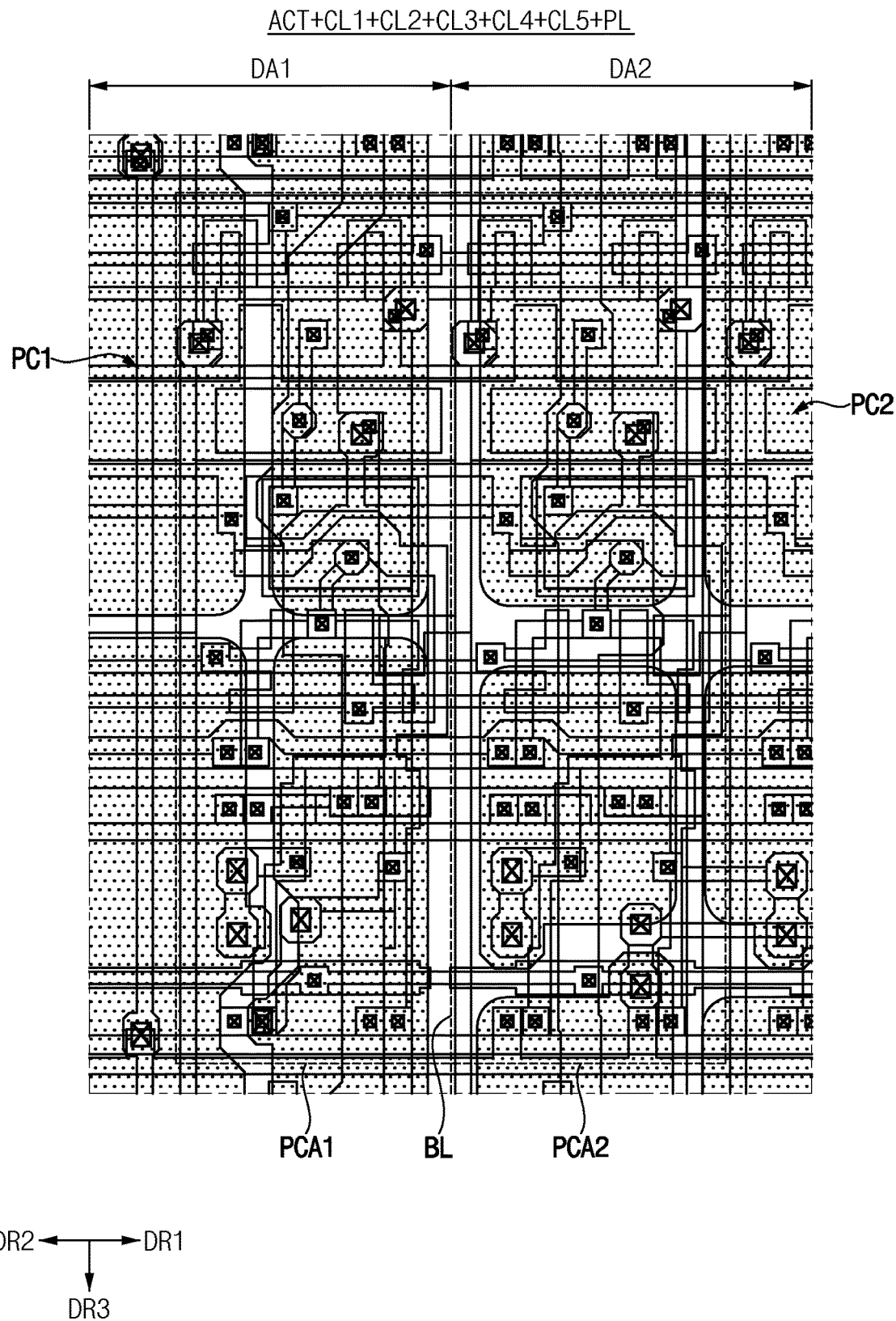
FIG. 21 is a layout view illustrating an embodiment of a sub-pixel disposed in a first display area and a sub-pixel disposed in a second display area of FIG. 4.

Referring further to FIGS. 20 and 21, the display panel 100 of the display device according to embodiments may further include a pixel electrode layer PL disposed on the fifth conductive layer CL5. Specifically, a sixth insulating layer IL6 covering the fifth conductive layer CL5 may be disposed, and the pixel electrode layer PL may be disposed on the sixth insulating layer IL6. For example, the sixth insulating layer IL6 may include an organic insulating material such as photoresist, polyacrylic resin, polyimide resin, polyamide resin, siloxane resin, acrylic resin, epoxy resin, and the like. These can be used alone or in combination with each other. The first, second, third, fourth, fifth, and sixth insulating layers IL1, IL2, IL3, IL4, IL5, and IL6, respectively, may form the insulating structure IL.

In an embodiment, the pixel electrode layer PL may include first-first and first-second pixel electrodes AE1a and AE1b, respectively, and second-first and second-second pixel electrodes AE2a and AE2b, respectively.

In an embodiment, the first-first and first-second pixel electrodes AE1a and AE1b, respectively, and the second-first and second-second pixel electrodes AE2a and AE2b, respectively, may be spaced apart from each other. In addition, the first-first and first-second pixel electrodes AE1a and AE1b, respectively, and the second-first and second-second pixel electrodes AE2a and AE2b, respectively, may be disposed in the same layer and may include the same material.

In an embodiment, the first-first pixel electrode AE1a and the first-second pixel electrode AE1b may be disposed to at least partially overlap the first pixel circuit area PCA1. The first-first pixel electrode AE1a and the first-second pixel electrode AE1b may be physically separated from each other. The first-first pixel electrode AE1a may be a first electrode (e.g., anode electrode) of the first-first light emitting element LED1a, and the first-second pixel electrode AE1b may be a first electrode (e.g., anode electrode) of the first-second light emitting element LED1b.

In an embodiment, the first-first pixel electrode AE1a may contact the first-first upper anode connection pattern UAP1a through a first contact hole CH1, and the first-second pixel electrode AE1b may contact the first-second upper anode connection pattern UAP1b through a second contact hole CH2. Accordingly, the first-first pixel electrode AE1a may be electrically connected the sixth transistor T6 and the seventh transistor T7 through the first-first lower anode connection pattern LAP11 and the first-first upper anode connection pattern UAP11, and the first-second pixel electrode AE1b may be electrically connected to the eighth transistor T8 and the ninth transistor T9 through the first-second lower anode connection pattern LAP12 and the first-second upper anode connection pattern UAP12.

In an embodiment, the second-first pixel electrode AE2a and the second-second pixel electrode AE2b may be disposed to at least partially overlap the second pixel circuit area PCA2. The second-first pixel electrode AE2a and the second-second pixel electrode AE2b may be physically separated from each other. The second-first pixel electrode AE2a may be a first electrode (e.g., anode electrode) of the second-first light emitting element LED2a, and the second-second pixel electrode AE2b may be a first electrode (e.g., anode electrode) of the second-second light emitting element LED2b.

In an embodiment, the second-first pixel electrode AE2a may contact the second-first upper anode connection pattern UAP2a through a third contact hole CH3, and the second-second pixel electrode AE2b may contact the second-second upper anode connection pattern UAP2b through a fourth contact hole CH4. Accordingly, the second-first pixel electrode AE2a may be electrically connected the sixth transistor T6 and the seventh transistor T7 through the second-first lower anode connection pattern LAP21 and the second-first upper anode connection pattern UAP21, and the second-second pixel electrode AE2b may be electrically connected to the eighth transistor T8 and the ninth transistor T9 through the second-second lower anode connection pattern LAP22 and the second-second upper anode connection pattern UAP22.

For example, in an embodiment, the pixel electrode layer PL may include metal, alloy, metal nitride, conductive metal oxide, transparent conductive material, and the like. These can be used alone or in combination with each other.

In an embodiment, a first light emitting layer may be disposed on the first-first pixel electrode AE1a, a second light emitting layer may be disposed on the first-second pixel electrode AE1b, a third light emitting layer may be disposed on the second-first pixel electrode AE2a, and a fourth light emitting layer may be disposed on the second-second pixel electrode AE2b. The first and second light emitting layers may generate light of the same color, and the third and fourth light emitting layers may generate light of the same color.

In an embodiment, a common electrode (e.g., the common electrode CE in FIGS. 5 and 6) may be disposed on the first, second, third, and fourth light emitting layers. The common electrode may be entirely disposed in the first and second pixel circuit areas PCA1 and PCA2, respectively. The common electrode may be a second electrode (e.g., cathode electrode) of each of the first-first and first-second light emitting elements LED1a and LED1b, respectively, and the second-first and second-second light emitting elements LED2a and LED2b, respectively, may be a second electrode (e.g., cathode electrode).

That is, in an embodiment, the first-first pixel electrode AE1a, the first light emitting layer, and the common electrode may constitute the first-first light-emitting element LED1a, and the first-second pixel electrode AE1b, the second light-emitting layer, and the common electrode may constitute the first-second light emitting element LED1b. In addition, the second-first pixel electrode AE2a, the third light emitting layer, and the common electrode may constitute the second-first light emitting element LED2a, and the second-second pixel electrode AE2b, the fourth light-emitting layer, and the common electrode may constitute the second-second light emitting element LED2b.

Accordingly, in an embodiment, the first pixel circuit PC1, the first-first light emitting element LED1a, and the first-second light emitting element LED1b may constitute the first sub-pixel SPX1, the second pixel circuit PC2, the second-first light emitting element LED2a, and the second-second light emitting element LED2b may constitute the second sub-pixel SPX2.

For example, as described above, in an embodiment, the first light emitting control line ESL1 may be included in the second conductive layer CL2, and the second light emitting control line ESL2 may be included in the third conductive layer CL3. In this case, a separation space SS defined between the first portion ESL1a and the second portion ESL1b of the first light emitting control line ESL1 may overlap at least one of the fourth conductive layer CL4, the fifth conductive layer CL5, and the pixel electrode layer PL. For example, the separation space SS may overlap the first driving voltage line ELVDL1 and the first-second pixel electrode LAP1B in the plan view.

Alternatively, in an embodiment, the first light emitting control line ESL1 may be included in the second conductive layer CL2 and the second light emitting control line ESL2 may be included in the fourth conductive layer CL4. In this case, the separation space SS defined between the first portion ESL1a and the second portion ESL1b of the first light emitting control line ESL1 may overlap at least one of the fifth conductive layer CL5 and the pixel electrode layer PL in the plan view.

Alternatively, in an embodiment, the first light emitting control line ESL1 may be included in the second conductive layer CL2, and the second light emitting control line ESL2 may be included in the fifth conductive layer CL5. In this case, the separation space SS defined between the first portion ESL1a and the second portion ESL1b of the first light emitting control line ESL1 may overlap the pixel electrode layer PL in the plan view.

Alternatively, in an embodiment, the first light emitting control line ESL1 may be included in the third conductive layer CL3, and the second light emitting control line ESL2 may be included in the second conductive layer CL2. In this case, the separation space SS defined between the first portion ESL1a and the second portion ESL1b of the first light emitting control wire ESL1 may overlap at least one of the fourth conductive layer CL4, the fifth conductive layer CL5, and the pixel electrode layer PL in the plan view.

Alternatively, in an embodiment, the first light emitting control line ESL1 may be included in the third conductive layer CL3, and the second light emitting control line ESL2 may be included in the fourth conductive layer CL4. In this case, the separation space SS defined between the first portion ESL1a and the second portion ESL1b of the first light emitting control line ESL1 may overlap at least one of the fifth conductive layer CL5, and the pixel electrode layer PL in the plan view.

Alternatively, in an embodiment, the first light emitting control line ESL1 may be included in the third conductive layer CL3 and the second light emitting control line ESL2 may be included in the fifth conductive layer CL5. In this case, the separation space SS defined between the first portion ESL1a and the second portion ESL1b of the first light emitting control line ESL1 may overlap the pixel electrode layer PL in the plan view.

Alternatively, in an embodiment, the first light emitting control line ESL1 may be included in the fourth conductive layer CL4 and the second light emitting control line ESL2 may be included in the second conductive layer CL2. In this case, the separation space SS defined between the first portion ESL1a and the second portion ESL1b of the first light emitting control line ESL1 may overlap at least one of the fifth conductive layer CL5, and the pixel electrode layer PL in the plan view.

Alternatively, in an embodiment, the first light emitting control line ESL1 may be included in the fourth conductive layer CL4 and the second light emitting control line ESL2 may be included in the third conductive layer CL3. In this case, the separation space SS defined between the first portion ESL1a and the second portion ESL1b of the first light emitting control line ESL1 may overlap the pixel electrode layer PL in the plan view.

Alternatively, in an embodiment, the first light emitting control line ESL1 may be included in the fourth conductive layer CL4 and the second light emitting control line ESL2 may be included in the fifth conductive layer CL5. In this case, the separation space SS defined between the first portion ESL1a and the second portion ESL1b of the first light emitting control line ESL1 may overlap the pixel electrode layer PL in the plan view.

Alternatively, in an embodiment, the first light emitting control line ESL1 may be included in the fifth conductive layer CL5 and the second light emitting control line ESL2 may be included in the second conductive layer CL2. In this case, the separation space SS defined between the first portion ESL1a and the second portion ESL1b of the first light emitting control line ESL1 may overlap the pixel electrode layer PL in the plan view.

Alternatively, in an embodiment, the first light emitting control line ESL1 may be included in the fifth conductive layer CL5 and the second light emitting control line ESL2 may be included in the third conductive layer CL3. In this case, the separation space SS defined between the first portion ESL1a and the second portion ESL1b of the first light emitting control line ESL1 may overlap the pixel electrode layer PL in the plan view.

Alternatively, in an embodiment, the first light emitting control line ESL1 may be included in the fifth conductive layer CL5, and the second light emitting control line ESL2 may be included in the fourth conductive layer CL4. In this case, the separation space SS defined between the first portion ESL1a and the second portion ESL1b of the first light emitting control line ESL1 may overlap the pixel electrode layer PL in the plan view.

As a result, in an embodiment, as the separation space SS defined between the first portion ESL1a and the second portion ESL1b of the first light emitting control line ESL overlaps the conductive layer and/or the pixel electrode layer disposed on top in the plan view, the separation space SS cannot be visible.

Figure 24:
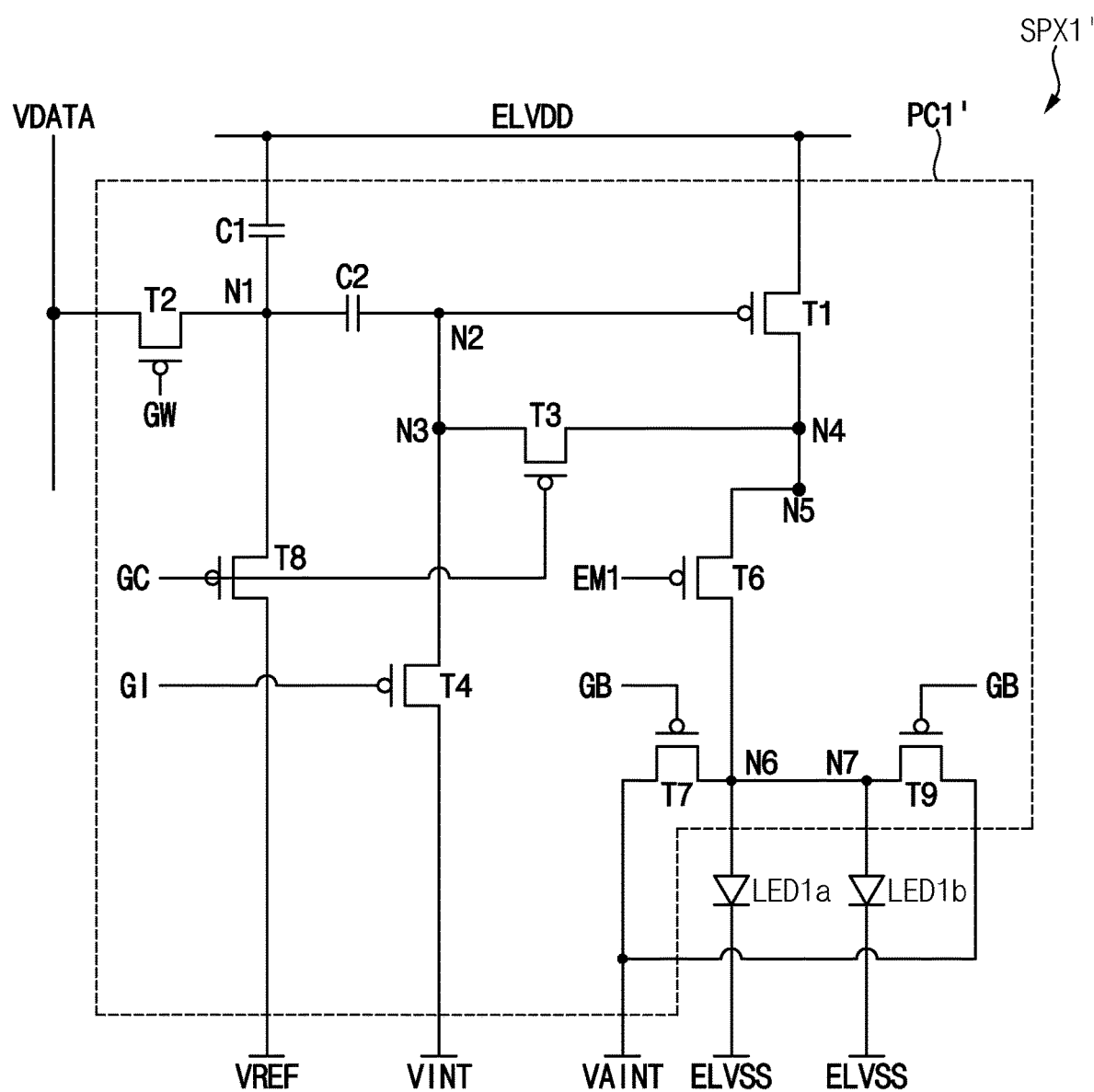
FIG. 24 is a circuit diagram illustrating another embodiment of the first sub-pixel included in the display device of FIG. 1.
Figure 25:
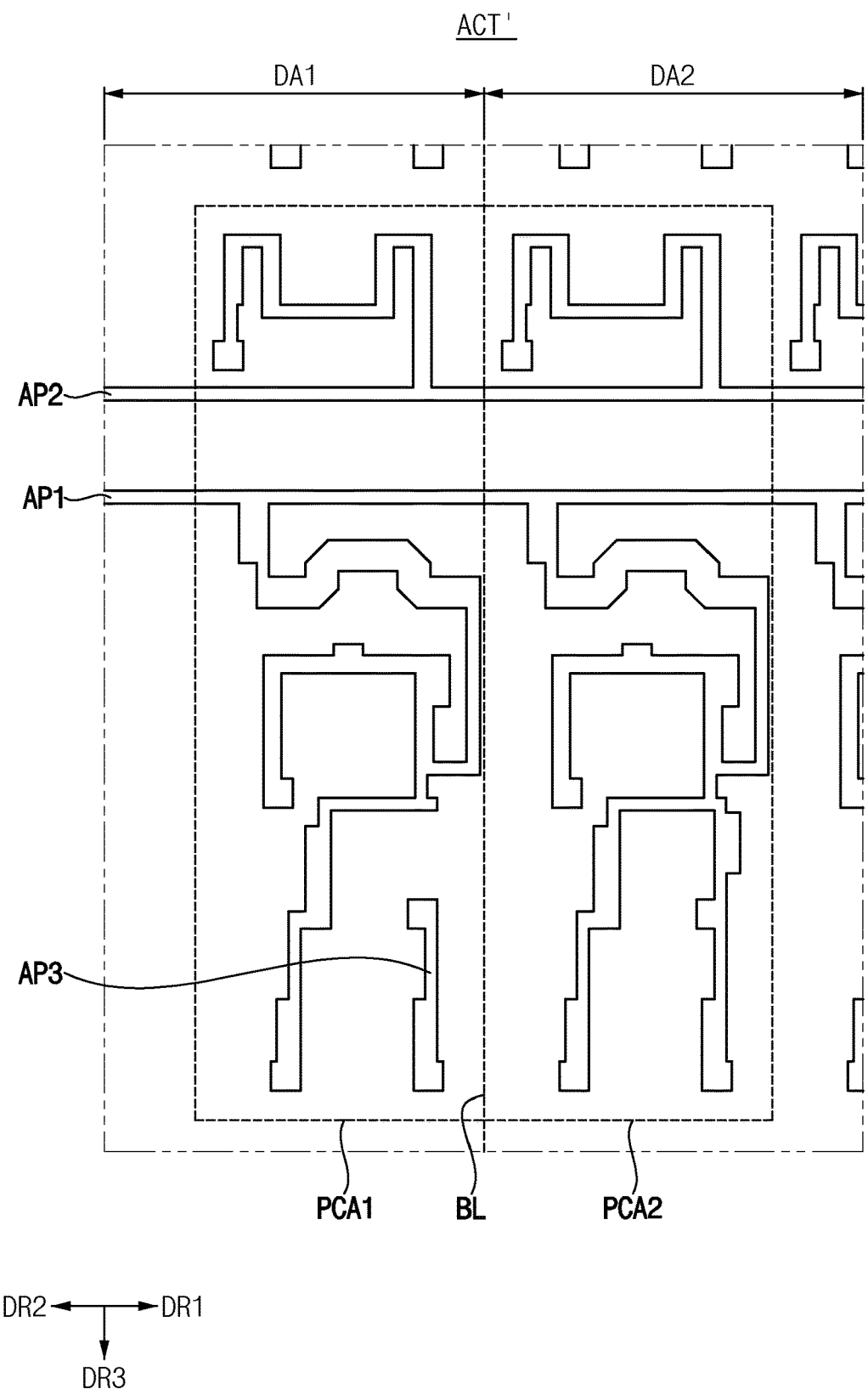
FIG. 25 is a layout view illustrating another embodiment of a sub-pixel disposed in the first display area and a sub-pixel disposed in the second display area of FIG. 4.

FIG. 24 is a circuit diagram illustrating another embodiment of the first sub-pixel included in the display device of FIG. 1.

Hereinafter, descriptions that overlap with the first sub-pixel SPX1 described with reference to FIG. 2 will be omitted or simplified.

In an embodiment and referring to FIGS. 1 and 24, a first sub-pixel SPX1' included in the display panel 100 may include a first pixel circuit PC1', the first-first light emitting element LED1a, and the first-second light emitting element LED1b. The first pixel circuit PC1' may provide a driving current to the first-first light emitting element LED1a and the first-second light emitting element LED1b. The first-first light emitting element LED1a and the first-second light emitting element LED1b may emit light of the same color based on the driving current.

In an embodiment, the first pixel circuit PC1' may include the first, second, third, fourth, fifth, sixth, and seventh transistors T1, T2, T3, T4, T5, T6, and T7, respectively, the ninth transistor T9, the first capacitor C1, and the second capacitor C2.

In an embodiment, the first pixel circuit PC1' shown in FIG. 24 might not include the eighth transistor T8 of FIG. 2. That is, the first pixel circuit PC1' may include only one transistor (i.e., the sixth transistor T6) including a gate electrode to which the first light emitting control signal EM1 is applied.

In an embodiment, the first, second, third, fourth, fifth, sixth, and seventh transistors T1, T2, T3, T4, T5, T6, and T7, respectively, the ninth transistor T9, the first capacitor C1, the second capacitor C2, the first-first light emitting element LED1a, and the first-second light emitting element LED1b may be substantially the same as the first, second, third, fourth, fifth, sixth, and seventh transistors T1, T2, T3, T4, T5, T6, and T7, respectively, the ninth transistor T9, the first capacitor C1, the second capacitor C2, the first-first light emitting element LED1a, and the first-second light emitting element LED1b of FIG. 2, respectively.

FIGS. 25, 26, 27, 28, 29, 30, and 31 are layout views illustrating another embodiment of a sub-pixel disposed in the first display area and a sub-pixel disposed in the second display area of FIG. 4. FIG. 32 is a cross-sectional view taken along line V-V' of FIG. 31, according to an embodiment.

Hereinafter, descriptions that overlap with the components described with reference to FIGS. 9, 10, 11, 12, 13, 14, 15, 16, 17, 18, 19, 20, 21, 22, and 23 will be omitted or simplified.

Referring to FIGS. 1, 3, 24, 25, and 32, the display panel 100 of a display device according to embodiments may include an active layer ACT' disposed on the substrate SUB.

In an embodiment, the substrate SUB may include the first pixel circuit area PCA1 positioned in the first display area DA1 and the second pixel circuit area PCA2 positioned in the second display area DA2. The first pixel circuit PC1' of the first sub-pixel SPX1' of FIG. 24 may be disposed in the first pixel circuit area PCA1, and the second pixel circuit PC2 of the second sub-pixel SPX2 of FIG. 3 may be disposed in the second pixel circuit area PCA2. For example, one of the first-first, first-second, and first-third pixel circuits PC11, PC12, and PC13, respectively, of FIG. 4 may be disposed in the first pixel circuit area PCA1, and one of the second-first, second-second, and second-third pixel circuits PC21, PC22, and PC23, respectively, of FIG. 4 may be disposed in the second pixel circuit area PCA2.

In an embodiment, the active layer ACT' may include a first active pattern ACT1, a second active pattern ACT2, and a third active pattern AP3. The first active pattern ACT1, the second active pattern ACT2, and the third active pattern AP3 may be spaced apart from each other. In addition, the first active pattern ACT1, the second active pattern ACT2, and the third active pattern AP3 may be disposed in the same layer and may include the same material.

In an embodiment, the third active pattern AP3 may be disposed in the first pixel circuit area PCA1 and might not disposed in the second pixel circuit area PCA2.

Figure 26:
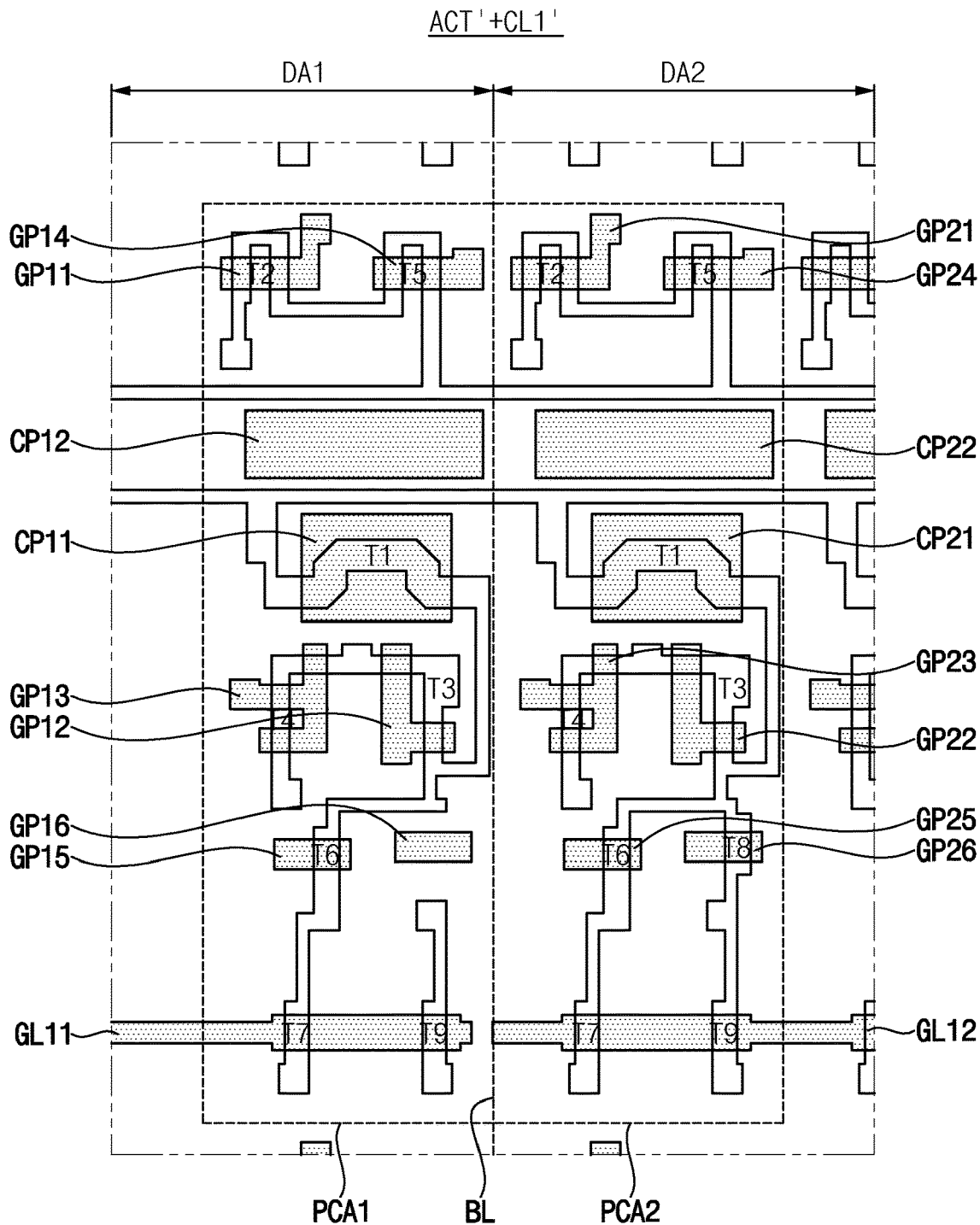
FIG. 26 is a layout view illustrating another embodiment of a sub-pixel disposed in the first display area and a sub-pixel disposed in the second display area of FIG. 4.

Referring further to FIG. 26, the display panel 100 of the display device according to embodiments may further include a first conductive layer CL1' disposed on the active layer ACT'. Specifically, the first insulating layer IL1 covering the active layer ACT' may be disposed on the active layer ACT', and the first conductive layer CL1' may be disposed on the first insulating layer IL1.

In an embodiment, the first conductive layer CL1' may include first-first, first-second, first-third, first-fourth, first-fifth, and first-sixth gate patterns GP11, GP12, GP13, GP14, GP15, and GP16, respectively, second-first, second-second, second-third, second-fourth, second-fifth, and second-sixth gate patterns GP21, GP22, GP23, GP24, GP25, and GP26, respectively, first-first and first-second capacitor electrodes CP11 and CP12, respectively, second-first and second-second capacitor electrodes CP21 and CP22, respectively, a first-first gate line GL11, and a first-second gate line GL12.

In an embodiment, the first conductive layer CL1' may be substantially the same as the first conductive layer CL1 of FIGS. 10 and 11.

In an embodiment, the first-sixth gate pattern GP16 might not overlap the active layer ACT' in the plan view. That is, the first-sixth gate pattern GP16 may not constitute the eighth transistor T8.

In an embodiment, a part of the third active pattern AP3 and a part of the first-first gate line GL11 overlapping the part of the third active pattern AP3 (i.e., gate electrode) may constitute the ninth transistor T9.

Figure 27:
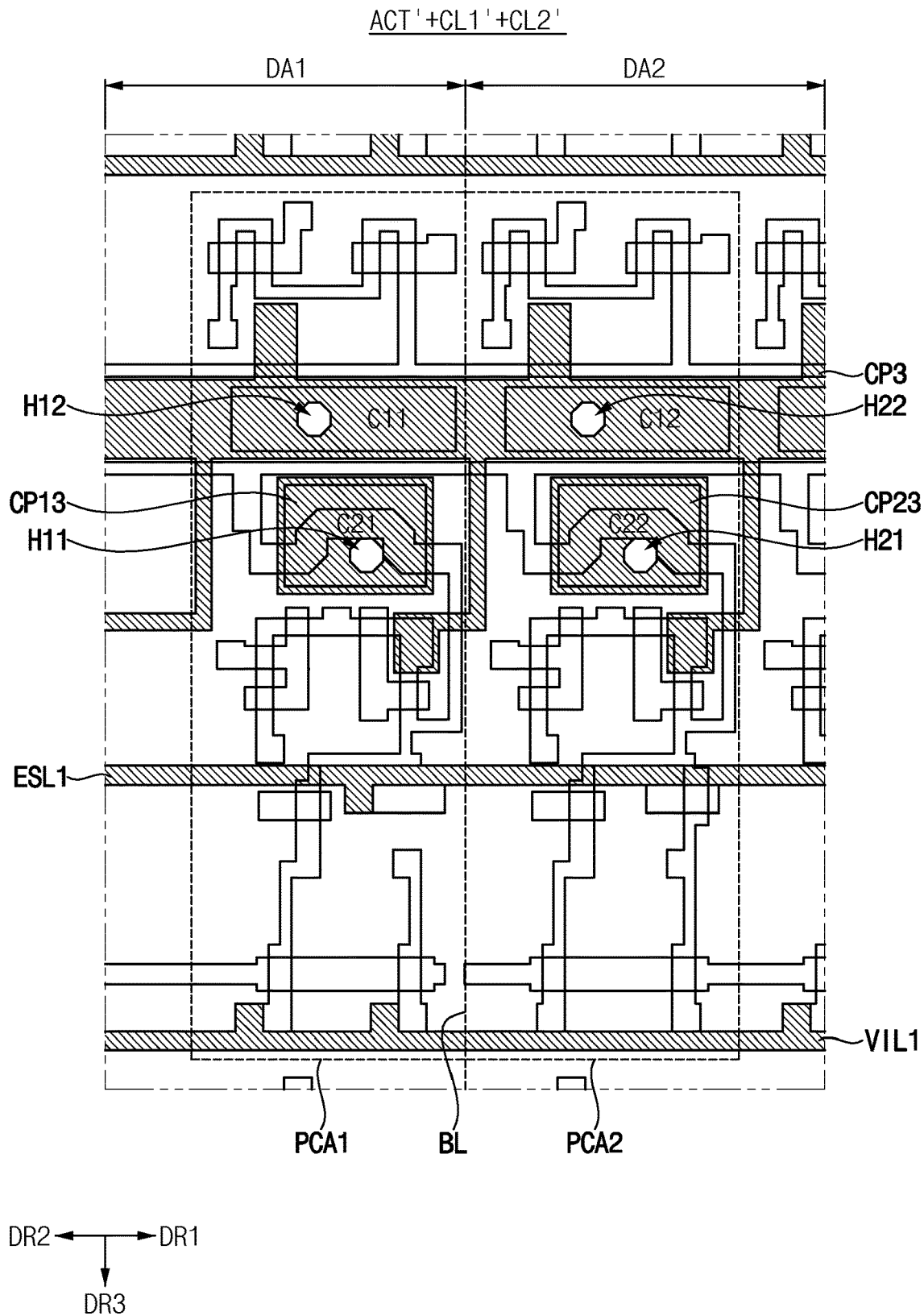
FIG. 27 is a layout view illustrating another embodiment of a sub-pixel disposed in the first display area and a sub-pixel disposed in the second display area of FIG. 4.

Referring further to FIG. 27, the display panel 100 of the display device according to embodiments may further include a second conductive layer CL2' disposed on the first conductive layer CL1'. Specifically, the second insulating layer IL2 may be disposed to cover the first conductive layer CL1', and the second conductive layer CL2' may be disposed on the second insulating layer IL2.

In an embodiment, the second conductive layer CL2' may include a first-third capacitor electrode CP13, a second-third capacitor electrode CP23, a third capacitor electrode CP3, a first light emitting control line ESL1, and a first initialization line VIL1.

In an embodiment, the first-third capacitor electrode CP13, the second-third capacitor electrode CP23, the third capacitor electrode CP3, and the first initialization line VIL1 may be substantially the same as the first-third capacitor electrode CP13, the second-third capacitor electrode CP23, the third capacitor electrode CP3, and the first initialization line VIL1 of FIGS. 12 and 13, respectively.

In an embodiment, the first light emitting control line ESL1 may extend in the first direction DR1. That is, the first light emitting control line ESL1 may be continuously extended in the first direction DR1 without being divided into two parts. The second light emitting control signal EM2 may be applied to the first light emitting control line ESL1.

Figure 28:
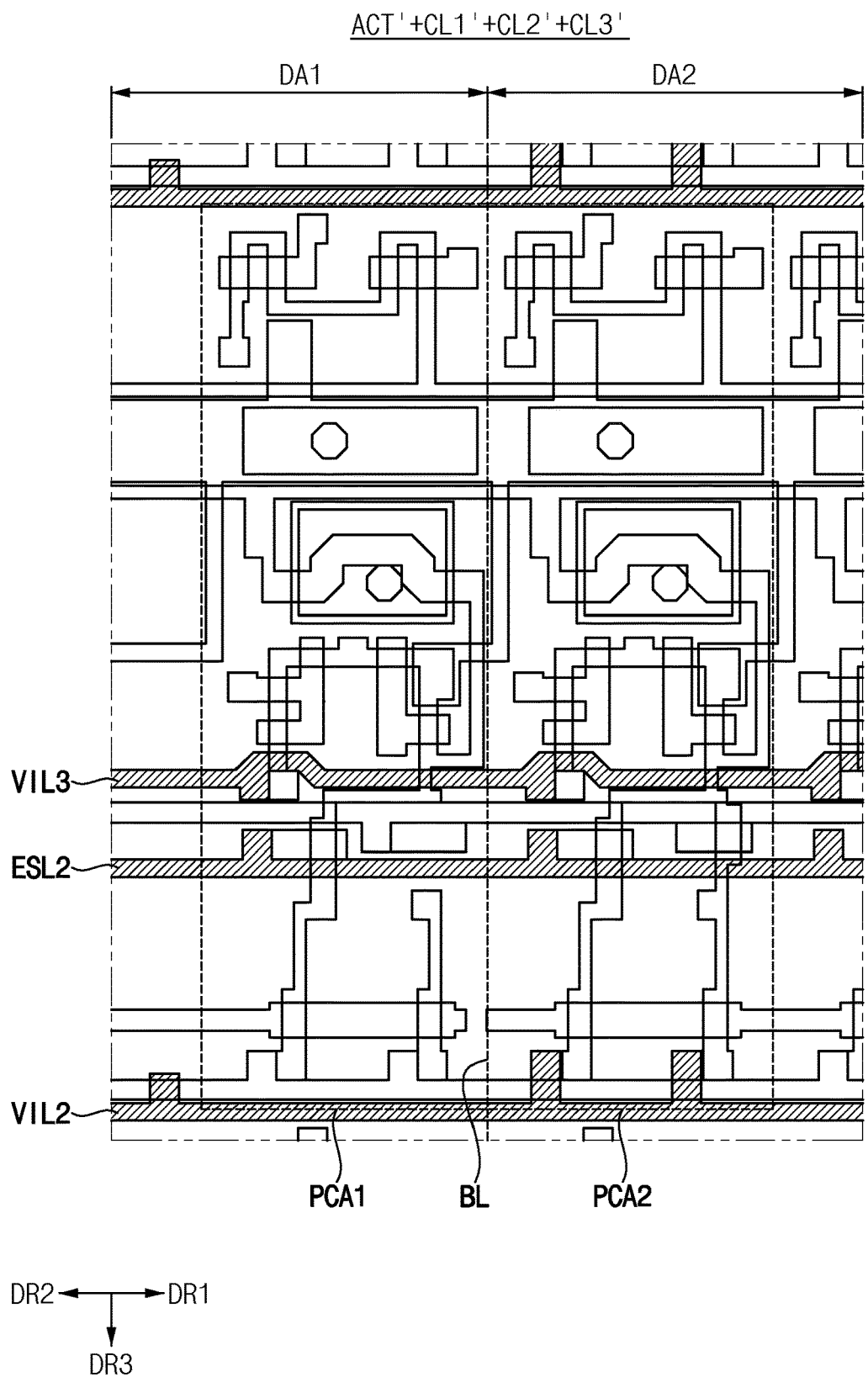
FIG. 28 is a layout view illustrating another embodiment of a sub-pixel disposed in the first display area and a sub-pixel disposed in the second display area of FIG. 4.

Referring further to FIG. 28, the display panel 100 of the display device according to embodiments may further include a third conductive layer CL3' disposed on the second conductive layer CL2'. Specifically, the third insulating layer IL3 covering the second conductive layer CL2' may be disposed, and the third conductive layer CL3' may be disposed on the third insulating layer IL3.

In an embodiment, the third conductive layer CL3' may include a second light emitting control line ESL2, a second initialization line VIL2, and a third initialization line VIL3.

In an embodiment, the second light emitting control line ESL2, the second initialization line VIL2, and the third initialization line VIL3 may be substantially the same as the second light emitting control line ESL2, the second initialization line VIL2, and the third initialization line VIL3 of FIGS. 14 and 15, respectively.

Figure 29:
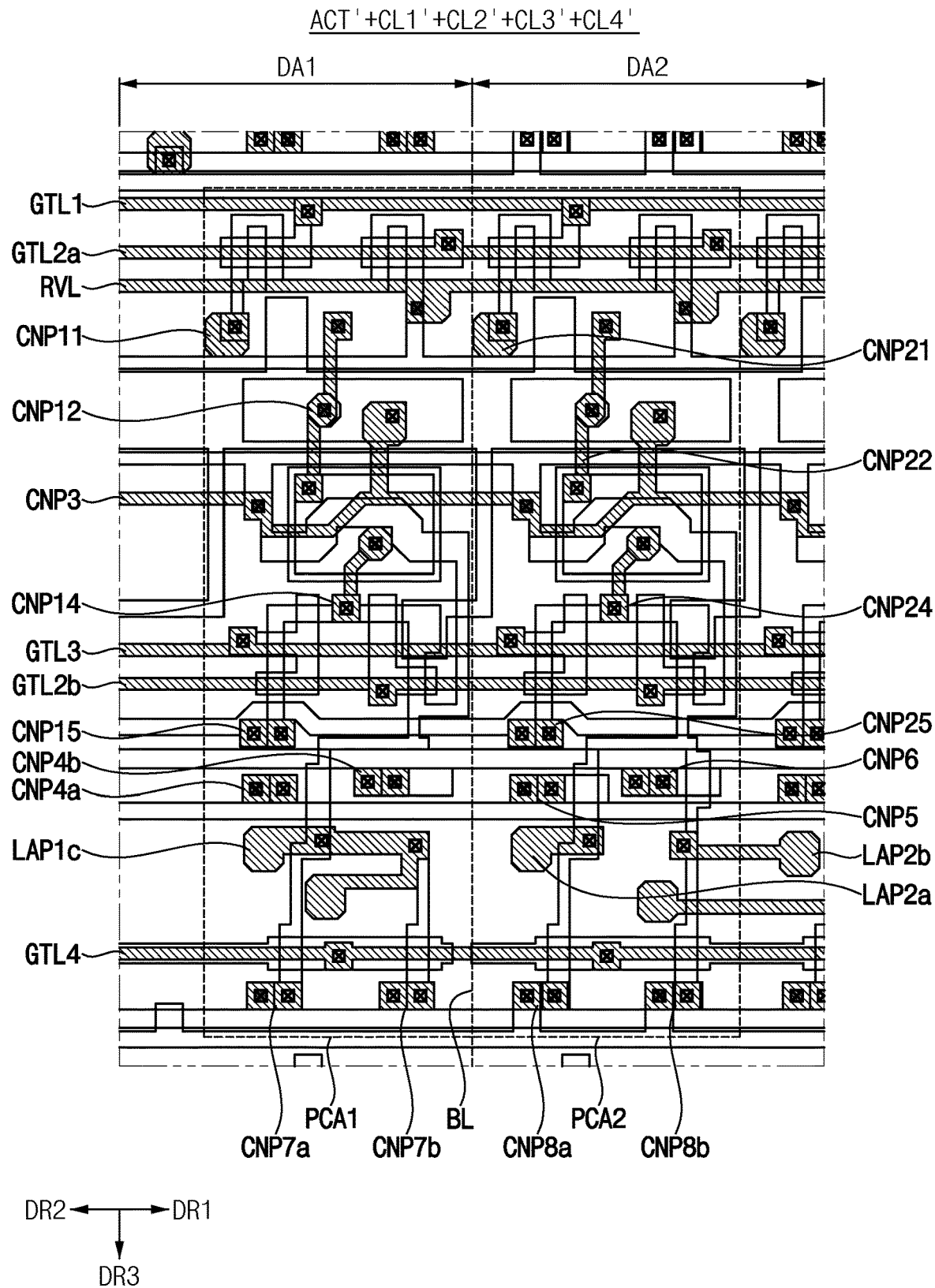
FIG. 29 is a layout view illustrating another embodiment of a sub-pixel disposed in the first display area and a sub-pixel disposed in the second display area of FIG. 4.

Referring further to FIG. 29, the display panel 100 of the display device according to embodiments may further include a fourth conductive layer CL4' disposed on the third conductive layer CL3'. Specifically, the fourth insulating layer IL4 may be disposed to cover the third conductive layer CL3', and the fourth conductive layer CL4' may be disposed on the fourth insulating layer IL4.

In an embodiment, the fourth conductive layer CL4' may include first-first, first-second, first-fourth, and first-fifth connection patterns CNP11, CNP12, CNP14, and CNP15, respectively, second-first, second-second, second-fourth, and second-fifth connection patterns CNP21, CNP22, CNP24, and CNP25, respectively, a third connection pattern CNP3, fourth-first and fourth-second connection patterns CNP4a and CNP4b, respectively, fifth, and sixth connection patterns CNP5, and CNP6, respectively, seventh-first and seventh-second connection patterns CNP7a and CNP7b, respectively, eighth-first and eighth-second connection patterns CNP8a and CNP8b, respectively, a first lower anode connection pattern LAP1c, second-first and second-second lower anode connection patterns LAP2a and LAP2b, respectively, a reference voltage line RVL, a first gate transfer line GTL1, second-first and second-second gate transfer lines GTL2a and GTL2b, respectively, a third gate transfer line GTL3, and a fourth gate transfer line GTL4.

In an embodiment, the first-first, first-second, first-fourth, and first-fifth connection patterns CNP11, CNP12, CNP14, and CNP15, respectively, the second-first, second-second, second-fourth, and second-fifth connection patterns CNP21, CNP22, CNP24, and CNP25, respectively, the fifth, and sixth connection patterns CNP5, and CNP6, respectively, the seventh-first and seventh-second connection patterns CNP7a and CNP7b, respectively, the eighth-first and eighth-second connection patterns CNP8a and CNP8b, respectively, the second-first and second-second lower anode connection patterns LAP2a and LAP2b, respectively, the reference voltage line RVL, the first gate transfer line GTL1, the second-first and second-second gate transfer lines GTL2a and GTL2b, respectively, the third gate transfer line GTL3, and the fourth gate transfer line GTL4 may be substantially the same as the first-first, first-second, first-fourth, and first-fifth connection patterns CNP11, CNP12, CNP14, and CNP15, respectively, the second-first, second-second, second-fourth, and second-fifth connection patterns CNP21, CNP22, CNP24, and CNP25, respectively, the fifth, and sixth connection patterns CNP5, and CNP6, respectively, the seventh-first and seventh-second connection patterns CNP7a and CNP7b, respectively, the eighth-first and eighth-second connection patterns CNP8a and CNP8b, respectively, the second-first and second-second lower anode connection patterns LAP2a and LAP2b, respectively, the reference voltage line RVL, the first gate transfer line GTL1, the second-first and second-second gate transfer lines GTL2a and GTL2b, respectively, the third gate transfer line GTL3, and the fourth gate transfer line GTL4 of FIGS. 16 and 17, respectively.

In an embodiment, the fourth-first connection pattern CNP4a may be disposed in the first pixel circuit area PCA1. The fourth-first connection pattern CNP4a may connect the first-fifth gate pattern GP15 and the second light emitting control line ESL2 through contact holes.

Accordingly, the first light emitting control signal EM1 applied to the second light emitting control line ESL2 may be transferred to the first-fifth gate pattern GP15 through the fourth-first connection pattern CNP4a.

In an embodiment, the fourth-second connection pattern CNP4b may be disposed in the first pixel circuit area PCA1. The fourth-second connection pattern CNP4b may connect the first-sixth gate pattern GP16 and the first light emitting control line ESL1 through contact holes. Accordingly, the second light emitting control signal EM2 applied to the first light emitting control line ESL1 may be transferred to the first-sixth gate pattern GP16 through the fourth-second connection pattern CNP4b.

That is, in an embodiment, as the fourth-first connection pattern CNP4a and the fourth-second connection pattern CNP4b are physically separated from each other, the first light emitting control line ESL1 and the second light emitting control line ESL2 might not be electrically connected to each other.

In an embodiment, the first lower anode connection pattern LAP1c may be disposed in the first pixel circuit area PCA1. In an embodiment, the first lower anode connection pattern LAP1c may connect the first active pattern ACT1 and the third active pattern AP3 through contact holes. Accordingly, the first lower anode connection pattern LAP1c may connect the first active pattern ACT1, the third active pattern AP3, a first-first pixel electrode (e.g., the first-first pixel electrode AE1a of FIG. 31), and a first-second pixel electrode (e.g., the first-second pixel electrode AE1b in FIG. 31).

Figure 30:
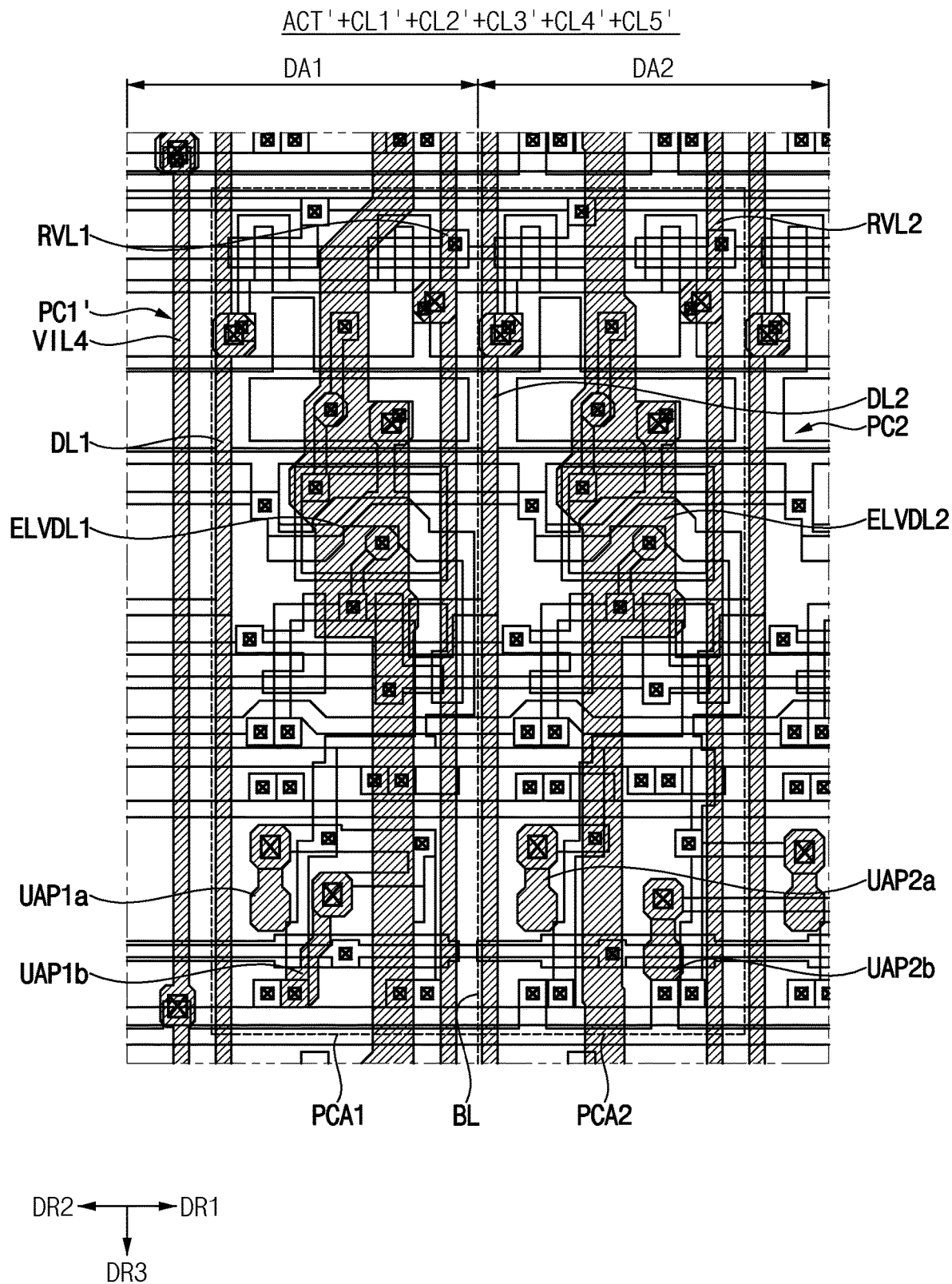
FIG. 30 is a layout view illustrating another embodiment of a sub-pixel disposed in the first display area and a sub-pixel disposed in the second display area of FIG. 4.

Referring further to FIG. 30, the display panel 100 of the display device according to embodiments may further include a fifth conductive layer CL5' disposed on the fourth conductive layer CL4'. Specifically, the fifth insulating layer IL5 may be disposed to cover the fourth conductive layer CL4', and the fifth conductive layer CL5' may be disposed on the fifth insulating layer IL5.

In an embodiment, the fifth conductive layer CL5' may include first and second data lines DL1 and DL2, respectively, first and second reference voltage lines RVL1 and RVL2, respectively, first and second driving voltage lines ELVDL1 and ELVDL2, respectively, a fourth initialization voltage line VIL4, first-first and first-second upper anode connection patterns UAP1a and UAP1b, respectively, and second-first and second-second upper anode connection patterns UAP2a and UAP2b, respectively.

In an embodiment, the first and second data lines DL1 and DL2, respectively, the first and second reference voltage lines RVL1 and RVL2, respectively, the first and second driving voltage lines ELVDL1 and ELVDL2, respectively, the fourth initialization voltage line VIL4, the first-first and first-second upper anode connection patterns UAP1a and UAP1b, respectively, and the second-first and second-second upper anode connection patterns UAP2a and UAP2b, respectively, may be substantially the same as the first and second data lines DL1 and DL2, respectively, the first and second reference voltage lines RVL1 and RVL2, respectively, the first and second driving voltage lines ELVDL1 and ELVDL2, respectively, the fourth initialization voltage line VIL4, the first-first and first-second upper anode connection patterns UAP1a and UAP1b, respectively, and the second-first and second-second upper anode connection patterns UAP2a and UAP2b, respectively, of FIGS. 18 and 19, respectively.

In an embodiment, the first-first and first-second upper anode connection patterns UAP1a and UAP1b, respectively, may be disposed in the first pixel circuit area PCA1. Each of the first-first and first-second upper anode connection patterns UAP1a and UAP1b, respectively, may contact the first lower anode connection pattern LAP1c through a contact hole. Accordingly, the first-first and first-second upper anode connection patterns UAP1a and UAP1b, respectively, may connect the first active pattern ACT1, a first-first pixel electrode (e.g., the first-first pixel electrode AE1a in FIG. 31), and a first-second pixel electrode (e.g., the first-second pixel electrode AE1b in FIG. 31).

Figure 31:
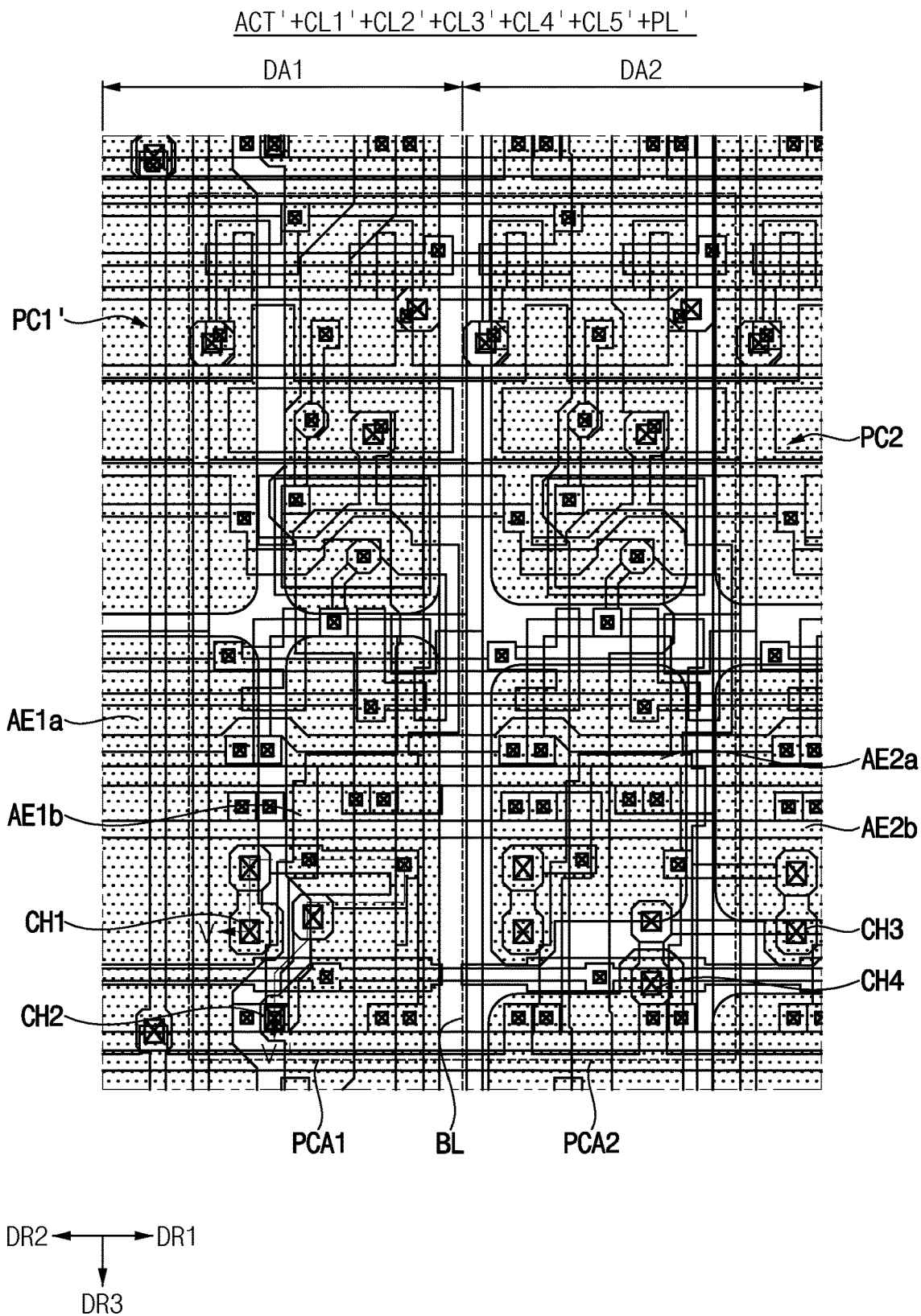
FIG. 31 is a layout view illustrating another embodiment of a sub-pixel disposed in the first display area and a sub-pixel disposed in the second display area of FIG. 4.
Figure 32:
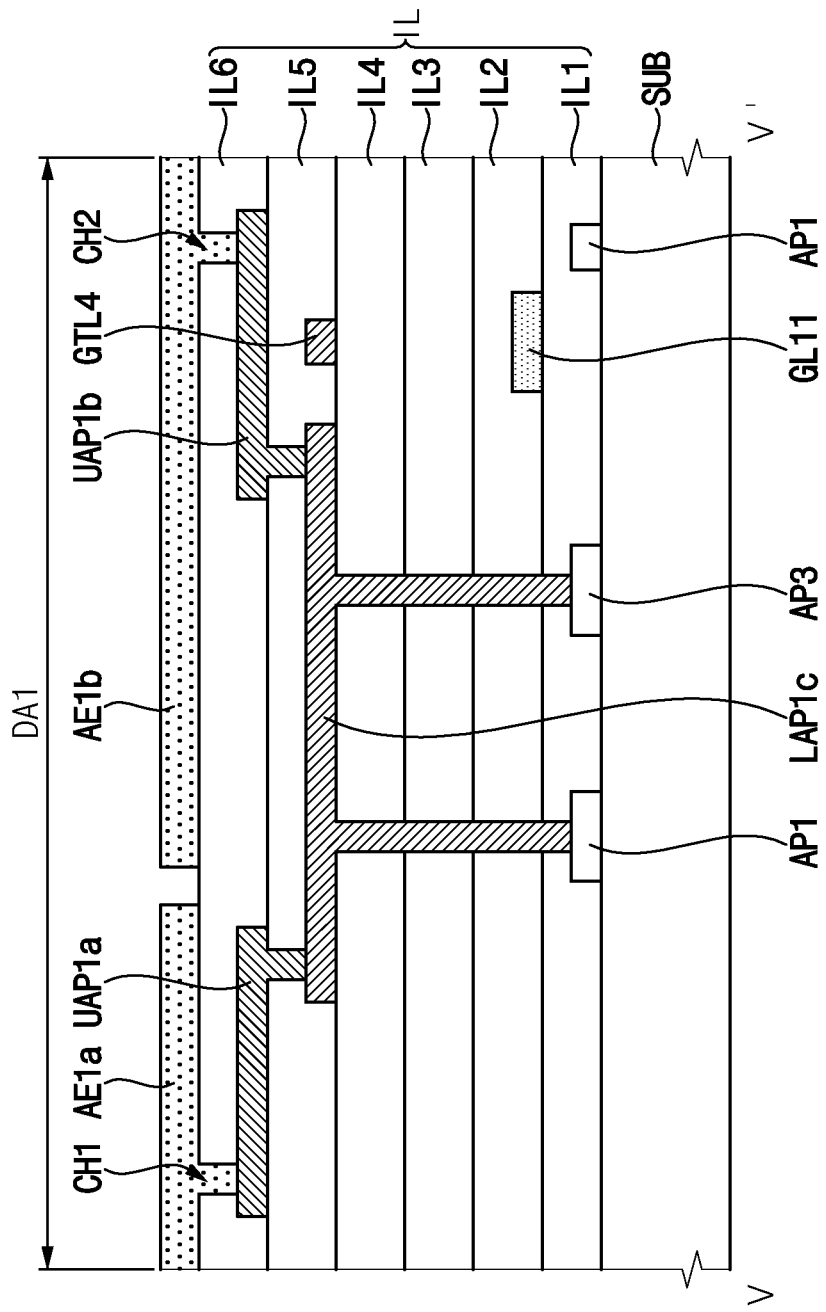
FIG. 32 is a cross-sectional view taken along line V-V' of FIG. 31, according to an embodiment.

Referring further to FIG. 31, the display panel 100 of the display device according to embodiments may further include a pixel electrode layer PL' disposed on the fifth conductive layer CL5'. Specifically, the sixth insulating layer IL6 covering the fifth conductive layer CL5' may be disposed, and the pixel electrode layer PL' may be disposed on the sixth insulating layer IL6.

In an embodiment, the pixel electrode layer PL' may include first-first and first-second pixel electrodes AE1a and AE1b, respectively, and second-first and second-second pixel electrodes AE2a and AE2b, respectively.

In an embodiment, the first-first pixel electrode AE1a may be disposed to at least partially overlap the first pixel circuit area PCA1 and may contact the first-first upper anode connection pattern UAP1a through a contact hole. The first-second pixel electrode AE1b may be disposed to at least partially overlap the first pixel circuit area PCA1 and may contact the first-second upper anode connection pattern UAP1b through a contact hole.

In an embodiment, the second-first and second-second pixel electrodes AE2a and AE2b, respectively, may be substantially the same as the second-first and second-second pixel electrodes AE2a and AE2b, respectively, of FIGS. 20 and 21, respectively.

In the display device according to embodiments, the display device may include the first sub-pixel SPX1 disposed in the first display area DA1 and including the first pixel circuit PC1, the first-first light emitting element LED1a electrically connected to the first pixel circuit PC1, and the first-second light emitting element LED1b electrically connected to the first pixel circuit PC1 and which emits light of the same color as the first-first light emitting element LED1a. The display device may further include the second sub-pixel SPX2 disposed in the second display area DA2 and including the second pixel circuit PC2, the second-first light emitting element LED2a electrically connected to the second pixel circuit PC2, and the second-second light emitting element LED2b electrically connected to the second pixel circuit PC2 and which emits light of the same color as the second-first light emitting element LED2a. Here, the first-first light emitting element LED1a and the first-second light emitting element LED1b may be controlled by the same light emitting control signal, and the second-first light emitting element LED2a and the second-second light emitting element LED2b may be independently controlled by different light emitting control signals. Accordingly, even when an image is displayed at a narrow viewing angle in which the viewing angle in a specific direction is controlled, the luminous efficiency of the display device cannot be reduced.

Figure 33:
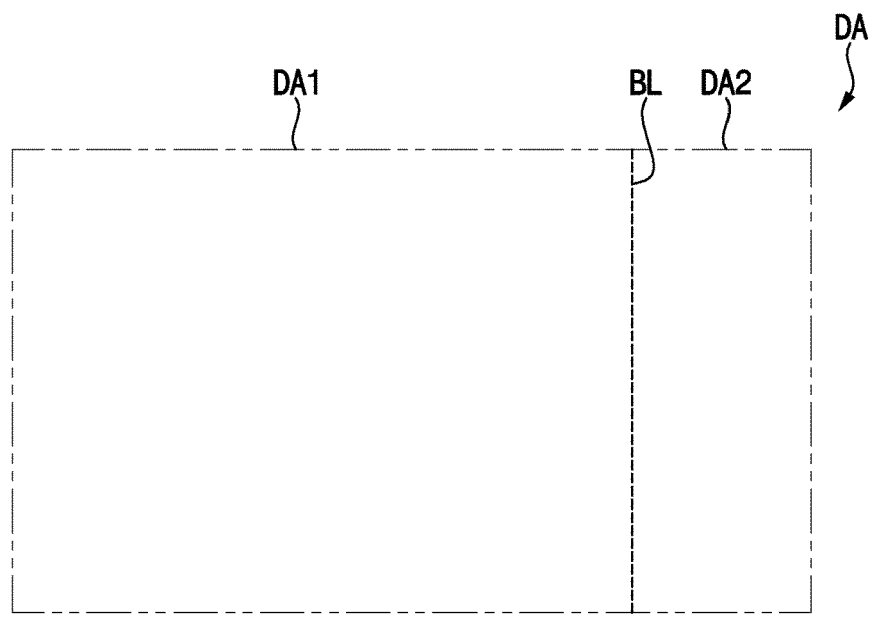
FIG. 33 is a plan view illustrating a first display area and a second display area of a display device according to another embodiment.
Figure 34:
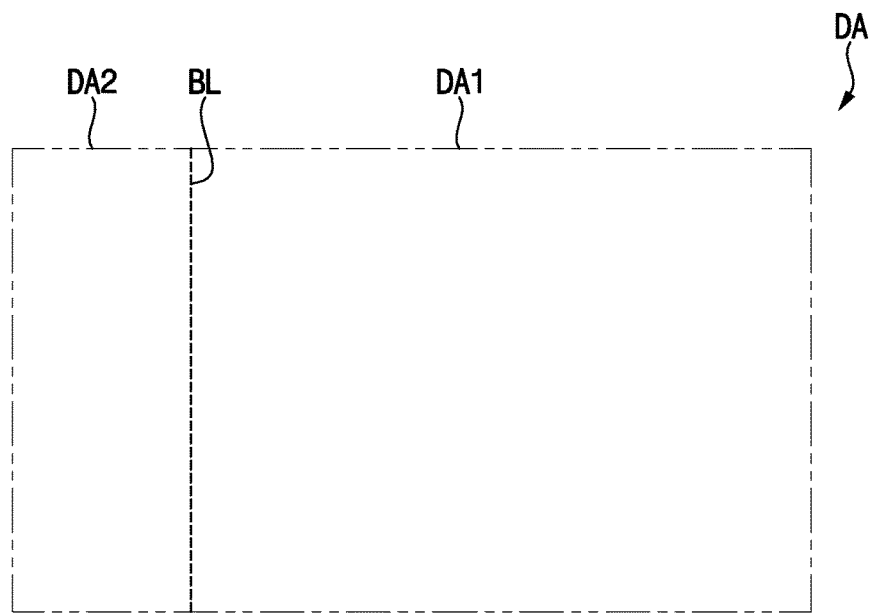
FIG. 34 is a plan view illustrating a first display area and a second display area of a display device according to another embodiment.
Figure 35:
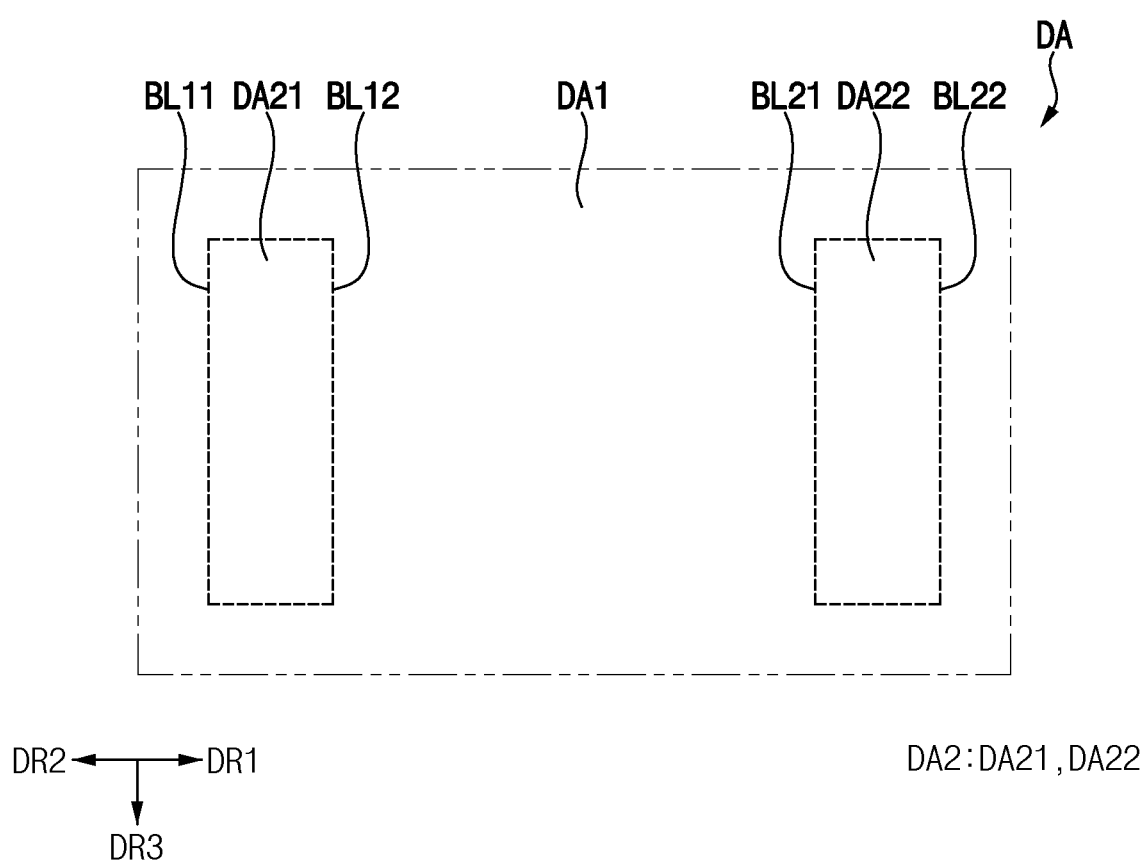
FIG. 35 is a plan view illustrating a first display area and a second display area of a display device according to another embodiment.

FIGS. 33, 34, and 35 are plan views illustrating a first display area and a second display area of a display device according to another embodiment.

In an embodiment and referring to FIGS. 33, 34, and 35, the positions of the first display area DA1 and the second display area DA2 in the display area DA may be changed in various ways.

In an embodiment, as shown in FIG. 33, the first display area DA1 may be positioned to the left side of the boundary line BL where the first display area DA1 and the second display area DA2 are in contact and the second display area DA2 may be positioned to the right side of the boundary line BL.

In another embodiment, as shown in FIG. 34, the first display area DA1 may be positioned on the right side of the boundary line BL, and the second display area DA2 may be positioned on the left side of the boundary line BL.

In another embodiment, as shown in FIG. 35, the second display area DA2 may include a first area DA21 and a second area DA22. In this case, the first area DA21 may be positioned in the first end of the display area DA, and the second area DA22 may be positioned in a second end of the display area DA facing the first end.

In an embodiment, the structure of the sub-pixels disposed around each of a first-first boundary line BL11 and a first-second boundary line BL12 where the first area DA21 and the first display area DA1 are in contact may be substantially the same or similar to the structure of the sub-pixels of FIG. 21 or FIG. 31.

Likewise, in an embodiment, the structure of the sub-pixels disposed around each of a second-first boundary line BL21 and a second-second boundary line BL22 where the second area DA22 and the first display area DA1 are in contact may be substantially the same or similar to the structure of the sub-pixels of FIG. 21 or FIG. 31.

However, in embodiments, the positions of the first display area DA1 and the second display area DA2 in the display area DA are not limited to those shown in FIGS. 33, 34, and 35.

The invention can be applied to various display devices. For example, the invention is applicable to various display devices such as display devices for vehicles, ships and aircraft, portable communication devices, display devices for exhibition and/or information transmission, medical display devices, and the like.

The foregoing is illustrative of embodiments and is not to be construed as limiting thereof. Although a few embodiments have been described, those skilled in the art will readily appreciate that many modifications are possible in the invention without materially departing from the novel teachings and advantages of the invention. Accordingly, all such modifications are intended to be included within the scope of the invention. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims. Moreover, the embodiments or parts of the embodiments may be combined in whole or in part without departing from the scope of the invention.

What is claimed is:

1. A display device comprising:
 a substrate including a display area including a first display area and a second display area disposed adjacent to the first display area, and a non-display area positioned around the display area;
 a first sub-pixel disposed in the first display area and including:
 a first pixel circuit;
 a first-first light emitting element electrically connected to the first pixel circuit and controlled by a first light emitting control signal; and
 a first-second light emitting element electrically connected to the first pixel circuit and controlled by the first light emitting control signal, wherein the first-second light emitting element emits light of a same color as the first-first light emitting element;
 a second sub-pixel disposed in the second display area and including:
 a second pixel circuit;
 a second-first light emitting element electrically connected to the second pixel circuit and controlled by the first light emitting control signal; and
 a second-second light emitting element electrically connected to the second pixel circuit and controlled by a second light emitting control signal, wherein the second-second light emitting element emits light of a same color as the second-first light emitting element; and
 a plurality of light control patterns disposed on the first sub-pixel and the second sub-pixel, wherein the plurality of light control patterns block a part of light emitted from the first sub-pixel and the second sub-pixel.

2. The display device of claim 1, further comprising:
 a first light emitting control line disposed in the first display area and the second display area, wherein the first light emitting control signal is applied to the first light emitting control line; and
 a second light emitting control line disposed on the substate and including a first portion overlapping the first display area and a second portion separated from the first portion and overlapping the second display area, wherein the second light emitting control signal is applied to the second light emitting control line.

3. The display device of claim 2, wherein the first portion and the second portion are physically separated around a boundary line where the first display area and the second display area are in contact.

4. The display device of claim 2, further comprising:
a conductive layer disposed on the first light emitting control line and the second light emitting control line, wherein the conductive layer overlaps a separation space defined between the first portion and the second portion in a plan view.

5. The display device of claim 4, wherein the conductive layer includes a driving voltage line to which a driving voltage is applied, wherein the driving voltage line overlaps the separation space in the plan view.

6. The display device of claim 4, wherein one of a pixel electrode of the first-first light emitting element and a pixel electrode of the first-second light emitting element overlaps the separation space in the plan view.

7. The display device of claim 2, further comprising:
a connection pattern disposed on the first light emitting control line and connecting the first light emitting control line and the first portion through a contact hole.

8. The display device of claim 2, wherein the first light emitting control line is disposed in a different layer than the second light emitting control line.

9. The display device of claim 8, wherein the first light emitting control line is disposed on the second light emitting control line.

10. The display device of claim 8, wherein the second light emitting control line is disposed on the first light emitting control line.

11. The display device of claim 1, wherein a first-first pixel electrode of the first-first light emitting element is separated from a first-second pixel electrode of the first-second light emitting element, and
wherein a second-first pixel electrode of the second-first light emitting element is separated from a second-second pixel electrode of the second-second light emitting element.

12. The display device of claim 1, wherein the second display area includes a first area and a second area, and
wherein the first area is positioned in a first end of the second display area and the second area is positioned in a second end of the second display area facing the first end.

13. The display device of claim 1, wherein the plurality of light control patterns are not disposed in the first display area and are disposed only in the second display area.

14. The display device of claim 13, wherein the plurality of light control patterns do not overlap a light emitting layer of the second-first light emitting element in a plan view, and overlap a light emitting layer of the second-second light emitting element in the plan view.

15. The display device of claim 13, wherein the plurality of light control patterns overlap a light emitting layer of the second-first light emitting element and a light emitting layer of the second-second light emitting element in a plan view.

16. The display device of claim 1, wherein the plurality of light control patterns are disposed in the first display area and the second display area.

17. A display device comprising:
a substrate including a display area including a first display area and a second display area disposed adjacent to the first display area, and a non-display area positioned around the display area;
a first light emitting control line disposed on the substrate, wherein a first light emitting control signal is applied to the first light emitting control line;
a second light emitting control line disposed in a different layer from the first light emitting control line and continuously extending in a first direction, wherein a second light emitting control signal is applied to the second light emitting control line;
a first sub-pixel disposed in the first display area and including:
a first pixel circuit;
a first-first light emitting element electrically connected to the first pixel circuit and controlled by a first light emitting control signal; and
a first-second light emitting element electrically connected to the first pixel circuit and controlled by the first light emitting control signal, wherein the first-second light emitting element emits light of a same color as the first-first light emitting element;
a second sub-pixel disposed in the second display area and including:
a second pixel circuit;
a second-first light emitting element electrically connected to the second pixel circuit and controlled by the first light emitting control signal; and
a second-second light emitting element electrically connected to the second pixel circuit and controlled by a second light emitting control signal, wherein the second-second light emitting element emits light of a same color as the second-first light emitting element; and
a plurality of light control patterns disposed on the first sub-pixel and the second sub-pixel, wherein the plurality of light control patterns block a part of light emitted from the first sub-pixel and the second sub-pixel.

18. The display device of claim 17, further comprising:
a first active pattern disposed in the first display area and the second display area;
a second active pattern disposed in a same layer as the first active pattern and spaced apart from the first active pattern, wherein the second active pattern overlaps the first display area;
a first-first gate pattern disposed in the first display area and disposed on the first active pattern and the second active pattern; and
a second-first gate pattern disposed in a same layer as the first-first gate pattern overlapping the second display area,
wherein the first-first gate pattern does not overlap the first active pattern and the second active pattern in a plan view and wherein the second-first gate pattern overlaps the first active pattern in the plan view.

19. The display device of claim 18, wherein the second pixel circuit includes:
a transistor including a part of the first active pattern and a part of the second-first gate pattern, wherein the part of the second-first gate pattern overlaps the part of the first active pattern, and
wherein the second light emitting control signal is applied to the first-first gate pattern and the second light emitting control signal is applied to the part of the second-first gate pattern.

20. The display device of claim 18, further comprising:
an anode connection pattern disposed on the first-first gate pattern and the second-first gate pattern and connecting the first active pattern and the second active pattern through contact holes,
wherein a first-first pixel electrode of the first-first light emitting element and a first-second pixel electrode of the first-second light emitting element are connected through the anode connection pattern.

21. The display device of claim 17, wherein the first light emitting control line and the second light emitting control line are spaced apart from each other in a second direction crossing the first direction in a plan view.

22. The display device of claim 17, wherein the first light emitting control line is not connected to the second light emitting control line.

23. The display device of claim 17, wherein the first light emitting control line is disposed on the second light emitting control line.

24. The display device of claim 17, wherein a first-first pixel electrode of the first-first light emitting element is separated from a first-second pixel electrode of the first-second light emitting element, and
   wherein a second-first pixel electrode of the second-first light emitting element is separated from a second-second pixel electrode of the second-second light emitting element.

25. The display device of claim 17, wherein the plurality of light control patterns are not disposed in the first display area and are disposed only in the second display area.

26. The display device of claim 25, wherein the plurality of light control patterns do not overlap a light emitting layer of the second-first light emitting element in a plan view and overlap a light emitting layer of the second-second light emitting element in the plan view.

27. The display device of claim 25, wherein the plurality of light control patterns overlap a light emitting layer of the second-first light emitting element and a light emitting layer of the second-second light emitting element in a plan view.

28. The display device of claim 17, wherein the plurality of light control patterns are disposed in the first display area and the second display area.

\* \* \* \* \*